(12) United States Patent
Kim et al.

(10) Patent No.: US 9,960,361 B2
(45) Date of Patent: May 1, 2018

(54) ORGANIC LIGHT-EMITTING DEVICE

(71) Applicant: SAMSUNG DISPLAY CO., LTD., Yongin-si, Gyeonggi-do (KR)

(72) Inventors: Seulong Kim, Yongin-si (KR); Younsun Kim, Yongin-si (KR); Dongwoo Shin, Yongin-si (KR); Jungsub Lee, Yongin-si (KR); Naoyuki Ito, Yongin-si (KR); Jino Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/242,040

(22) Filed: Aug. 19, 2016

(65) Prior Publication Data
US 2017/0054081 A1 Feb. 23, 2017

(30) Foreign Application Priority Data

Aug. 21, 2015 (KR) .................. 10-2015-0118277
Aug. 17, 2016 (KR) .................. 10-2016-0104281

(51) Int. Cl.
*H01L 51/00* (2006.01)
*H01L 51/50* (2006.01)
(Continued)

(52) U.S. Cl.
CPC ........ *H01L 51/0061* (2013.01); *C09K 11/025* (2013.01); *C09K 11/06* (2013.01);
(Continued)

(58) Field of Classification Search
CPC . C09K 11/025; C09K 11/06; C09K 2211/185; H01L 51/0052; H01L 51/0054;
(Continued)

(56) References Cited

U.S. PATENT DOCUMENTS

2007/0278938 A1   12/2007   Yabunouchi et al.
2010/0001636 A1   1/2010    Yabunouchi
(Continued)

FOREIGN PATENT DOCUMENTS

KR   10-2008-0112325 A   12/2008
KR   10-2011-0011647 A   2/2011
(Continued)

OTHER PUBLICATIONS

EPO Extended Search Report dated Jan. 25, 2017, for corresponding European Patent Application No. 16184809.8 (8 pages).

*Primary Examiner* — Tom Thomas
*Assistant Examiner* — Benjamin Tzu-Hung Liu
(74) *Attorney, Agent, or Firm* — Lewis Roca Rothgerber Christie LLP

(57) ABSTRACT

An organic light-emitting device having low-driving voltage, improved efficiency, and long lifespan includes: a first electrode; a second electrode facing the first electrode; a first layer between the first electrode and the second electrode, the first layer including a first compound; a second layer between the first layer and the second electrode, the second layer including a second compound; and a third layer between the second layer and the second electrode, the third layer including a third compound; wherein the first compound does not include a nitrogen-containing heterocyclic
(Continued)

10

| 190 |
|---|
| 170 |
| 150 |
| 130 |
| 110 | group comprising *=N—*' as a ring forming moiety, and wherein the first compound, the second compound, and the third compound each independently include at least one group selected from groups represented by Formulae A to C:

Formula A

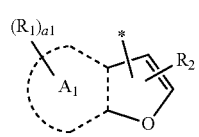

Formula B

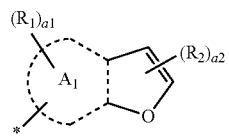

Formula C

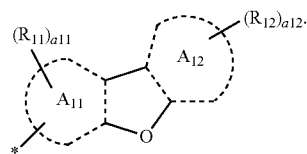

20 Claims, 1 Drawing Sheet

(51) Int. Cl.
H01L 51/52 (2006.01)
C09K 11/02 (2006.01)
C09K 11/06 (2006.01)

(52) U.S. Cl.
CPC ........ *H01L 51/006* (2013.01); *H01L 51/0067* (2013.01); *H01L 51/0071* (2013.01); *H01L 51/0072* (2013.01); *H01L 51/0073* (2013.01); *H01L 51/0085* (2013.01); *H01L 51/5056* (2013.01); *H01L 51/5072* (2013.01); *H01L 51/5088* (2013.01); *H01L 51/5092* (2013.01); *H01L 51/52* (2013.01); *H01L 51/5271* (2013.01); *C09K 2211/185* (2013.01); *H01L 51/0052* (2013.01); *H01L 51/0054* (2013.01); *H01L 51/0058* (2013.01); *H01L 51/5012* (2013.01)

(58) Field of Classification Search
CPC ............... H01L 51/0058; H01L 51/006; H01L 51/0061; H01L 51/0067; H01L 51/0071; H01L 51/0072; H01L 51/0073; H01L 51/0085; H01L 51/5012; H01L 51/5056
See application file for complete search history.

(56) References Cited

U.S. PATENT DOCUMENTS

| | | |
|---|---|---|
| 2012/0112169 A1 | 5/2012 | Mizuki et al. |
| 2012/0112174 A1 | 5/2012 | Lee et al. |
| 2012/0138915 A1 | 6/2012 | Nishimura et al. |
| 2012/0223295 A1 | 9/2012 | Inoue et al. |
| 2014/0034943 A1 | 2/2014 | Mizuki et al. |
| 2014/0312338 A1 | 10/2014 | Mizutani et al. |
| 2014/0326985 A1 | 11/2014 | Mizuki et al. |
| 2015/0243907 A1* | 8/2015 | Wolleb ................. C07D 405/04 252/500 |

FOREIGN PATENT DOCUMENTS

| | | |
|---|---|---|
| KR | 10-2011-0071127 A | 6/2011 |
| KR | 10-2012-0047706 A | 5/2012 |
| KR | 10-2012-0057611 A | 6/2012 |
| KR | 10-2014-0000259 A | 1/2014 |
| KR | 10-2014-0031213 A | 3/2014 |
| KR | 10-2014-0095072 A | 7/2014 |
| KR | 10-2014-0095491 A | 8/2014 |
| KR | 10-2014-0145456 A | 12/2014 |
| KR | 10-2015-0007476 A | 1/2015 |
| WO | WO 2014/044722 A1 | 3/2014 |
| WO | WO 2015/114102 * | 8/2015 |
| WO | WO 2015/114102 A1 | 8/2015 |

* cited by examiner

10

| 190 |
|-----|
| 170 |
| 150 |
| 130 |
| 110 |

ORGANIC LIGHT-EMITTING DEVICE

CROSS-REFERENCE TO RELATED APPLICATIONS

This application claims priority to and the benefit of Korean Patent Application No. 10-2015-0118277, filed on Aug. 21, 2015 and Korean Patent Application No. 10-2016-0104281, filed on Aug. 17, 2016, in the Korean Intellectual Property Office, the entire disclosure of which is incorporated herein by reference.

BACKGROUND

1. Field

One or more aspects of example embodiments of the present disclosure relate to an organic light-emitting device.

2. Description of the Related Art

Organic light-emitting devices (OLEDs) are self-emission devices that have wide viewing angles, high contrast ratios, and short response times. In addition, the OLEDs exhibit excellent luminance, driving voltage, and response speed characteristics.

An OLED may include a first electrode disposed (e.g., positioned) on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. The holes and the electrons may then recombine in the emission layer to produce excitons. These excitons change from an excited state to a ground state to thereby generate light.

SUMMARY

One or more aspects of example embodiments of the present disclosure are directed toward an organic light-emitting device having low driving voltage, high efficiency, and long lifespan.

Additional aspects will be set forth in part in the description which follows and, in part, will be apparent from the description, or may be learned by practice of the presented embodiments.

According to one or more example embodiments, an organic light-emitting device includes a first electrode; a second electrode facing the first electrode; a first layer between the first electrode and the second electrode and including a first compound; a second layer between the first layer and the second electrode and including a second compound; and a third layer between the second layer and the second electrode and including a third compound, wherein the first compound, the second compound, and the third compound may each independently include at least one group selected from groups represented by Formulae A to C, and the first compound does not include a nitrogen-containing heterocyclic group including *=N—*' as a ring forming moiety:

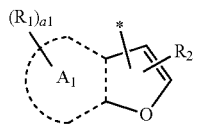

Formula A

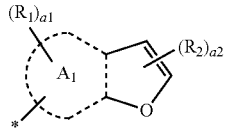

Formula B

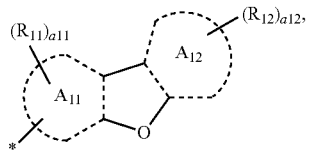

Formula C wherein, in Formulae A to C, ring $A_1$, ring $A_{11}$, and ring $A_{12}$ may be each independently selected from a $C_5$-$C_{30}$ carbocyclic group and a $C_2$-$C_{30}$ heterocyclic group, and $R_1$, $R_2$, $R_{11}$, and $R_{12}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and —N($Q_1$)($Q_2$), —Si($Q_3$)($Q_4$)($Q_5$), and —B($Q_6$)($Q_7$), wherein $Q_1$ to $Q_7$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, a1, a11, and a12 may be each independently an integer selected from 0 to 10, a2 may be an integer selected from 0 to 2, and wherein * and *' each indicate a binding site to an adjacent atom.

BRIEF DESCRIPTION OF THE DRAWINGS

These and/or other aspects will become apparent and more readily appreciated from the following description of the example embodiments, taken in conjunction with the accompanying drawing, which is a schematic view of an organic light-emitting device according to an example embodiment.

DETAILED DESCRIPTION

Reference will now be made in more detail to example embodiments, examples of which are illustrated in the accompanying drawing, wherein like reference numerals refer to like elements throughout. In this regard, the present example embodiments may have different forms and should not be construed as being limited to the descriptions set forth herein. Accordingly, the example embodiments are merely described below, by referring to the drawing, to explain aspects of the present description. As used herein, the term "and/or" includes any and all combinations of one or more of the associated listed items. Expressions such as "at least one of," "one of," "at least one selected from," and "one selected from," when preceding a list of elements, modify the entire list of elements and do not modify the individual elements of the list. Further, the use of "may" when describing embodiments of the present invention refers to "one or more embodiments of the present invention."

An organic light-emitting device may include: a first electrode; a second electrode facing the first electrode; a first layer between the first electrode and the second electrode and including a first compound; a second layer between the first layer and the second electrode and including a second compound; and a third layer between the second layer and the second electrode and including a third compound.

The first electrode may be an anode. The second electrode may be a cathode. Descriptions of the first electrode and the second electrode are as provided herein.

The first compound, the second compound, and the third compound may each independently include at least one group selected from groups represented by Formulae A to C, and the first compound may not include a nitrogen-containing heterocyclic group including *=N—*' as a ring forming moiety. As used herein, * and *' may each indicate a binding site to a corresponding adjacent atom.

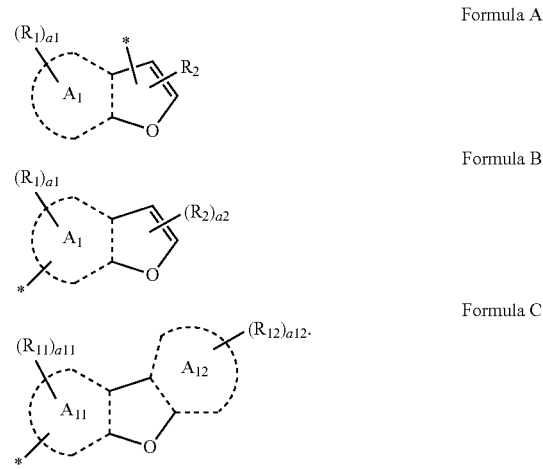

In Formulae A to C, ring $A_1$, ring $A_{11}$, and ring $A_{12}$ may be each independently selected from a $C_5$-$C_{30}$ carbocyclic group and a $C_2$-$C_{30}$ heterocyclic group.

In some embodiments, in Formulae A to C, ring $A_1$, ring $A_{11}$, and ring $A_{12}$ may be each independently selected from a benzene group, a naphthalene group, a fluorene group, a benzofluorene group, a pyridine group, a pyrimidine group, a carbazole group, a benzocarbazole group, and a dibenzothiophene group.

In Formulae A to C, $R_1$, $R_2$, $R_{11}$, and $R_{12}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and —N($Q_1$)($Q_2$), —Si($Q_3$)($Q_4$)($Q_5$), and —B($Q_6$)($Q_7$), wherein $Q_1$ to $Q_7$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, in Formulae A to C, $R_1$, $R_2$, $R_{11}$, and $R_{12}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothienyl group, an isobenzothiazolyl group, a benzoxazolyl group, an isobenzoxazolyl group, an oxadiazolyl group, a triazinyl group, a dibenzofuranyl group, a dibenzothienyl group, an imidazopyridinyl group, and an imidazopyrimidinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothienyl group, an isobenzothiazolyl group, a benzoxazolyl group, an isobenzoxazolyl group, an oxadiazolyl group, a triazinyl group, a dibenzofuranyl group, a dibenzothienyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothienyl group, an isobenzothiazolyl group, a benzoxazolyl group, an isobenzoxazolyl group, an oxadiazolyl group, a triazinyl group, a dibenzofuranyl group, a dibenzothienyl group, an imidazopyridinyl group, an imidazopyrimidinyl group, and —Si($Q_{33}$)($Q_{34}$)($Q_{35}$); and —N($Q_1$)($Q_2$), —Si($Q_3$)($Q_4$)($Q_5$), and —B($Q_6$)($Q_7$), wherein $Q_1$ to $Q_7$ and $Q_{33}$ to $Q_{35}$ may be each independently selected from a $C_1$-$C_{10}$ alkyl group, a $C_1$-$C_{10}$ alkoxy group, a phenyl group, a biphenyl group, a terphenyl group, and a naphthyl group.

In some embodiments, in Formulae A to C, $R_1$, $R_2$, $R_{11}$, and $R_{12}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, a fluorenyl group, a naphthyl group, a pyridinyl group, a pyrimidinyl group, a triazinyl group, a quinolinyl group, an isoquinolinyl group, a quinazolinyl group, and a quinoxalinyl group;

a phenyl group, a biphenyl group, a terphenyl group, a fluorenyl group, a naphthyl group, a pyridinyl group, a pyrimidinyl group, a triazinyl group, a quinolinyl group, an isoquinolinyl group, a quinazolinyl group, and a quinoxalinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, and a $C_6$-$C_{16}$ aryl group; and —N($Q_1$)($Q_2$), —Si($Q_3$)($Q_4$)($Q_5$), and —B($Q_6$)($Q_7$), wherein $Q_1$ to $Q_7$ may be each independently selected from a $C_1$-$C_{10}$ alkyl group, a $C_1$-$C_{10}$ alkoxy group, a phenyl group, a biphenyl group, a terphenyl group, a fluorenyl group, and a naphthyl group, but embodiments of the present disclosure are not limited thereto.

In Formulae A to C, a1, a11, and a12 may be each independently an integer selected from 0 to 10, and a2 may be an integer selected from 0 to 2.

a1 in Formula A indicates the number of $R_1(s)$. When a1 is 2 or more, a plurality of $R_1(s)$ may be identical to or different from each other. a2, a11, and a12 may be each independently understood by referring to the description of a1 and the structures of corresponding Formulae B and C.

In some embodiments, in Formulae A to C, a1, a11, and a12 may be each independently an integer selected from 0 to 8, and a2 may be an integer selected from 0 to 2.

In Formulae A to C, * indicates a binding site to an adjacent atom.

In some embodiments, the first compound, the second compound, and the third compound may each independently include at least one group represented by Formulae A(1), A(2), B(1) to B(4), and C(1) to C(16):

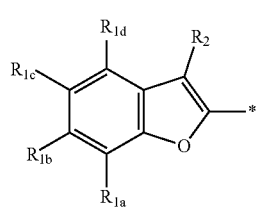

Formula A(1)

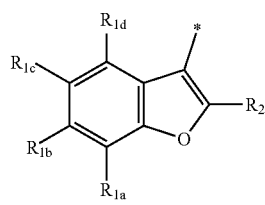

Formula A(2)

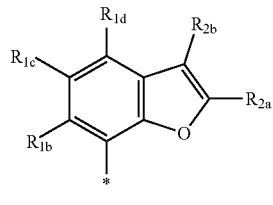

Formula B(1)

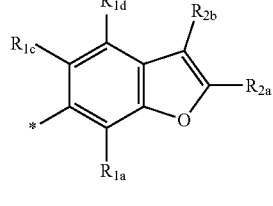

Formula B(2)

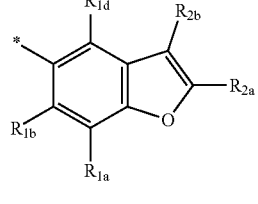

Formula B(3)

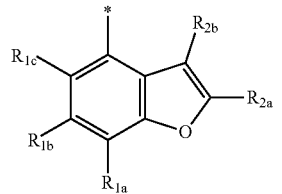

Formula B(4)

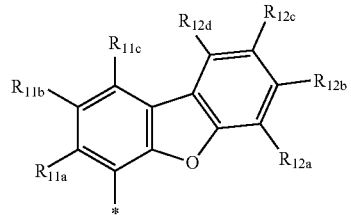

Formula C(1)

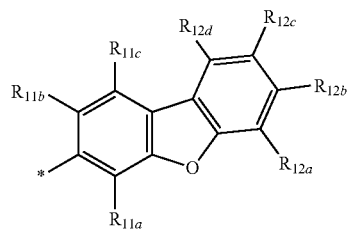

Formula C(2)

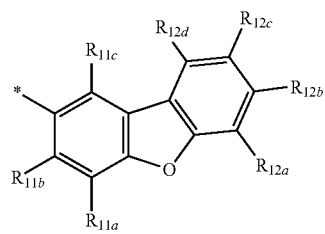

Formula C(3)

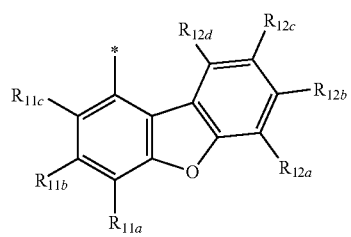

Formula C(4)

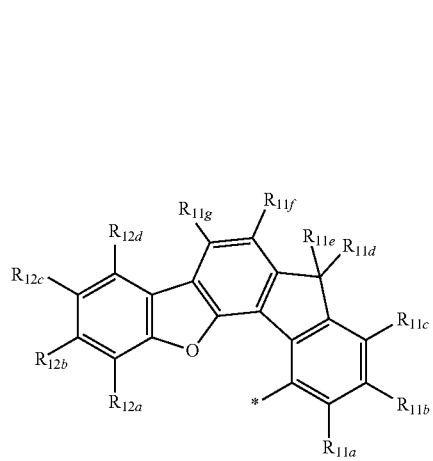

Formula C(5)

Formula C(6)
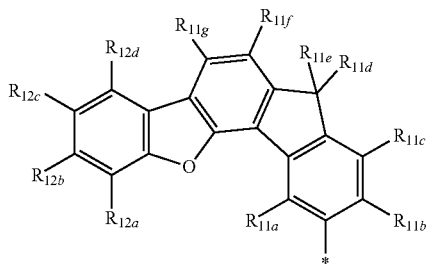
Formula C(7)
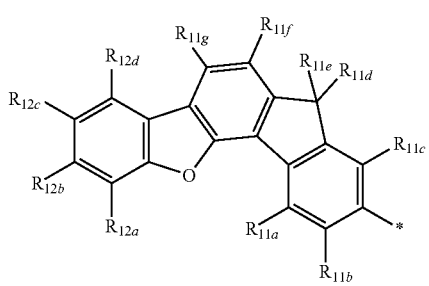
Formula C(8)
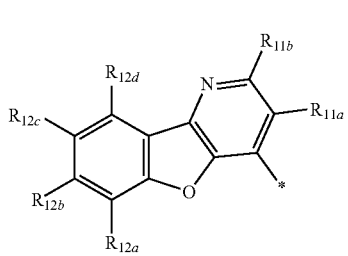
Formula C(9)
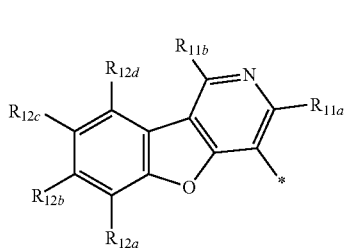
Formula C(10)
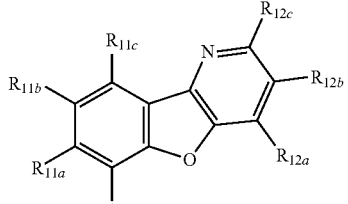
Formula C(11)
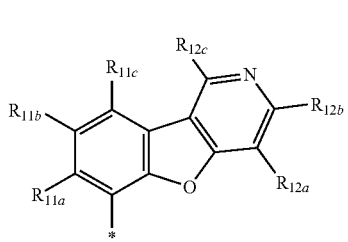
Formula C(12)
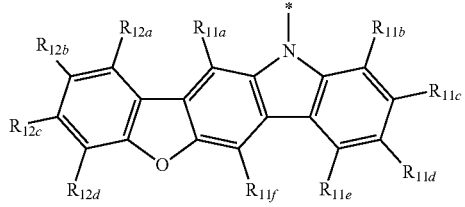
Formula C(13)
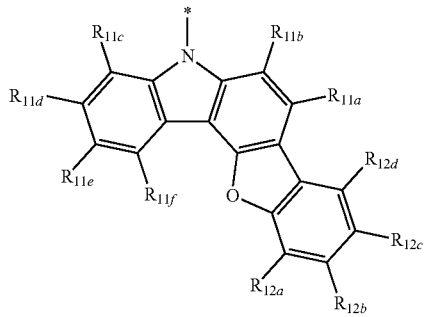
Formula C(14)
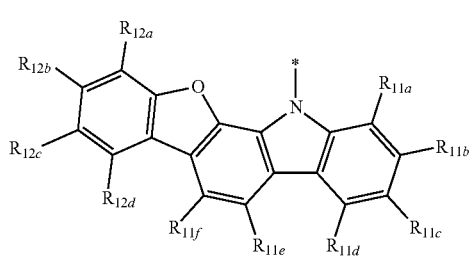
Formula C(15)
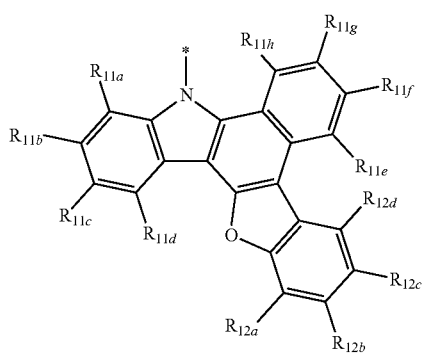
Formula C(16)
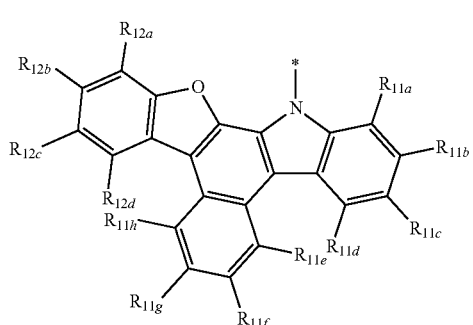
wherein, in Formulae A(1), A(2), B(1) to B(4), and C(1) to C(16), descriptions of $R_{1a}$ to $R_{1d}$ may be each independently the same as the description provided in connection with $R_1$, descriptions of $R_{2a}$ and $R_{2b}$ may be each independently the same as the description provided in connection with $R_2$, descriptions of $R_{11a}$ and $R_{11h}$ may be each independently the same as the description provided in connection with $R_{11}$, descriptions of $R_{12a}$ to $R_{12d}$ may be each independently the same as the description provided in connection with $R_{12}$, and

* indicates a binding site to an adjacent atom.

In some embodiments, in Formulae A(1), A(2), B(1) to B(4), and C(1) to C(16), $R_{1a}$ to $R_{1d}$, $R_{2a}$, $R_{2b}$, $R_{11a}$ to $R_{11h}$, and $R_{12a}$ to $R_{12d}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, and a naphthyl group;

a phenyl group, a biphenyl group, a terphenyl group, and a naphthyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, and a naphthyl group; and —N($Q_1$)($Q_2$), —Si($Q_3$)($Q_4$)($Q_5$), and —B($Q_6$)($Q_7$), wherein $Q_1$ to $Q_7$ may each independently be selected from a $C_1$-$C_{10}$ alkyl group, a $C_1$-$C_{10}$ alkoxy group, a phenyl group, a biphenyl group, a terphenyl group, and a naphthyl group.

According to an embodiment, the first compound may be selected from compounds represented by Formulae 1-1 to 1-3, the second compound may be selected from compounds represented by Formulae 2H-1, 2D-1, and 2D-2, and the third compound may include a nitrogen-containing heterocyclic group including *=N—*' as a ring forming moiety and may be selected from compounds represented by Formulae 3-1 and 3-2:

Formula 1-1

$$Ar_{21}-(L_{21})_{b1}-N\begin{matrix}(L_{22})_{b2}-Ar_{22}\\ \\(L_{23})_{b3}-Ar_{23}\end{matrix}$$

Formula 1-2

$$Ar_{21}-(L_{21})_{b1}\quad (L_{23})_{b3}-Ar_{23}$$
$$N-(L_{25})_{b5}-N$$
$$Ar_{22}-(L_{22})_{b2}\quad (L_{24})_{b4}-Ar_{24}$$

Formula 1-3

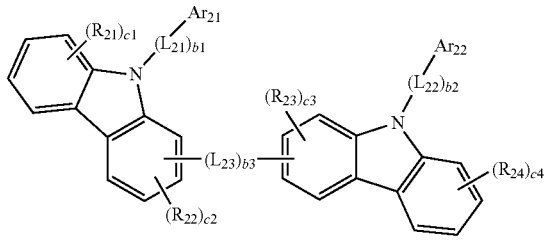

Formula 2H-1

$(R_{31})_{e1}-(L_{31})-Ar_{31}$

Formula 2D-1

$$Ar_{31}-(L_{31})_{d1}\quad (L_{33})_{d3}-Ar_{33}$$
$$N-(L_{35})_{d5}-N$$
$$Ar_{32}-(L_{32})_{d2}\quad (L_{34})_{d4}-Ar_{34}$$

Formula 2D-2

$$Ar_{31}-(L_{31})_{d1}-N\begin{matrix}(L_{32})_{d2}-Ar_{32}\\ \\(L_{33})_{d3}-Ar_{33}\end{matrix}$$

Formula 3-1

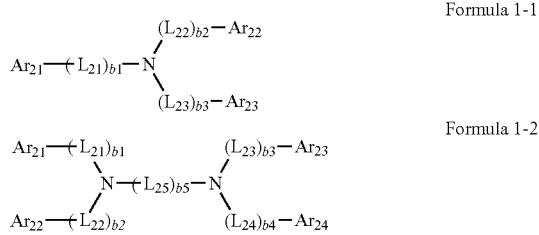

Formula 3-2

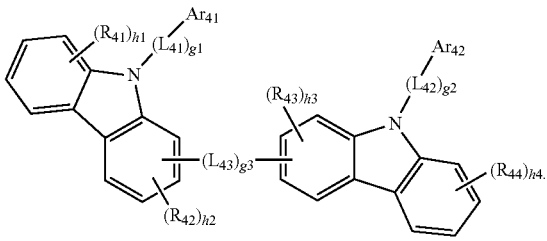

In Formula 3-1, $X_1$ may be C($R_{41}$) or N, $X_2$ may be C($R_{42}$) or N, and $X_3$ may be C($R_{43}$) or N.

In some embodiments, in Formula 3-1, $X_1$ may be C($R_{41}$), $X_2$ may be C($R_{42}$), and $X_3$ may be C($R_{43}$). In this case, at least one of $Ar_{41}$ to $Ar_{43}$ may include a nitrogen-containing heterocyclic group including *=N—*' as a ring forming moiety.

In some embodiments, in Formula 3-1, at least one of $X_1$ to $X_3$ may be nitrogen (N).

In some embodiments, in Formula 3-1, $X_1$ to $X_3$ may each be N.

In Formula 3-1, $R_{41}$ to $R_{43}$ may be each independently understood by referring to the descriptions thereof provided herein.

In Formulae 1-1, 1-2, 1-3, 2H-1, 2D-1, 2D-2, 3-1, and 3-2, $L_{21}$ to $L_{24}$, $L_{31}$ to $L_{34}$, and $L_{41}$ to $L_{43}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In some embodiments, in Formulae 1-1, 1-2, 1-3, 2H-1, 2D-1, 2D-2, 3-1, and 3-2, $L_{21}$ to $L_{24}$, $L_{31}$ to $L_{34}$, and $L_{41}$ to $L_{43}$ may be each independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thienylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothienylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothienylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thienylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothienylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothienylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, a thiadiazolyl group, an imidazopyridinyl group, an imidazopyrimidinyl group, and —Si($Q_{33}$)($Q_{34}$)($Q_{35}$), and descriptions of $Q_{33}$ to $Q_{35}$ may be each independently understood by referring to the description of $Q_1$ provided herein.

In Formula 1-2, $L_{25}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ non-condensed arylene group, and a substituted or unsubstituted $C_1$-$C_{60}$ non-condensed heteroarylene group.

In some embodiments, in Formula 1-2, $L_{25}$ may be selected from:

a phenylene group; and a phenylene group substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, and $C_1$-$C_{20}$ alkoxy group.

In Formula 2D-1, $L_{35}$ may be selected from a substituted or unsubstituted $C_6$-$C_{60}$ condensed polycyclic arylene group, a substituted or unsubstituted $C_1$-$C_{60}$ condensed polycyclic heteroarylene group, a substituted or unsubstituted divalent non-aromatic condensed polycyclic group, and a substituted or unsubstituted divalent non-aromatic condensed heteropolycyclic group.

In some embodiments, in Formula 2D-1, $L_{35}$ may be selected from:

a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothienylene group, an isobenzothiazolylene group, a benzoxazolylene group, an isobenzoxazolylene group, an oxadiazolylene group, a dibenzofuranylene group, a dibenzothienylene group, a benzocarbazolylene group, a dibenzocarbazolylene group, an imidazopyridinylene group, and an imidazopyrimidinylene group; and a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothienylene group, an isobenzothiazolylene group, a benzoxazolylene group, an isobenzoxazolylene group, an oxadiazolylene group, a dibenzofuranylene group, a dibenzothienylene group, a benzocarbazolylene group, a dibenzocarbazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group.

In Formulae 1-1, 1-2, 1-3, 2D-1, 2D-2, 3-1, and 3-2, b1 to b5, d1 to d5, and g1 to g3 may be each independently an integer selected from 0 to 3.

b1 indicates the number of $L_{21}$(s) in Formulae 1-1 to 1-3. When b1 is 0, *-$(L_{21})_{b1}$-*' may be a single bond. When b1 is 2 or more, a plurality of $L_{21}$(s) may be identical to or different from each other. b2 to b5 may be each independently understood by referring to the descriptions of b1 and the corresponding structures of Formulae 1-1 to 1-3.

d1 indicates the number of $L_{31}$(s) in Formulae 2D-1 and 2D-2. When d1 is 0, *-$(L_{31})_{d1}$-*' may be a single bond. When d1 is 2 or more, a plurality of $L_{31}$(s) may be identical to or different from each other. d2 to d5 may be each independently understood by referring to the descriptions of d1 and the corresponding structures of Formulae 2D-1 and 2D-2.

g1 indicates the number of $L_{41}$(s) in Formulae 3-1 to 3-2. When g1 is 0, *-$(L_{41})_{g1}$-*' may be a single bond. When g1 is 2 or more, a plurality of $L_{41}$(s) may be identical to or different from each other. g2 and g3 may be each independently understood by referring to the descriptions of g1 and the corresponding structures of Formulae 3-1 to 3-3.

In Formulae 1-1, 1-2, 1-3, 2H-1, 2D-1, 2D-2, 3-1, and 3-2, $Ar_{21}$ to $Ar_{24}$, $Ar_{31}$ to $Ar_{34}$, and $Ar_{41}$ to $Ar_{43}$ may be each independently a group selected from groups represented by Formulae A to C, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a biphenyl group, a terphenyl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formulae 1-1, 1-2, 1-3, 2H-1, 2D-1, 2D-2, 3-1, and 3-2, $Ar_{21}$ to $Ar_{24}$, $Ar_{31}$ to $Ar_{34}$, and $Ar_{41}$ to $Ar_{43}$ may be each independently:

a group selected from groups represented by Formulae A to C;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group a dibenzosilolyl group, a thiadiazolyl group, an imidazopyridinyl group, and an imidazopyrimidinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, a thiadiazolyl group, an imidazopyridinyl group, an imidazopyrimidinyl group, and —Si($Q_{33}$)($Q_{34}$)($Q_{35}$), wherein $Q_{33}$ to $Q_{35}$ may be each independently understood by referring to the descriptions thereof provided herein.

In Formulae 1-3, 2H-1, 3-1, and 3-2, $R_{21}$ to $R_{24}$, $R_{31}$, and $R_{41}$ to $R_{44}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_{43}$)($Q_{44}$)($Q_{45}$), where $Q_{43}$ to $Q_{45}$ may be each independently understood by referring to the description of $Q_1$ provided herein.

In some embodiments, in Formulae 1-3, 2H-1, 3-1, and 3-2, $R_{21}$ to $R_{24}$, $R_{31}$, and $R_{41}$ to $R_{44}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothienyl group, an isobenzothiazolyl group, a benzoxazolyl group, an isobenzoxazolyl group, an oxadiazolyl group, a triazinyl group, a dibenzofuranyl group, a dibenzothienyl group, an imidazopyridinyl group, and an imidazopyrimidinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothienyl group, an isobenzothiazolyl group, a benzoxazolyl group, an isobenzoxazolyl group, an oxadiazolyl group, a triazinyl group, a dibenzofuranyl group, a dibenzothienyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothienyl group, an isobenzothiazolyl group, a benzoxazolyl group, an isobenzoxazolyl group, an oxadiazolyl group, a triazinyl group, a dibenzofuranyl group, a dibenzothienyl group, an imidazopyridinyl group, an imidazopyrimidinyl group, and —Si($Q_{33}$)($Q_{34}$)($Q_{35}$); and —Si($Q_{43}$)($Q_{44}$)($Q_{45}$), where $Q_{33}$ to $Q_{35}$ and $Q_{43}$ to $Q_{45}$ are as defined herein.

In Formulae 1-3, 2H-1, and 3-2, c1, c4, h1, and h4 may be each independently an integer selected from 0 to 4, e1 may be an integer selected from 0 to 7, and c2, c3, h2, and h3 may be each independently an integer selected from 0 to 3.

c1 indicates the number of $R_{21}$(s) in Formula 1-3. When c1 is 2 or more, a plurality of $R_{21}$(s) may be identical to or different from each other. c2 to c4 may be each independently understood by referring to the description of c1 and the corresponding structure of Formula 1-3.

e1 indicates the number of $R_{31}$(s) in Formula 2H-1. When e1 is 2 or more, a plurality of $R_{31}$(s) may be identical to or different from each other.

h1 indicates the number of $R_{41}$(s) in Formula 3-2. When h1 is 2 or more, a plurality of $R_{41}$(s) may be identical to or different from each other. h2 to h4 may be each independently understood by referring to the description of h1 and the corresponding structure of Formula 3-2.

In some embodiments, in Formula 1-1, at least one of $Ar_{21}$ to $Ar_{23}$ may be a group selected from groups represented by Formulae A to C, in Formula 1-2, at least one of $Ar_{21}$ to $Ar_{24}$ may be a group selected from groups represented by Formulae A to C, in Formula 1-3, at least one of $Ar_{21}$ and $Ar_{22}$ may be a group selected from groups represented by Formulae A to C, in Formula 2H-1, $Ar_{31}$ may be a group selected from groups represented by Formulae A to C, in Formula 2D-1, at least one of $Ar_{31}$ to $Ar_{34}$ may be a group selected from groups represented by Formulae A to C, in Formula 2D-2, at least one of $Ar_{31}$ to $Ar_{33}$ may be a group selected from groups represented by Formulae A to C, provided that the group selected from Formulae A to C included in Formula 2D-2 includes —N($Q_1$)($Q_2$) (where $Q_1$ and $Q_2$ may be understood by referring to the descriptions thereof provided herein), in Formula 3-1, at least one of $Ar_{41}$ to $Ar_{43}$ may be a group selected from groups represented by Formulae A to C, and in Formula 3-2, one of $Ar_{41}$ and $Ar_{42}$ may be a group selected from groups represented by Formulae A to C, and the other one of $Ar_{41}$ and $Ar_{42}$ may be a nitrogen-containing heterocyclic group including *=N—*' as a ring-forming moiety.

In some embodiments, compounds represented by Formulae 1-1, 1-2, 1-3, 2H-1, 2D-1, 2D-2, 3-1, and 3-2 may include a group selected from groups represented by Formulae A to C.

According to an embodiment of the present disclosure, the first compound may be selected from compounds represented by Formulae 1-1(1) to 1-1(4), 1-2(1), and 1-3(1), the second compound may be selected from compounds represented by Formulae 2H-1(1) to 2H-1(4), 2D-1 (1) to 2D-1 (4), 2D-2(1), and 2D-2(2), and the third compound may be selected from compounds represented by Formulae 3-1(1), 3-1(2), and 3-2(1):

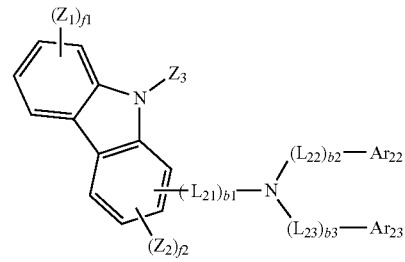

Formula 1-1(1)

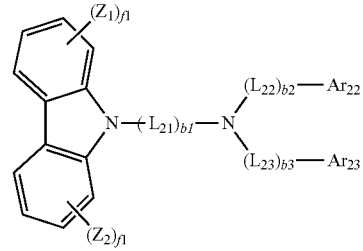

Formula 1-1(2)

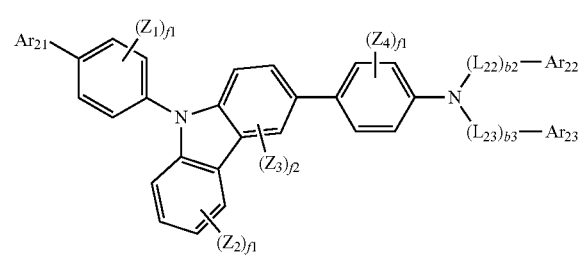

Formula 1-1(3)

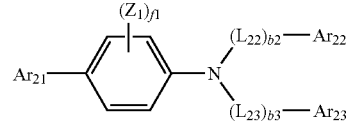

Formula 1-1(4)

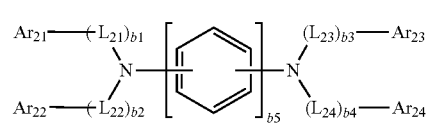

Formula 1-2(1)

Formula 1-3(1)
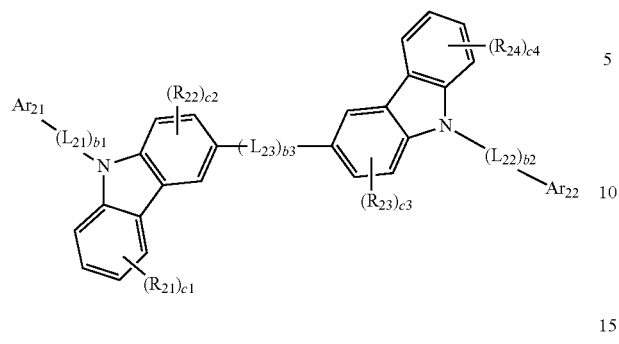
Formula 2H-1(1)
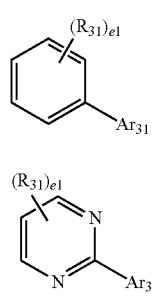
Formula 2H-1(2)
Formula 2H-1(3)
Formula 2H-1(4)
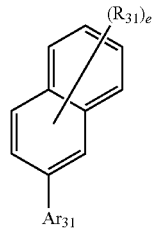
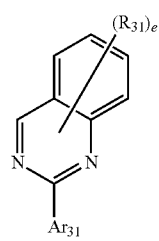
Formula 2D-1(1)
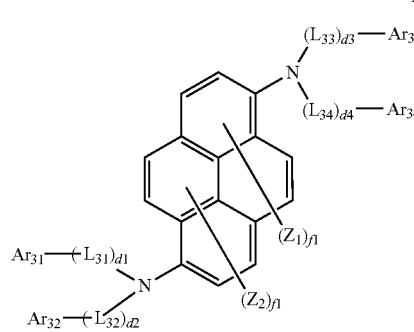
Formula 2D-1(2)
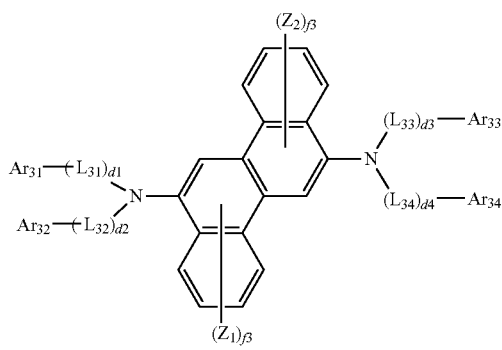
Formula 2D-1(3)
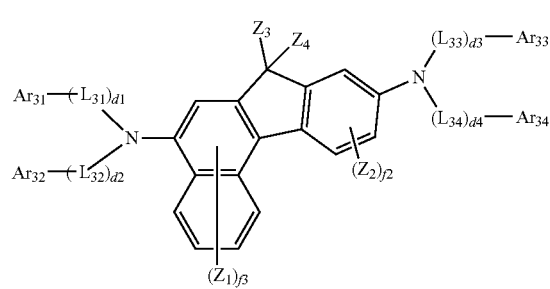
Formula 2D-1(4)
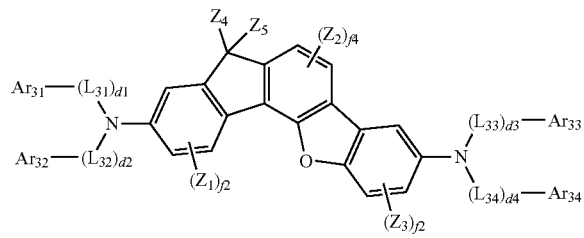
Formula 2D-2(1)
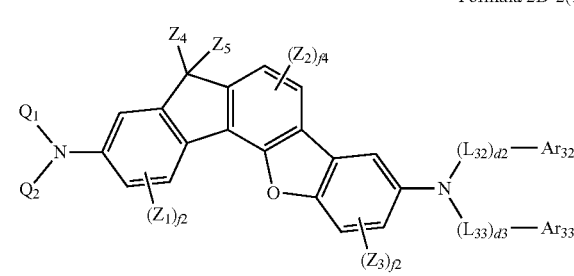
Formula 2D-2(2)
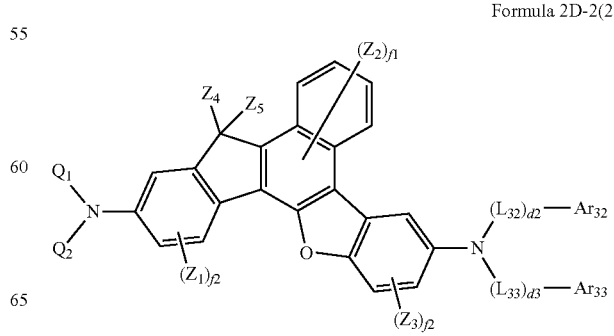

-continued

Formula 3-1(1)

$(L_{41})_{g1}$—$Ar_{41}$, $R_{41}$, $R_{42}$, $Ar_{42}$—$(L_{42})_{g2}$, $(L_{43})_{g3}$—$Ar_{43}$, $R_{43}$

Formula 3-1(2)

$(L_{41})_{g1}$—$Ar_{41}$, $Ar_{42}$—$(L_{42})_{g2}$, $(L_{43})_{g3}$—$Ar_{43}$

Formula 3-2(1)

$Ar_{41}$, $(L_{41})_{g1}$, $(R_{42})_{h2}$, $(R_{44})_{h4}$, $(L_{43})_{g3}$, $(R_{41})_{h1}$, $(R_{43})_{h3}$, $(L_{42})_{g2}$, $Ar_{42}$

In Formulae 1-1(1) to 1-1(4), 1-2(1), 1-3(1), 2H-1(1) to 2H-1(4), 2D-1(1) to 2D-1(4), 2D-2(1), 2D-2(2), 3-1(1), 3-1(2), and 3-2(1), $L_{21}$ to $L_{24}$, $L_{31}$ to $L_{34}$, $L_{41}$ to $L_{43}$, b1 to b5, d1 to d4, g1 to g3, $Ar_{21}$ to $Ar_{24}$, $Ar_{31}$ to $Ar_{34}$, $Ar_{41}$ to $Ar_{43}$, $R_{21}$ to $R_{24}$, $R_{31}$, $R_{41}$ to $R_{44}$, c1 to c4, e1, h1 to h4, $Q_1$, and $Q_2$ may be understood by referring to the descriptions thereof provided herein.

In Formulae 1-1(1) to 1-1(4), 2D-1(1) to 2D-1(4), 2D-2 (1), and 2D-2(2), $Z_1$ to $Z_5$ may be each independently selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{13}$)($Q_{14}$)($Q_{15}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{23}$)($Q_{24}$)($Q_{25}$); and —Si($Q_{33}$)($Q_{34}$)($Q_{35}$).

$Q_1$, $Q_2$, $Q_{13}$ to $Q_{15}$, $Q_{23}$ to $Q_{25}$, and $Q_{33}$ to $Q_{35}$ may be understood by referring to the descriptions thereof provided herein.

In Formulae 1-1(1) to 1-1(4), 2D-1(1) to 2D-1(4), 2D-2 (1), and 2D-2(2), f1 may be an integer selected from 0 to 4, f2 may be an integer selected from 0 to 3, f3 may be an integer selected from 0 to 5, and f4 may be an integer selected from 0 to 2.

In Formula 1-1(1), at least one of $Ar_{22}$ and $Ar_{23}$ may be a group selected from groups represented by Formulae A to C, in Formula 1-1(2), at least one of $Ar_{22}$ and $Ar_{23}$ may be a group selected from groups represented by Formulae A to C, in Formula 1-1(3), at least one of $Ar_{21}$ to $Ar_{23}$ may be a group selected from groups represented by Formulae A to C, in Formula 1-1(4), at least one of $Ar_{21}$ to $Ar_{23}$ may be a group selected from groups represented by Formulae A to C, in Formula 1-2(1), at least one of $Ar_{21}$ to $Ar_{24}$ may be a group selected from groups represented by Formulae A to C, in Formula 1-3(1), at least one of $Ar_{21}$ and $Ar_{22}$ may be a group selected from groups represented by Formulae A to C, in Formulae 2H-1(1) to 2H-1(4), $Ar_{31}$ may be a group selected from groups represented by Formulae A to C, in Formula 2D-1(1), at least one of $Ar_{31}$ to $Ar_{34}$ may be a group selected from groups represented by Formulae A to C, in Formula 2D-1(2), at least one of $Ar_{31}$ to $Ar_{34}$ may be a group selected from groups represented by Formulae A to C, in Formula 2D-1(3), at least one of $Ar_{31}$ to $Ar_{34}$ may be a group selected from groups represented by Formulae A to C, in Formula 2D-1(4), at least one of $Ar_{31}$ to $Ar_{34}$ may be a group selected from groups represented by Formulae A to C, in Formula 2D-2(1), at least one of $Ar_{32}$ and $Ar_{33}$ may be a group selected from groups represented by Formulae A to C, in Formula 2D-2(2), at least one of $Ar_{32}$ and $Ar_{33}$ may be a group selected from groups represented by Formulae A to C, in Formula 3-1(1), at least one of $Ar_{41}$ to $Ar_{43}$ may be a group selected from groups represented by Formulae A to C, in Formula 3-1(2), at least one of $Ar_{41}$ to $Ar_{43}$ may be a group selected from groups represented by Formulae A to C, and in Formula 3-2(1), one of $Ar_{41}$ and $Ar_{42}$ may be a group selected from groups represented by Formulae A to C, and the other one of $Ar_{41}$ and $Ar_{42}$ may be a nitrogen-containing heterocyclic group including *=N—*' as a ring forming moiety.

In some embodiments, compounds represented by Formulae 1-1(1) to 1-1(4), 1-2(1), 1-3(1), 2H-1(1) to 2H-1(4), 2D-1(1) to 2D-1(4), 2D-2(1), 2D-2(2), 3-1(1), 3-1(2), and 3-2(1) may include a group selected from Formulae A to C (e.g., a group selected from groups represented by Formulae A to C included as a major component).

According to one or more example embodiments, an organic light-emitting device may include:

a first compound selected from Compounds 1-1 to 1-12 and 2-1 to 2-10;

a second compound selected from Compounds 3-1 to 3-12 and 4-1 to 4-12; and a third compound selected from Compounds 5-1 to 5-9:

1-1

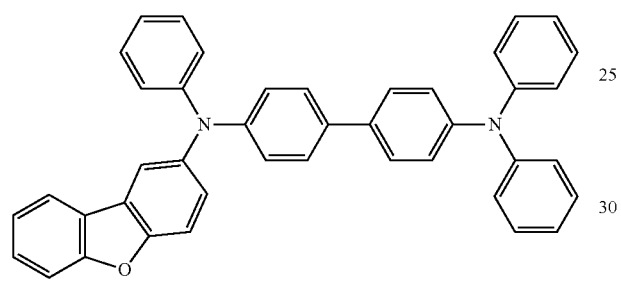

1-2

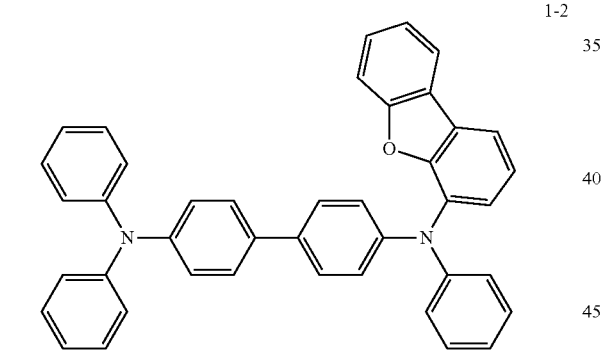

1-3

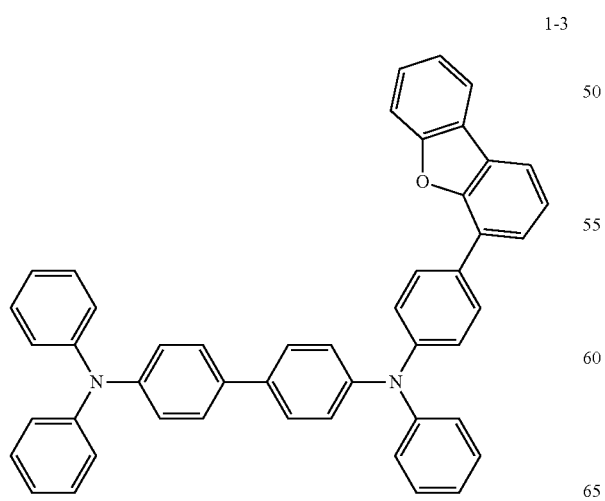

-continued 1-4

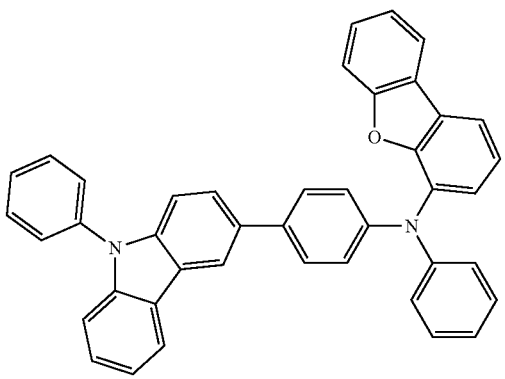

1-5

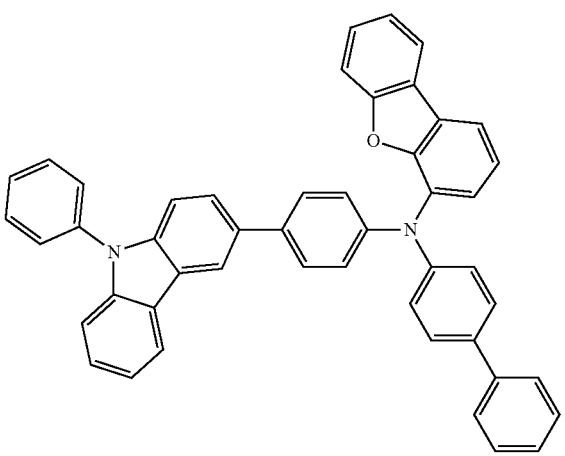

1-6

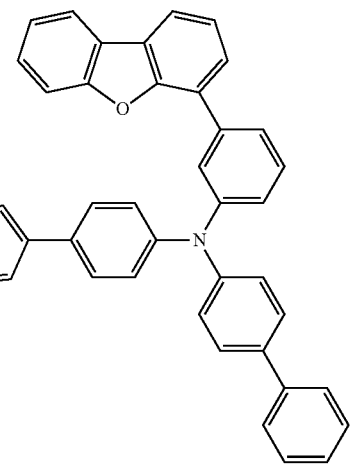

1-7
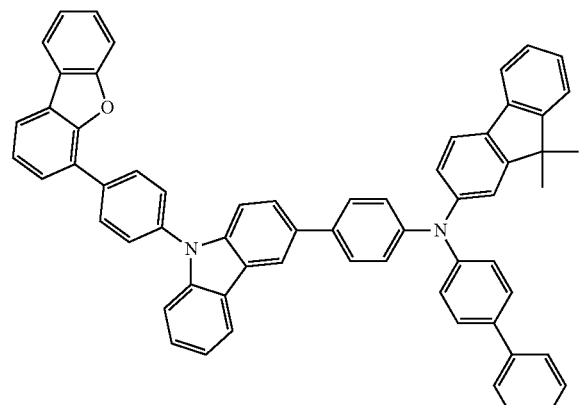
1-8
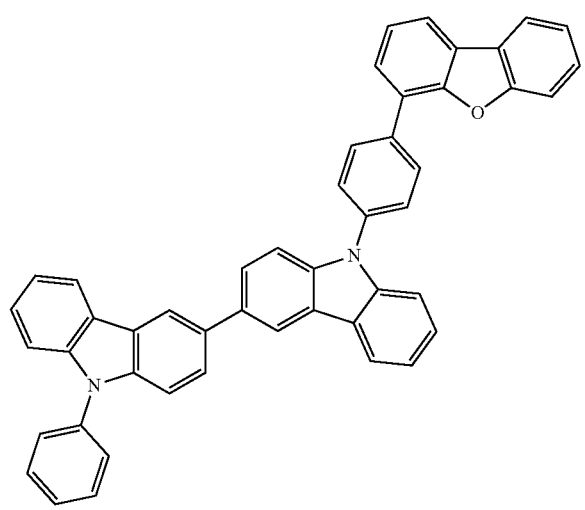
1-9
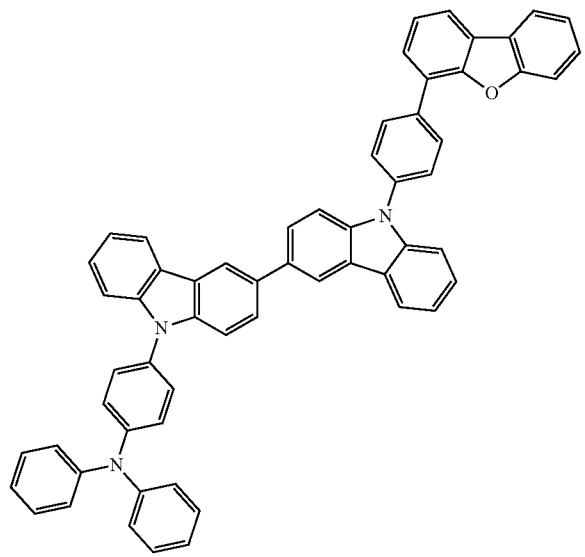
1-10
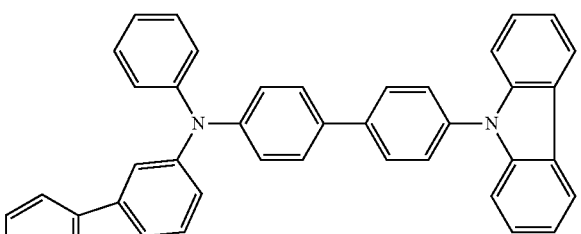
1-11
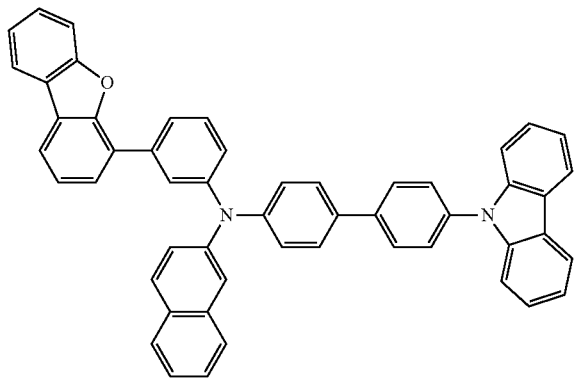
1-12
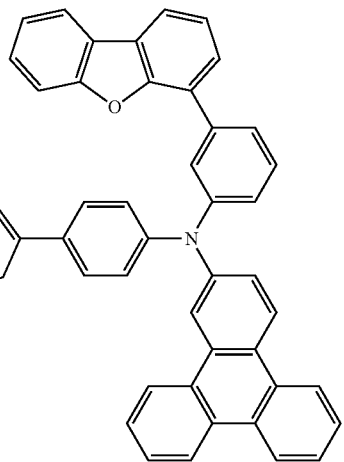

2-1
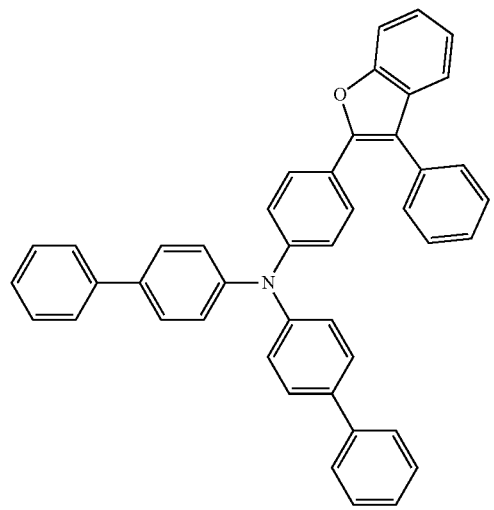
2-2
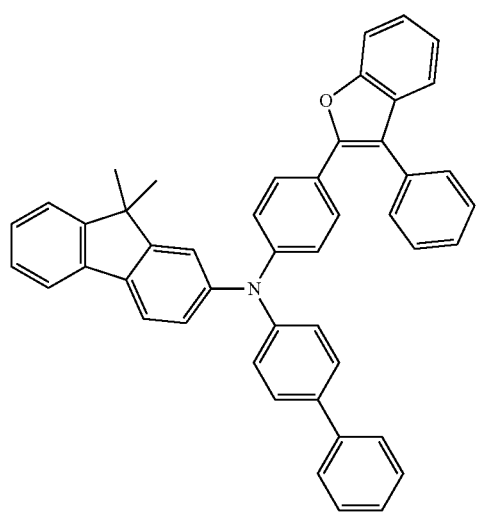
2-3
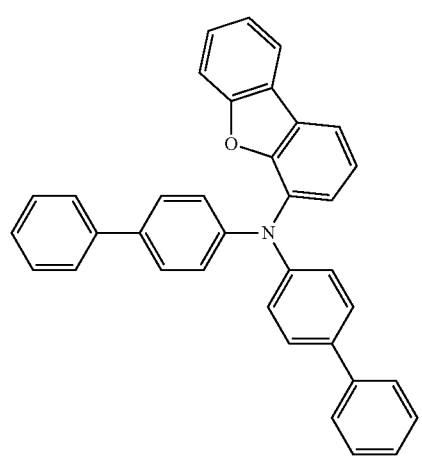
2-4
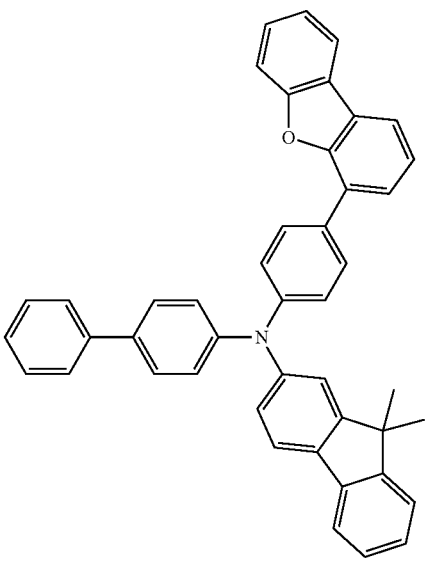
2-5
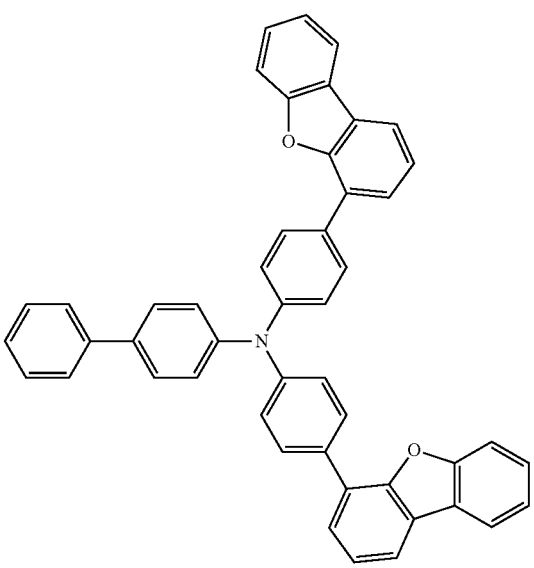

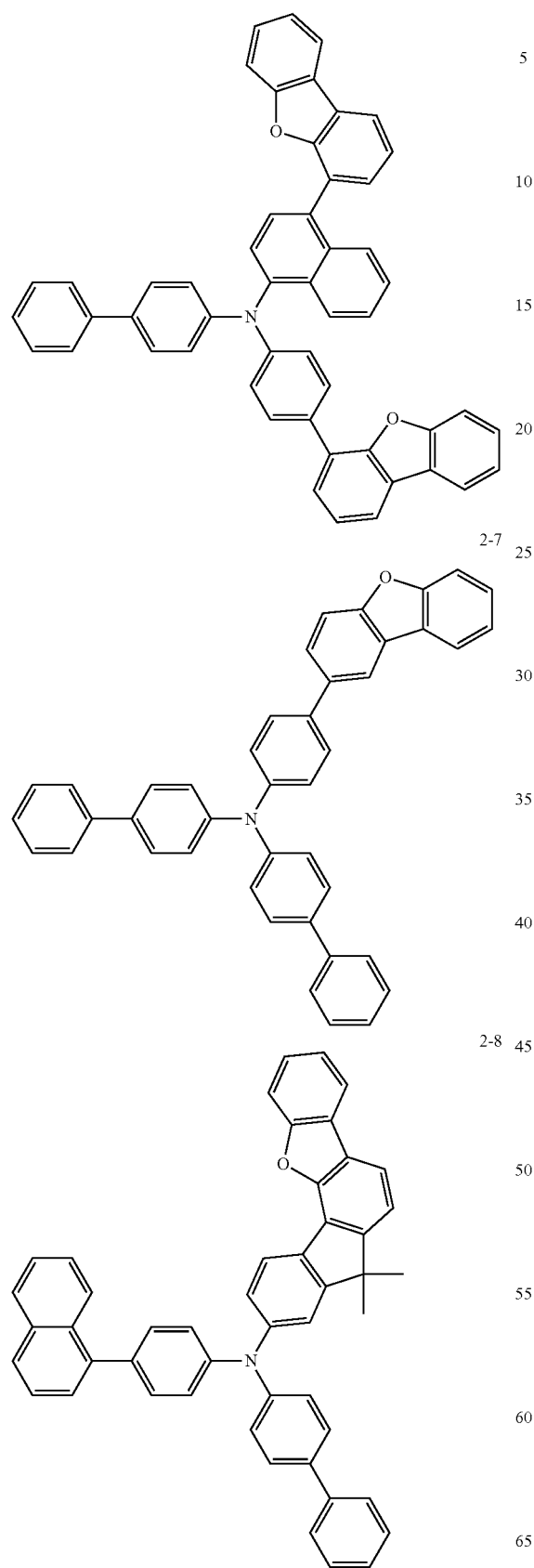
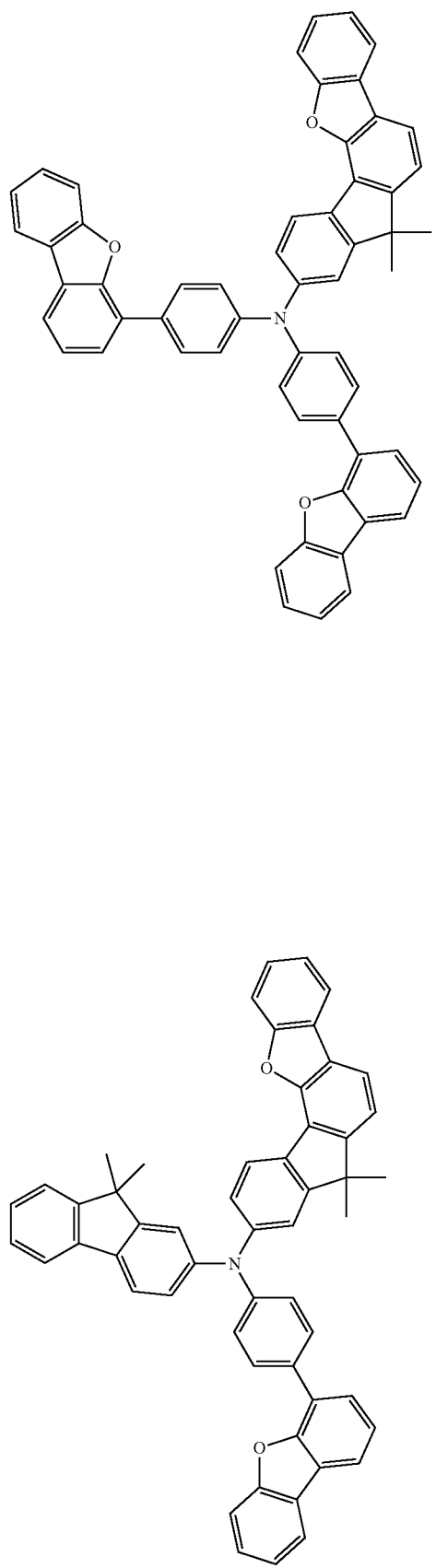

-continued
3-1
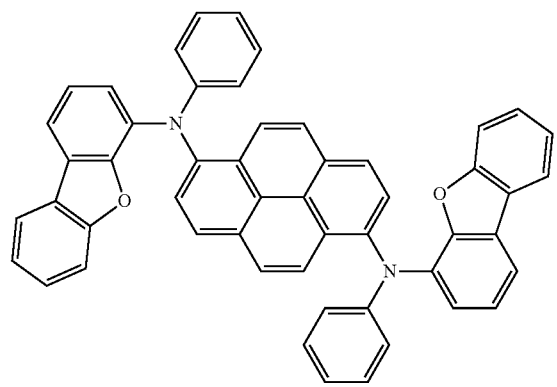
3-2
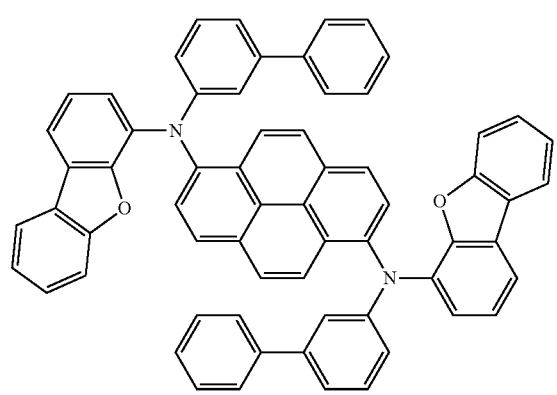
3-3
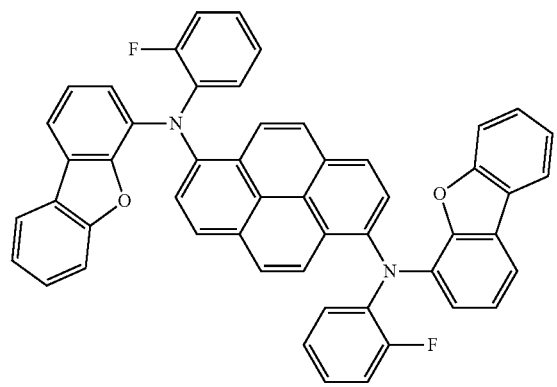
3-4
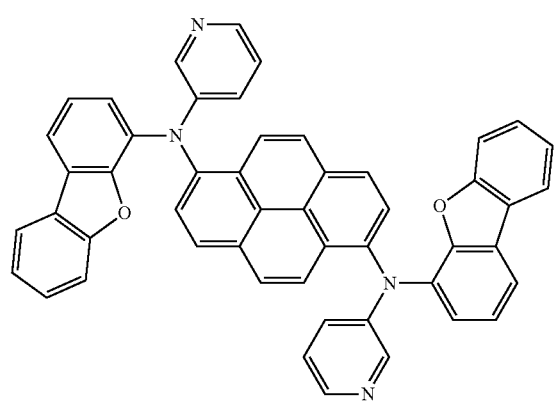
-continued
3-5
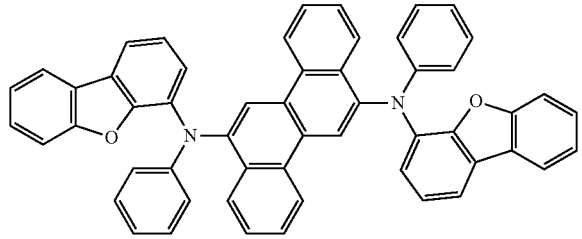
3-6
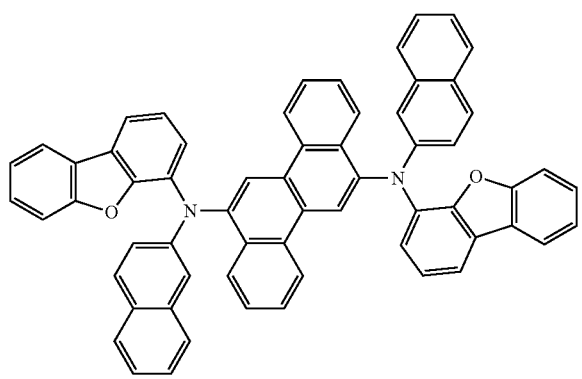
3-7
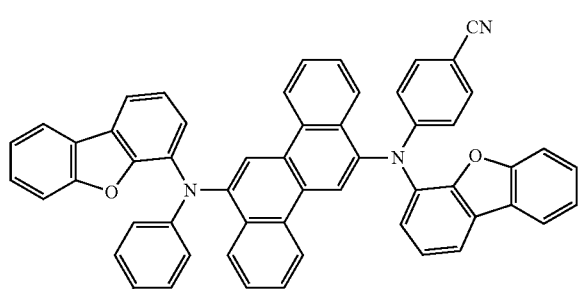
3-8
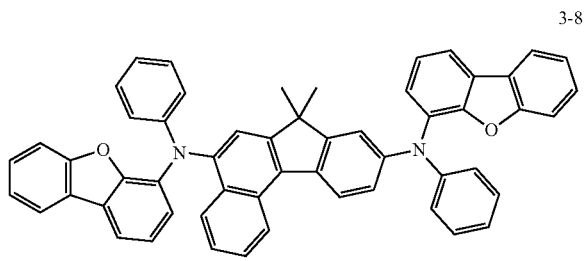
3-9
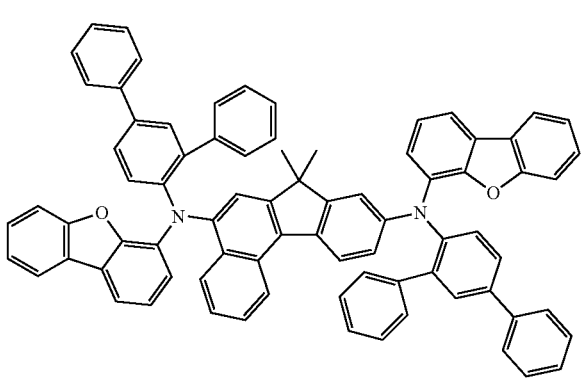

-continued
3-10
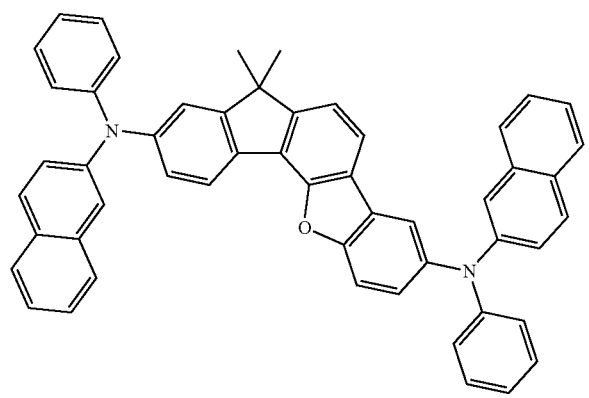
3-11
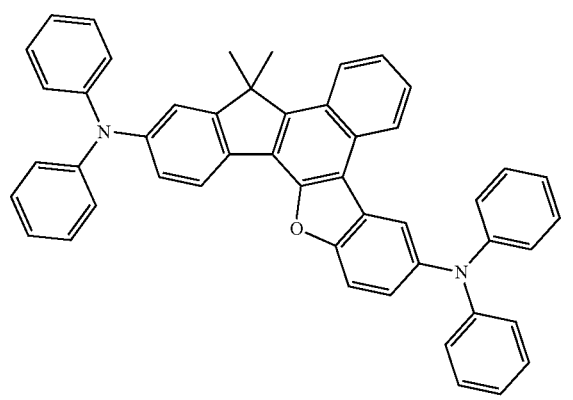
3-12
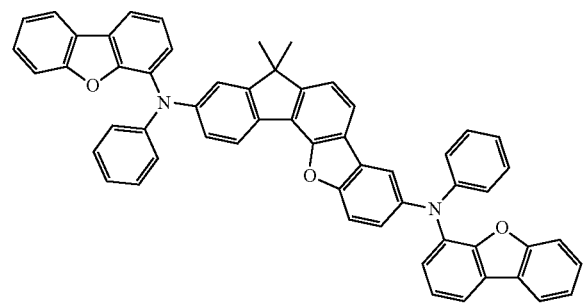
4.1
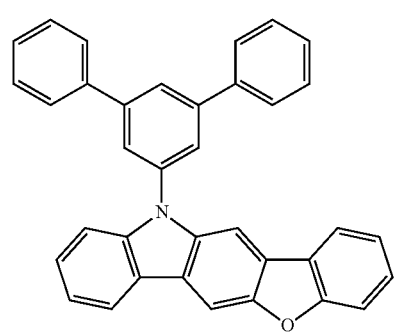
-continued
4.2
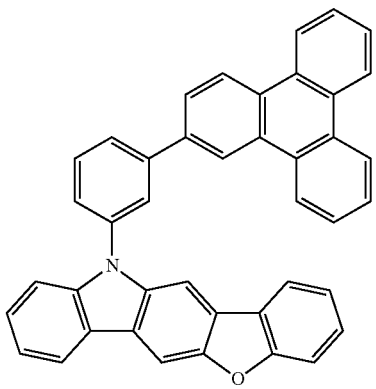
4.3
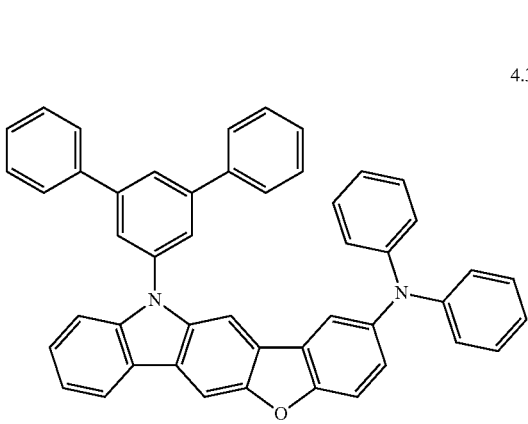
4.4
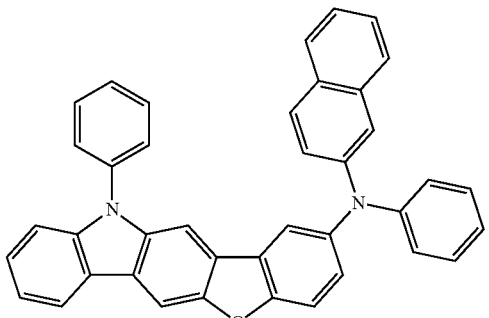
4.5
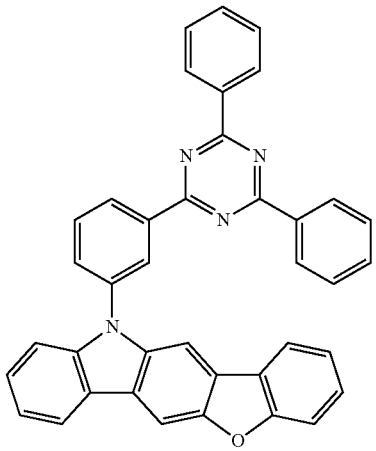

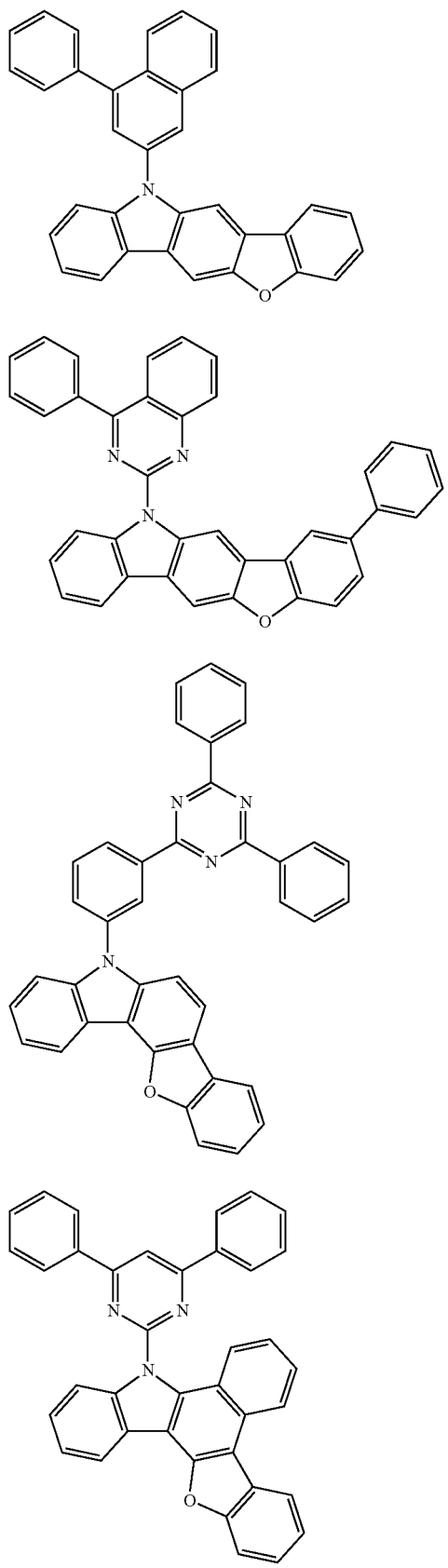
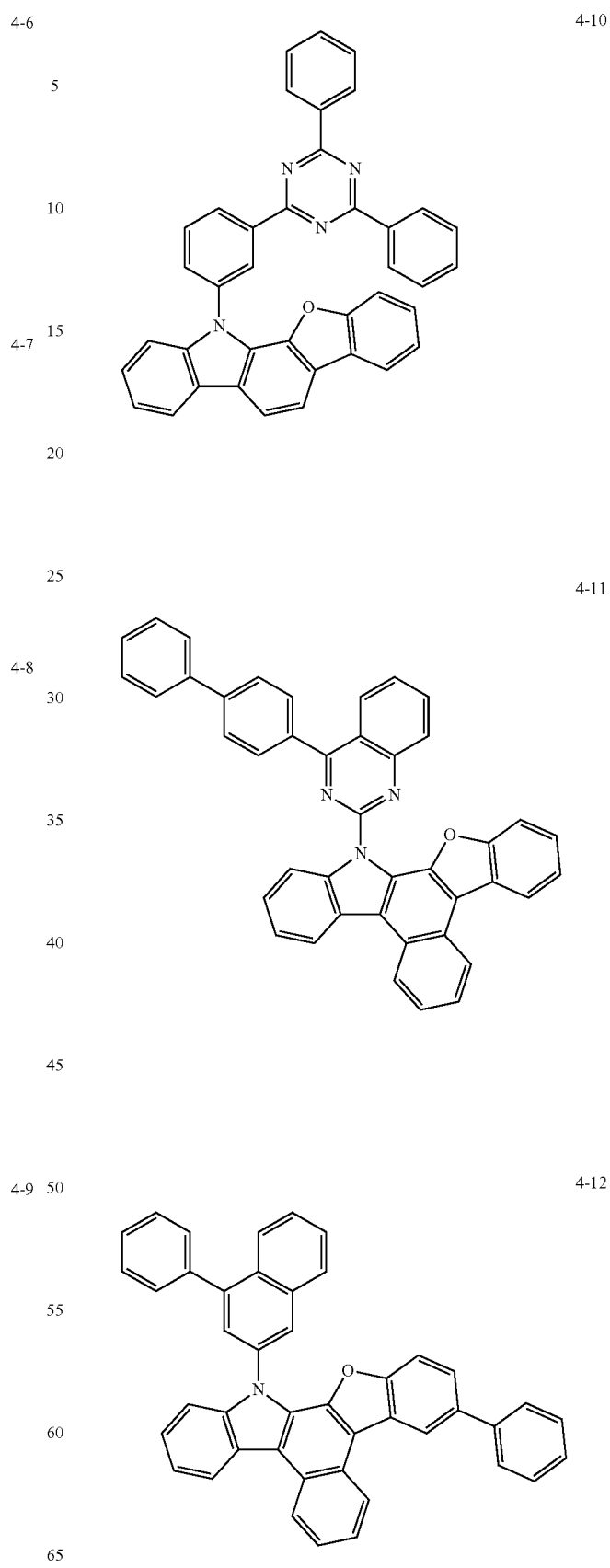

5-1
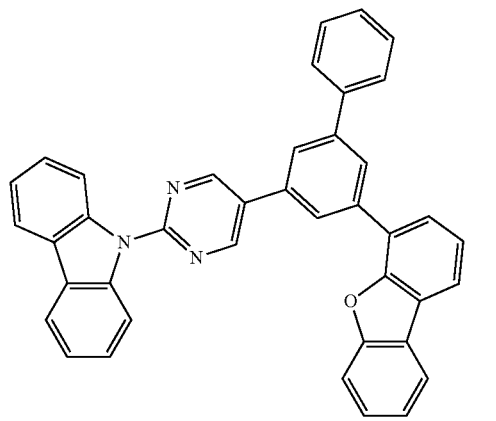
5-2
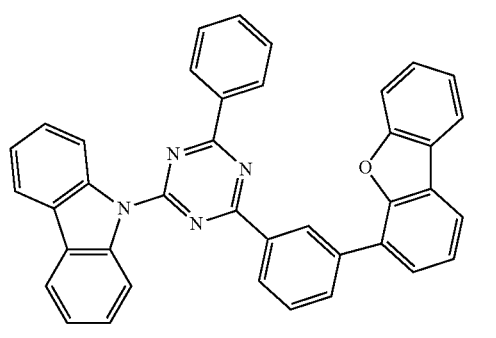
5-3
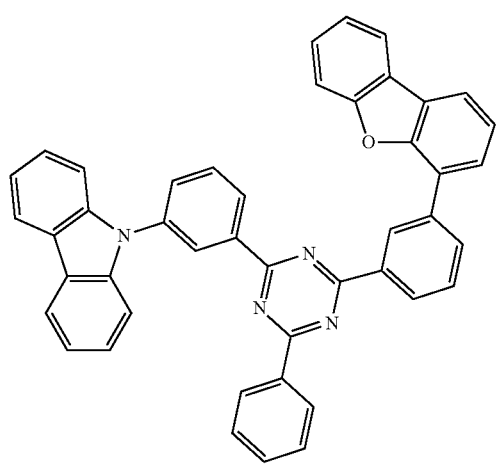
5-4
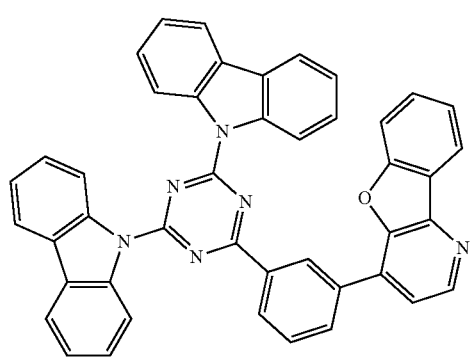
5-5
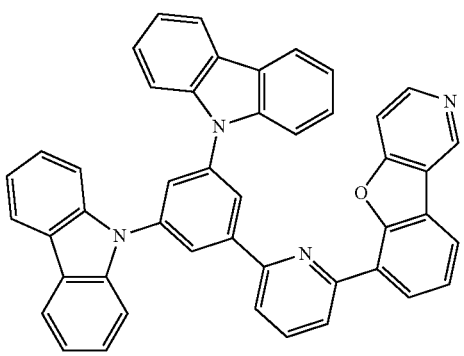
5-6
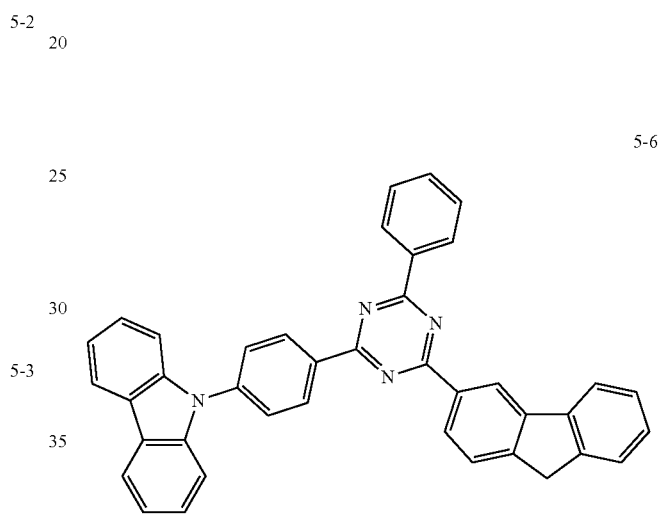
5-7
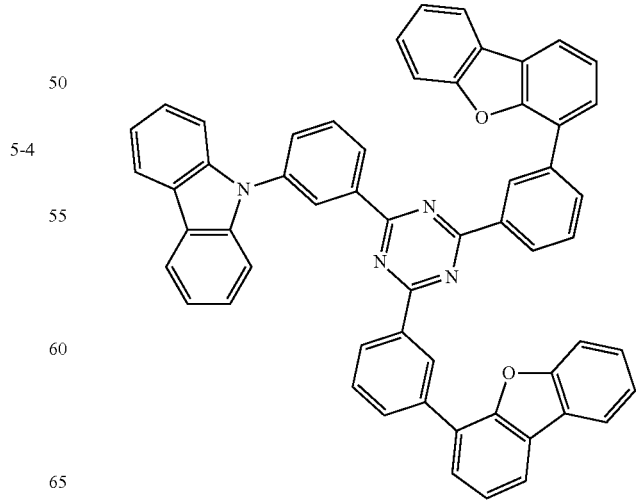

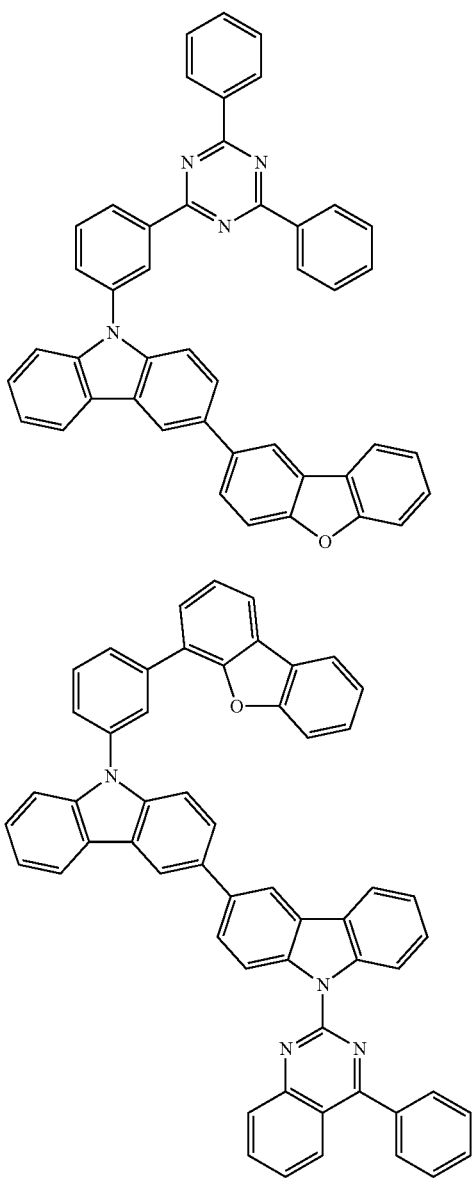

At least two selected from the first compound, the second compound, and the third compound may have a triplet energy of 2.4 eV or more, for example, 2.5 eV or more. When the triplet energy is within these ranges, in a fluorescent organic light-emitting device, for example, emission efficiency through the triplet-triplet fusion (TTF) may be improved, and in a phosphorescent organic light-emitting device, the transfer of triplet excitons formed in an emission layer may be suppressed or reduced, thereby preventing or reducing a decrease in device efficiency.

In some embodiments, each of the first compound, the second compound, and the third compound may have asymmetrical structure.

For example: in Formula 1-1, a case where $-(L_{21})_{b1}-Ar_{21}$, $-(L_{22})_{b2}-Ar_{22}$, and $-(L_{23})_{b3}-Ar_{23}$ are the same may be excluded; in Formula 1-2, a case where $-(L_{21})_{b1}-Ar_{21}$, $-(L_{22})_{b2}-Ar_{22}$, $-(L_{23})_{b3}-Ar_{23}$, and $-(L_{24})_{b4}-Ar_{24}$ are the same may be excluded; in Formula 2D-1, a case where $-(L_{31})_{d1}-Ar_{31}$, $-(L_{32})_{d2}-Ar_{32}$, $-(L_{33})_{d3}-Ar_{33}$, and $-(L_{34})_{d4}-Ar_{34}$ are the same may be excluded; in Formula 2D-2, a case where $-(L_{31})_{d1}-Ar_{31}$, $-(L_{32})_{d2}-Ar_{32}$, and $-(L_{33})_{d3}-Ar_{33}$ are the same may be excluded and in Formula 3-1, a case where $-(L_{41})_{g1}-Ar_{41}$, $-(L_{42})_{g2}-Ar_{42}$, and $-(L_{43})_{g3}-Ar_{43}$ are the same may be excluded.

In some embodiments, in Formula 1-3, the two carbazole moieties coupled via $-(L_{23})_{b3}-$ may be different from each other; in Formula 2H-1, $(R_{31})_{e1}$ and $Ar_{31}$ coupled via $-(L_{31})-$ may be different from each other; and in Formula 3-2, the two carbazole moieties coupled via $-(L_{43})_{g3}-$ may be different from each other.

When each of the first compound, the second compound, and the third compound has an asymmetrical structure as described above, for example, the level of stacking and aggregation of molecules in an organic layer may decrease. Therefore, for example, when each of the first compound, the second compound, and the third compound is used as a matrix material in a layer including the compound, degradation of the device may be prevented or reduced and the lifespan of the device may improve.

According to an embodiment of the present disclosure, the first compound may be selected from compounds represented by Formulae 1-1 to 1-3, the second compound may be represented by Formula 2H-1, and the third compound may be selected from compounds represented by Formulae 3-1 and 3-2.

In some embodiments, the first compound may be selected from compounds represented by Formulae 1-1(1) to 1-1(4), 1-2(1), and 1-3(1), the second compound may be selected from compounds represented by Formulae 2H-1 (1) to 2H-1 (4), and the third compound may be selected from compounds represented by Formulae 3-1(1), 3-1(2), and 3-2(1).

According to one or more example embodiments, in an organic light-emitting device, a second layer may be an emission layer and may further include a dopant, in addition to the compounds described above, and a first layer and a third layer may each directly contact the second layer.

In some embodiments, the dopant may be a phosphorescent dopant. Non-limiting examples of the dopant will be described below.

According to an embodiment of the present disclosure, the first compound may be selected from compounds represented by Formulae 1-1 to 1-3, the second compound may be selected from compounds represented by Formulae 2D-1 and 2D-2, and the third compound may be selected from compounds represented by Formulae 3-1 and 3-2.

In some embodiments, the first compound may be selected from compounds represented by Formulae 1-1(1) to 1-1(4), 1-2(1), and 1-3(1), the second compound may be selected from compounds represented by Formulae 2D-1 (1) to 2D-1 (4), 2D-2(1), and 2D-2(2), and the third compound may be selected from compounds represented by Formulae 3-1(1), 3-1(2), and 3-2(1).

According to one or more example embodiments, in an organic light-emitting device, the second layer may be an emission layer, and the second layer may further include a host, in addition to the compounds described above, and a first layer and a third layer may each directly contact the second layer.

In some embodiments, the host may be a fluorescent host. Non-limiting examples of the host will be described below.

In some embodiments, the first compound and the second compound may be each independently selected from compounds represented by Formulae 1-1, 1-2, and 1-3, where the first compound may be different from the second compound, and the third compound may be selected from compounds represented by Formulae 2H-1, 2D-1, 2D-2, 3-1, and 3-2.

In some embodiments, the first compound and the second compound may be each independently selected from compounds represented by Formulae 1-1(1) to 1-1(4), 1-2(1), and 1-3(1), where the first compound may be different from the second compound, and the third compound may be selected from compounds represented by Formulae 2H-1(1) to 2H-1(4), 2D-1(1) to 2D-1(4), 2D-2(1), 2D-2(2), 3-1(1), 3-1(2), and 3-2(1).

In some embodiments, the first compound and the second compound may be each independently selected from compounds represented by Formulae 1-1, 1-2, and 1-3, where the first compound may be different from the second compound, and the third compound may be selected from compounds represented by Formulae 2H-1, 3-1 and 3-2.

In some embodiments, the first compound and the second compound may be each independently selected from compounds represented by Formulae 1-1(1) to 1-1(4), 1-2(1), and 1-3(1), where the first compound may be different from the second compound, and the third compound may be selected from compounds represented by Formulae 2H-1(1) to 2H-1(4), 3-1(1), 3-1(2), and 3-2(1).

An organic light-emitting device according to another example embodiment may include the third layer as an emission layer, the third layer further including a dopant, in addition to the compounds described above, and the second layer may directly contact the third layer. In some embodiments, the dopant may be a phosphorescent dopant.

In some embodiments, the first compound and the second compound may be each independently selected from compounds represented by Formulae 1-1, 1-2, and 1-3, where the first compound may be different from the second compound, and the third compound may be selected from compounds represented by Formulae 2D-1, 2D-2, 3-1 and 3-2.

In some embodiments, the first compound and the second compound may be each independently selected from compounds represented by Formulae 1-1(1) to 1-1(4), 1-2(1), and 1-3(1), where the first compound may be different from the second compound, and the third compound may be selected from compounds represented by Formulae 2D-1(1) to 2D-1(4), 2D-2(1), 2D-2(2), 3-1(1), 3-1(2), and 3-2(1).

An organic light-emitting device according to another example embodiment may include the third layer as an emission layer, the third layer further including a host, in addition to the compounds described above, and the second layer may directly contact the third layer. In some embodiments, the host may be a fluorescent host.

The first compound and the second compound may be each independently selected from Compounds 1-1 to 1-12 and 2-1 to 2-10, where the first compound may be different from the second compound, and the third compound may be selected from Compounds 3-1 to 3-12, 4-1 to 4-12, and 5-1 to 5-9.

The organic light-emitting device may include the first layer including the first compound, the second layer including the second compound, and the third layer including the third compound, wherein each of the first compound, the second compound, and the third compound may include at least one group selected from Formulae A to C. Accordingly, charge transfer may be facilitated due to the similarity in molecular structures of the first, second, and third compounds. Further, the interfacial characteristics between the three layers may improve, thereby improving the stability and lifespan of the organic light-emitting device.

Hereinafter a structure and a method of manufacturing an organic light-emitting device according to one or more embodiments of the present disclosure will be described with reference to the drawing.

The drawing is a schematic cross-sectional view of an organic light-emitting device (OLED) 10 according to an example embodiment of the present disclosure.

The OLED 10 may include a first electrode 110, a first layer 130, a second layer 150, and a third layer 170, and a second electrode 190, which are sequentially layered in the stated order.

Referring to the drawing, a substrate may be additionally disposed (e.g., positioned) under the first electrode 110 or on the second electrode 190. The substrate may be a glass substrate or transparent plastic substrate, each with excellent mechanical strength, thermal stability, transparency, surface smoothness, ease of handling, and/or water resistance.

The first electrode 110 may be formed by depositing or sputtering a material for forming the first electrode 110 on the substrate. When the first electrode 110 is an anode, the material for forming the first electrode 110 may be selected from materials with a high work function that facilitate hole injection. The first electrode 110 may be a reflective electrode, a semi-transmissive electrode, or a transmissive electrode. The material for forming the first electrode 110 may be a transparent and highly conductive material. Non-limiting examples of such material may include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode 110, at least one selected from magnesium (Mg), aluminum (Al), aluminum-lithium (Al—Li), calcium (Ca), magnesium-indium (Mg—In), and magnesium-silver (Mg—Ag) may be used.

The first electrode 110 may have a single-layer structure, or a multi-layer structure including a plurality of layers. For example, the first electrode 110 may have a triple-layer structure of ITO/Ag/ITO, but embodiments of the present disclosure are not limited thereto.

The first layer 130, the second layer 150, and the third layer 170 may be sequentially stacked on the first electrode 110.

The first layer 130 may include a first compound, the second layer 150 may include a second compound, and the third layer 170 may include a third compound. The descriptions of the first to third compounds may be understood by referring to the descriptions thereof provided herein.

Although not illustrated in the drawing, a hole injection layer may be additionally disposed (e.g., positioned) between the first electrode 110 and the first layer 130.

When the organic light-emitting device 10 includes a hole injection layer, the hole injection layer may be formed on the first electrode 110 by using one or more suitable methods, such as vacuum deposition, spin coating, casting, a Langmuir-Blodgett (LB) method, ink-jet printing, laser printing, and/or laser-induced thermal imaging (LITI).

When the hole injection layer is formed by vacuum deposition, for example, the vacuum deposition may be performed at a temperature of about 100° C. to about 500° C., at a vacuum degree of about $10^{-8}$ Torr to about $10^{-3}$ Torr, and at a vacuum deposition rate in a range of about 0.01 Å/sec to about 100 Å/sec, depending on the compound for forming the hole injection layer, and the structure of the hole injection layer to be formed.

When a hole injection layer is formed by spin coating, the spin coating may be performed at a coating rate of about 2000 rpm to about 5000 rpm, and at a temperature of about 80° C. to 200° C., depending on the compound for forming the hole injection layer, and the structure of the hole injection layer to be formed.

The thickness of the hole injection layer may be in a range of about 100 Å to about 10,000 Å, for example, about 100 Å to about 1,000 Å.

The method of forming the hole injection layer may be understood by referring to any of the methods of forming the first layer 130, the second layer 150, and the third layer 170.

In some embodiments, the first layer 130 may include the first compound, and may additionally include at least one selected from m-MTDATA, TDATA, 2-TNATA, NPB, β-NPB, TPD, a spiro-TPD, a spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), and (polyaniline)/poly(4-styrenesulfonate) (PANI/PSS):

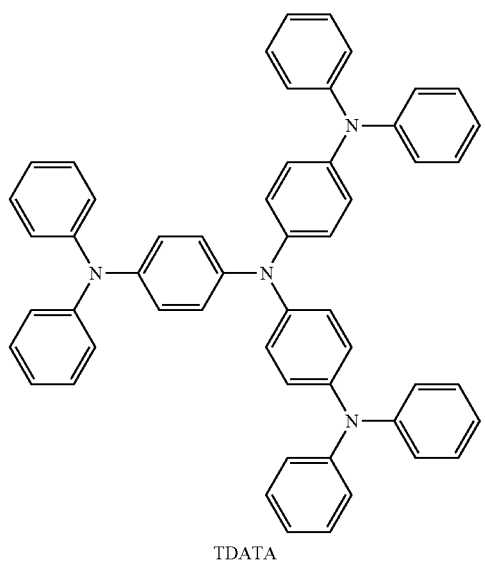

TDATA

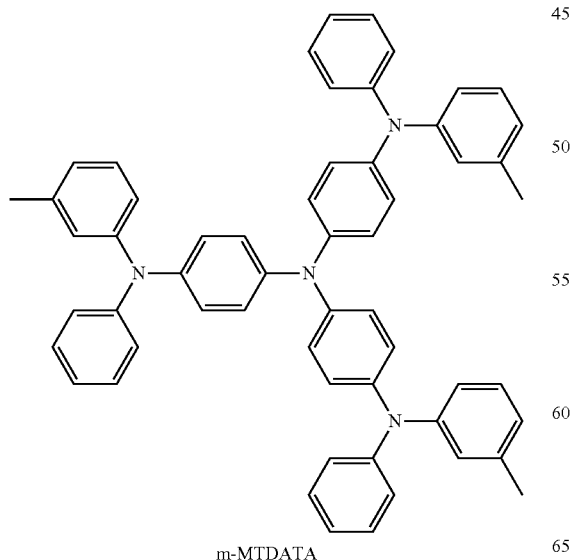

m-MTDATA

2-TNATA

NPB

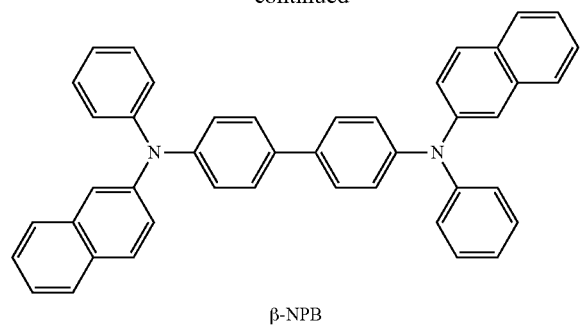

β-NPB

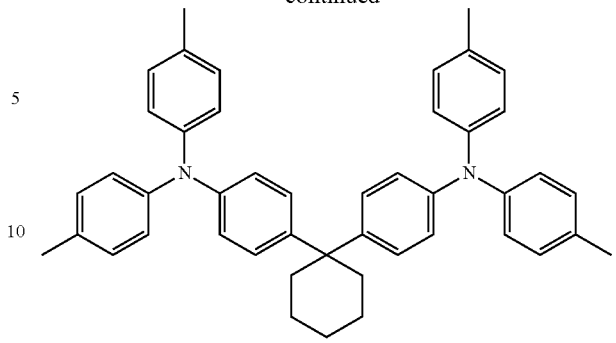

TAPC

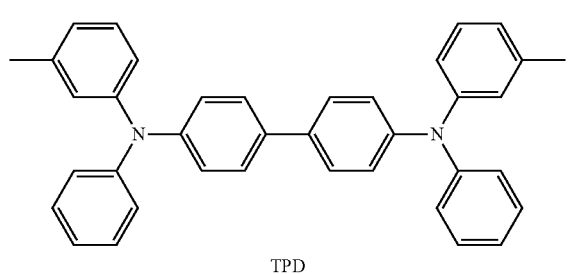

TPD

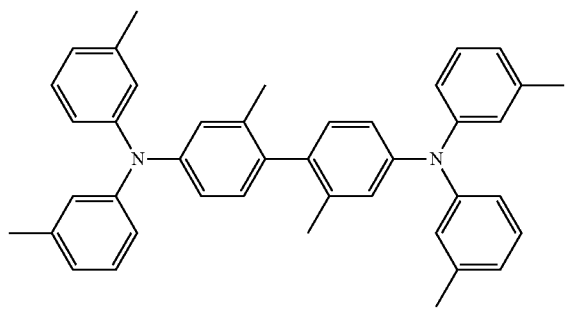

HMTPD

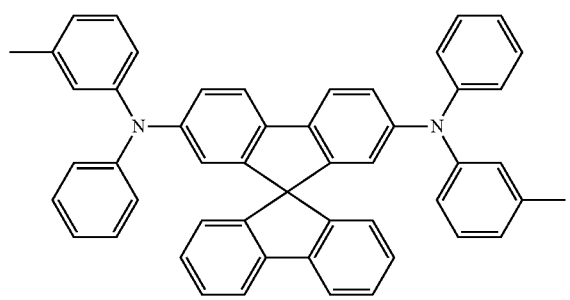

Spiro-TPD

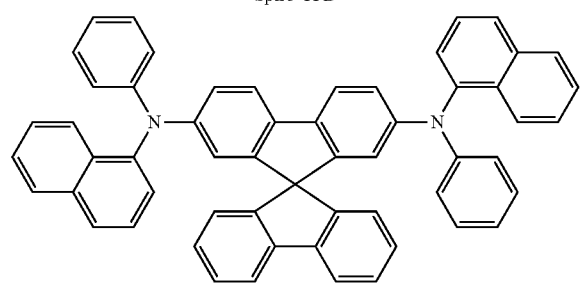

Spiro-NPB

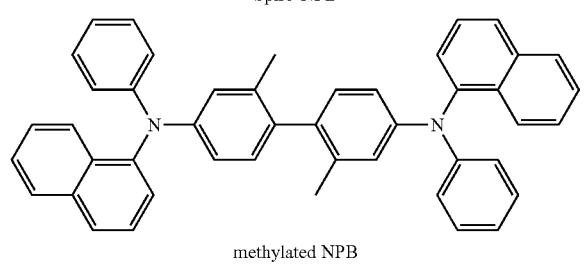

methylated NPB

The first layer 130 may further include a charge-generating material, in addition to the materials mentioned above, to improve conductive properties. The charge-generating material may be homogeneously or non-homogeneously dispersed throughout the first layer 130.

The charge-generating material may be, for example, a p-dopant. The p-dopant may be selected from a quinone derivative, a metal oxide, and a cyano group-containing compound, but embodiments of the present disclosure are not limited thereto. Non-limiting examples of the p-dopant may include quinone derivatives (such as tetracyanoquinonedimethane (TCNQ) and/or Compound HT-D2); metal oxides (such as tungsten oxide and/or molybdenum oxide); and Compound HT-D1, but embodiments are not limited thereto.

Compound HT-D1

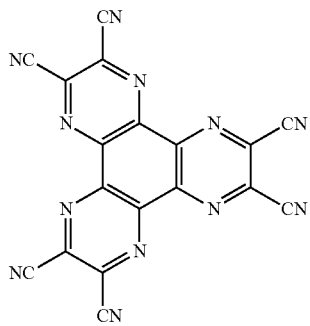

Compound HT-D2

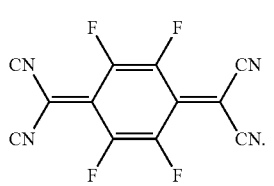

In some embodiments, the first layer 130 may be a hole transport layer. When the first layer 130 is a hole transport layer, the thickness of the hole transport layer may be in a range of about 50 Å to about 2,000 Å, for example, about 100 Å to about 1,500 Å.

According to an embodiment, the second layer 150 may be an emission layer, and the first layer 130 and the third layer 170 may each directly contact the second layer 150.

In some embodiments, the third layer 170 may be an emission layer, and the second layer 150 may directly contact the third layer 170.

When the organic light-emitting device 10 is a full color organic light-emitting device, the emission layer may be patterned into a red emission layer, a green emission layer, or a blue emission layer, according to a sub-pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light.

In some embodiments, when the second layer 150 is an emission layer, the emission layer may include the second compound, and may additionally include a host and/or a dopant.

In some embodiments, when the third layer 170 is an emission layer, the emission layer may include the third compound, and may additionally include a host and/or a dopant.

The host may include a compound represented by Formula 301:

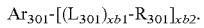   Formula 301

In Formula 301,

Ar$_{301}$ may be selected from:

a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group; and a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$), wherein $Q_{301}$ to $Q_{303}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group, description of L$_{301}$ may be the same as the description provided in connection with L$_{21}$, R$_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, xb1 may be selected from 0, 1, 2, and 3, and xb2 may be selected from 1, 2, 3, and 4.

In some embodiments, in Formula 301,

L$_{301}$ may be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, $R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, but embodiments are not limited thereto.

In some embodiments, the host may include a compound represented by Formula 301A:

Formula 301A

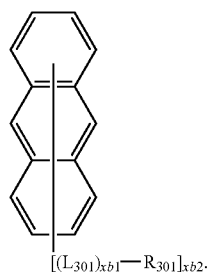

$[(L_{301})_{xb1}$—$R_{301}]_{xb2}$.

The descriptions of substituents in Formula 301A may be understood by referring to the descriptions thereof provided herein.

The compound represented by Formula 301 may include at least one compound selected from Compounds H1 to H42, but embodiments of the present disclosure are not limited thereto:

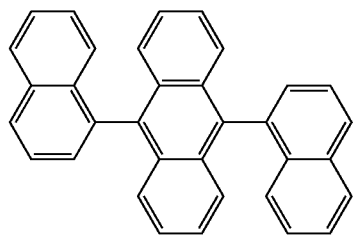
H1

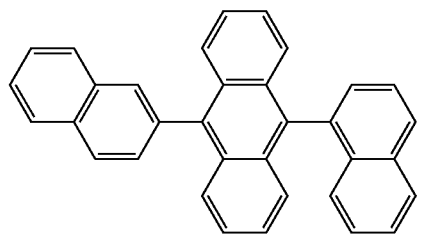
H2

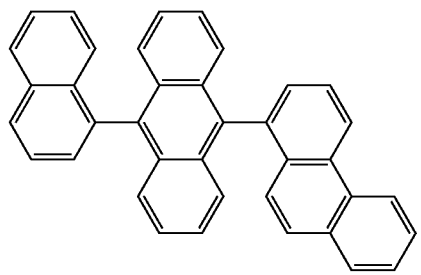
H3

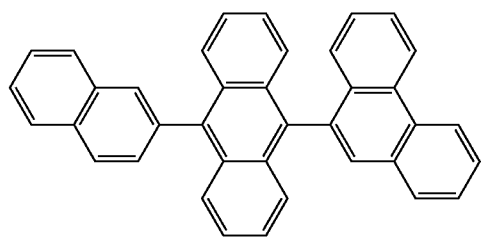
H4

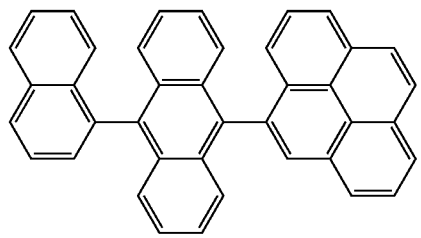
H5

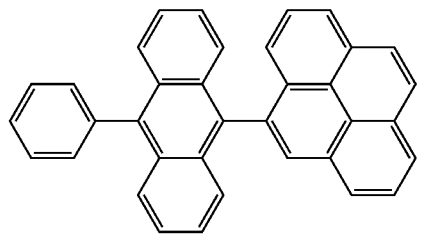
H6

-continued
H7
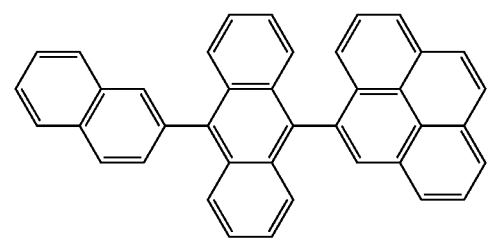
H8
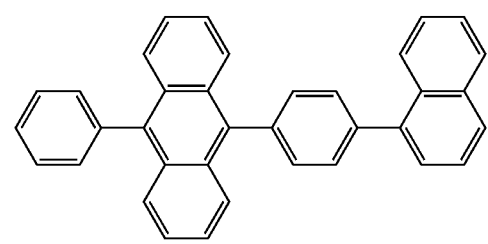
H9
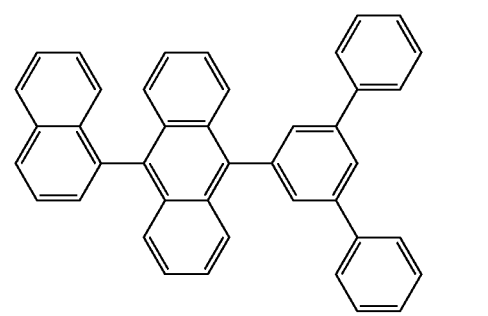
H10
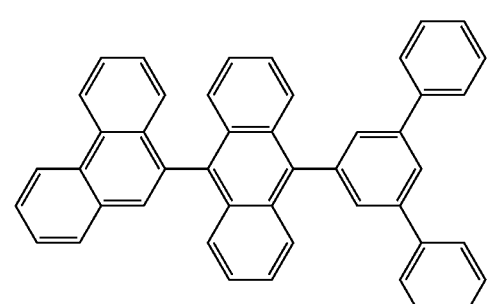
H11
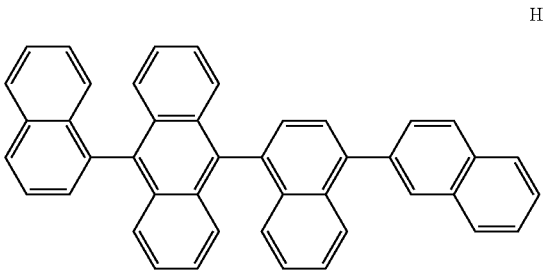
H12
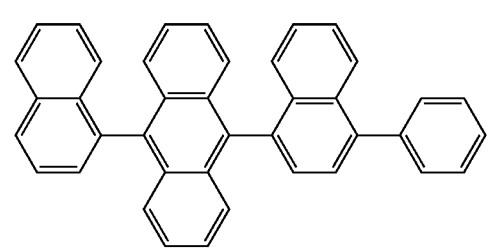
-continued
H13
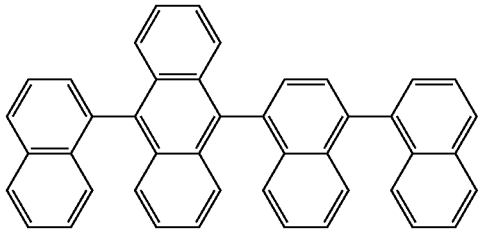
H14
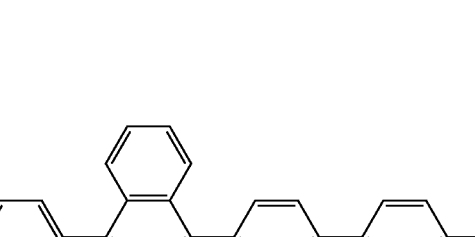
H15
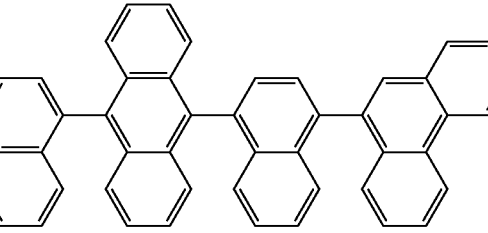
H16
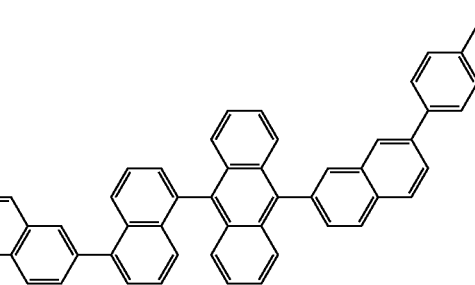
H17
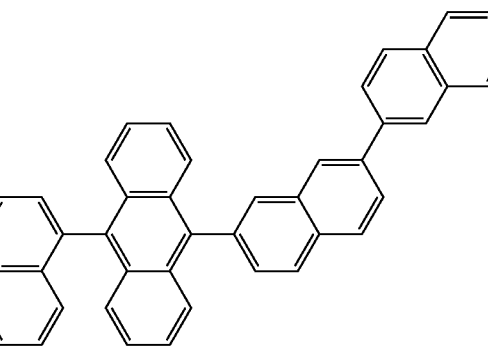

H18
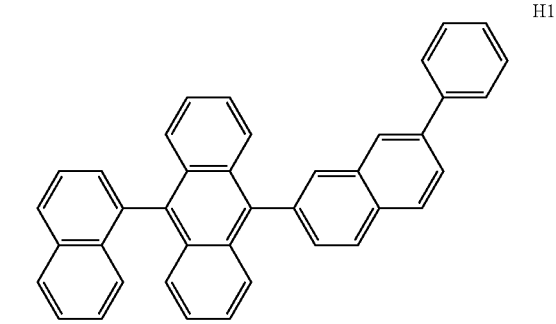
H19
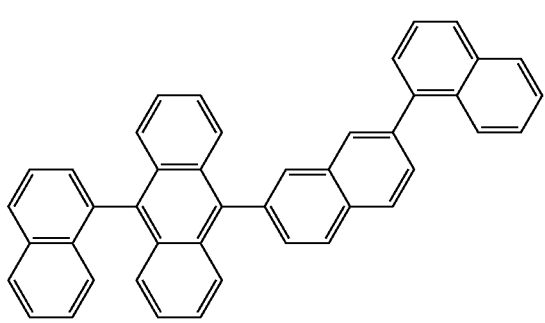
H20
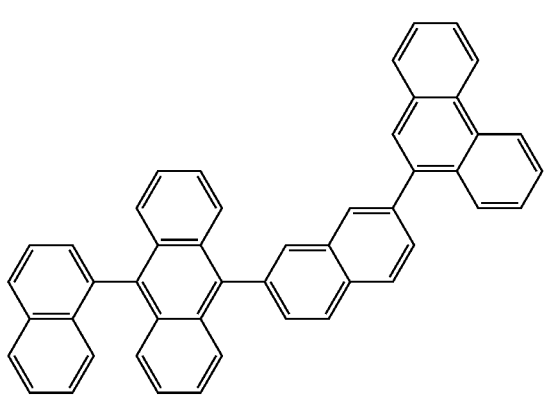
H21
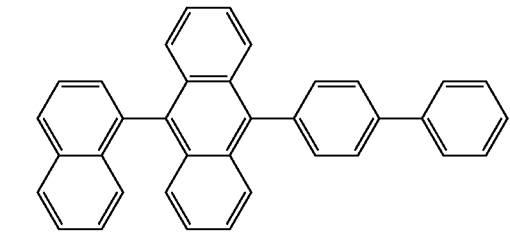
H22
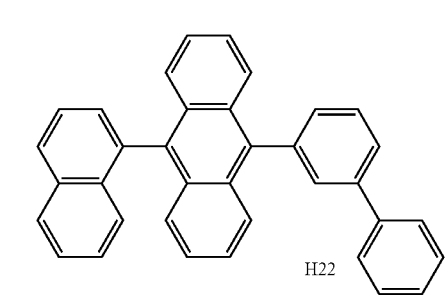
H23
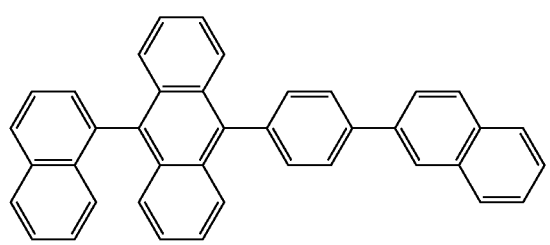
H24
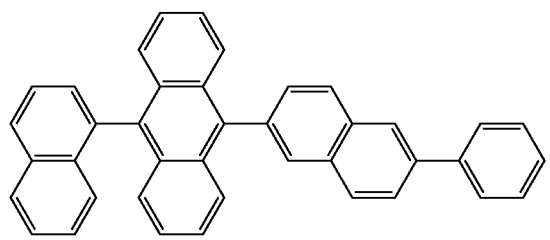
H25
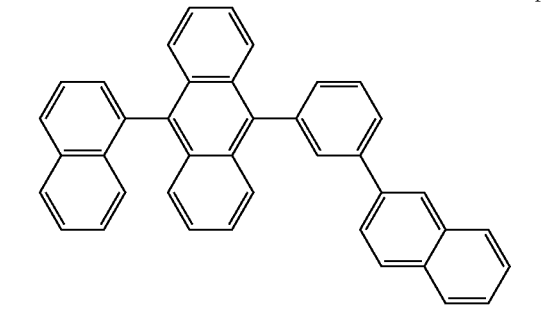
H26
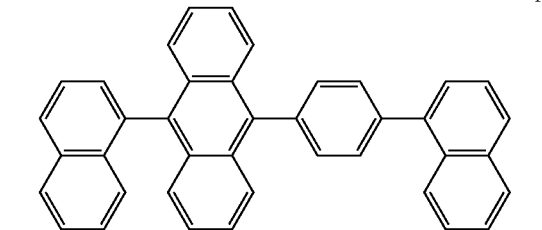
H27
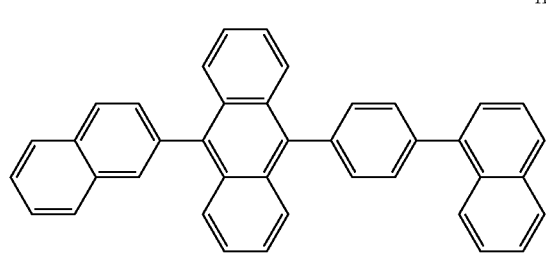
H28
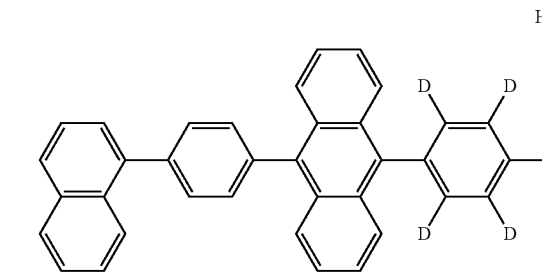

H29
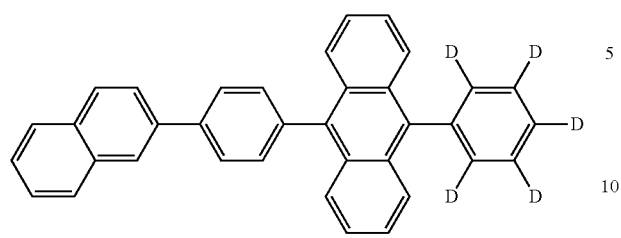
H30
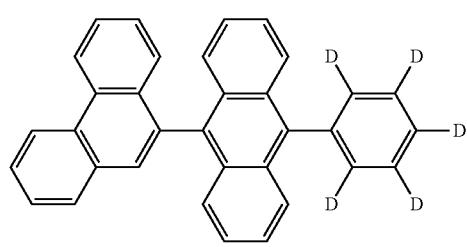
H31
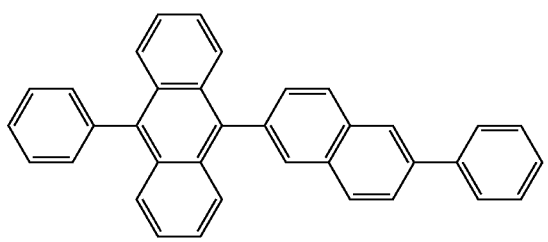
H32
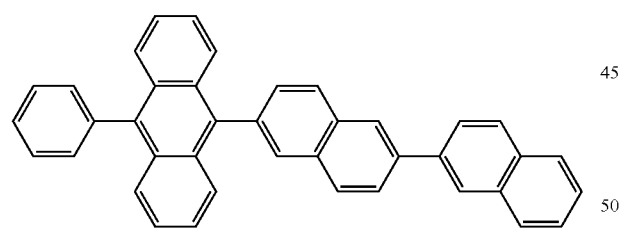
H33
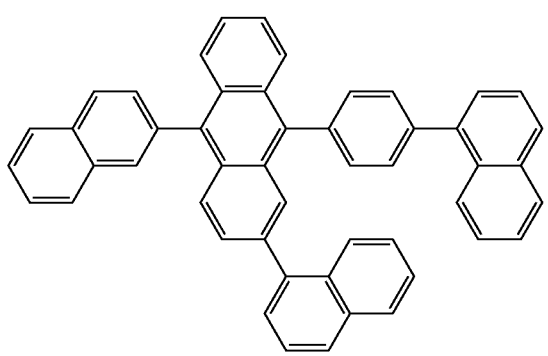
H34
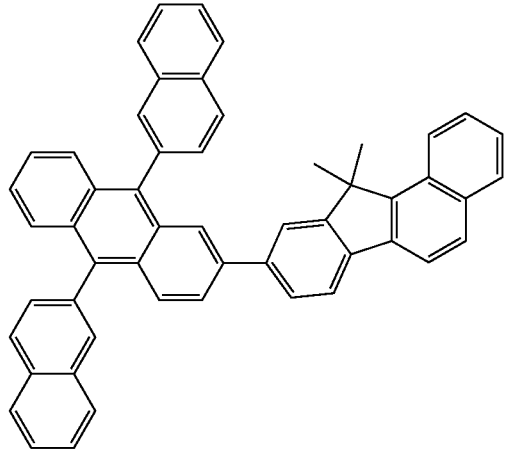
H35
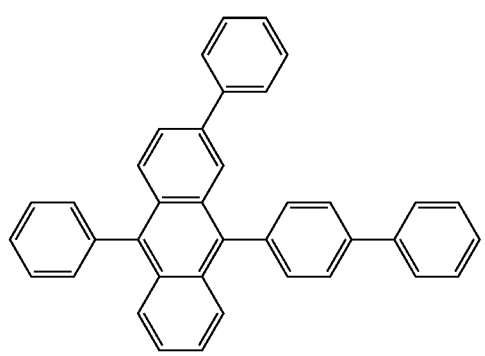
H36
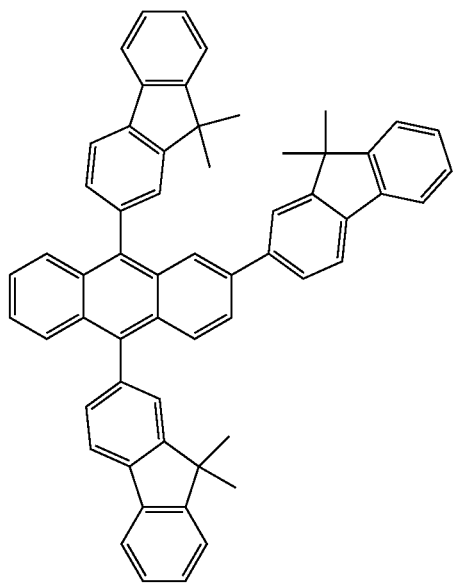

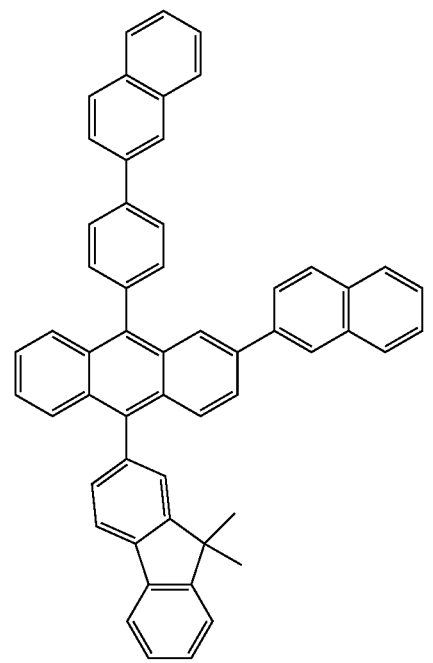
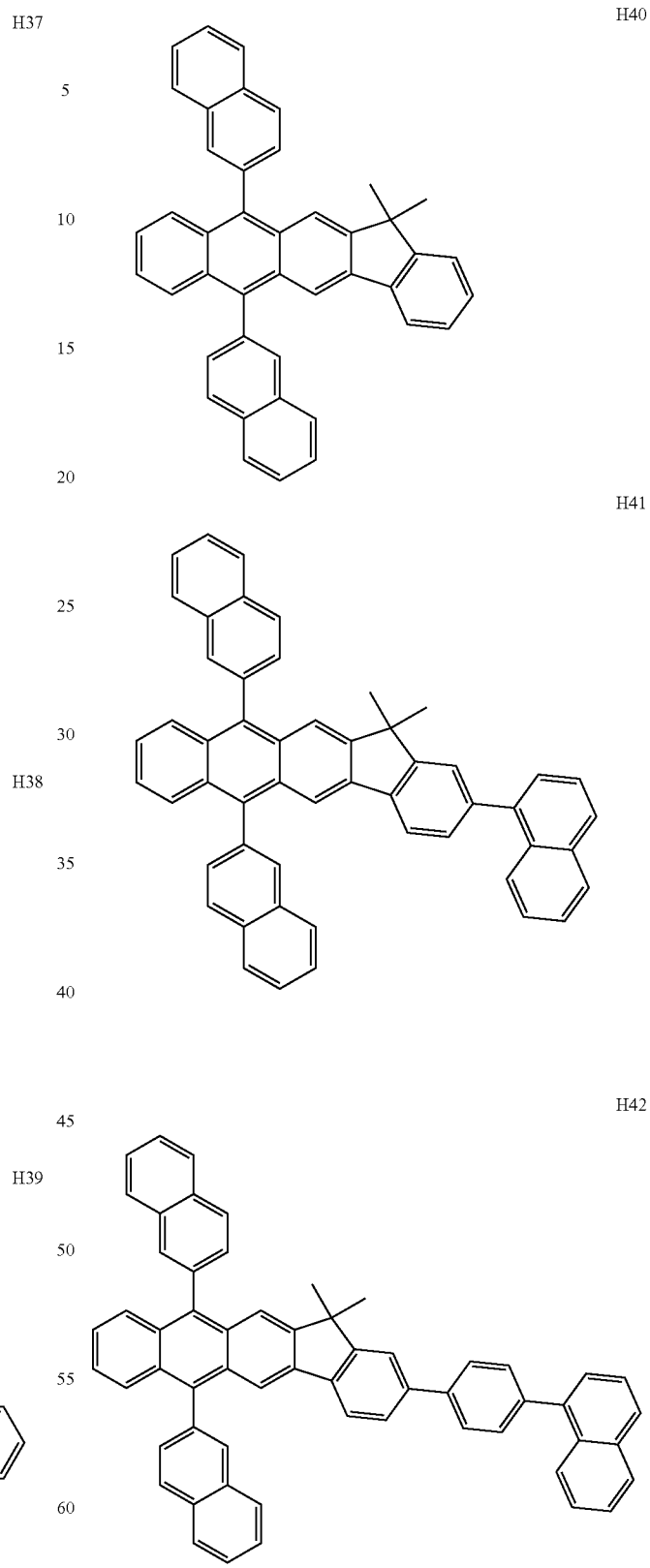
In some embodiments, the host may include at least one selected from Compounds H43 to H49, but embodiments are not limited thereto:

H43
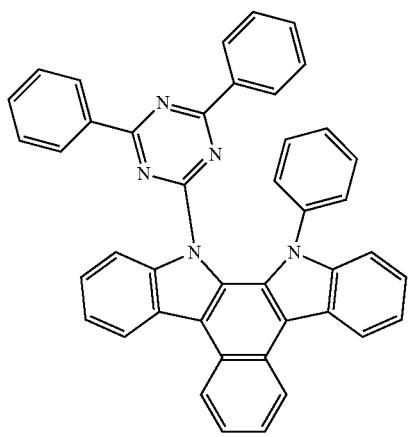
H44
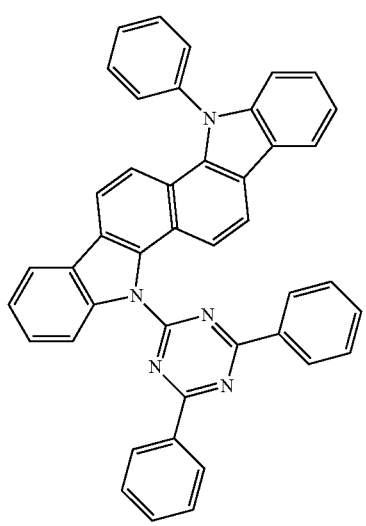
H45
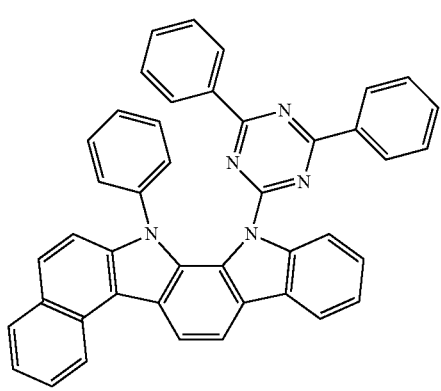
H46
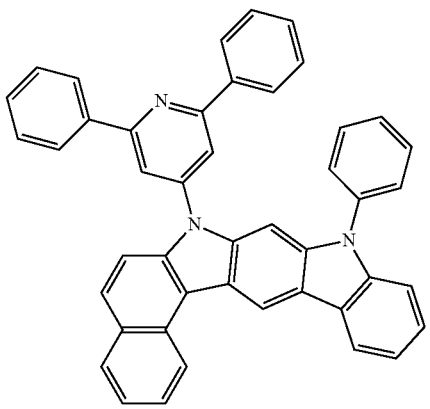
H47
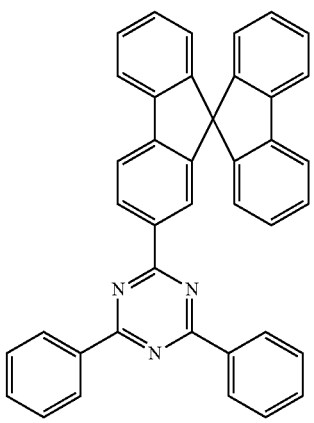
H48
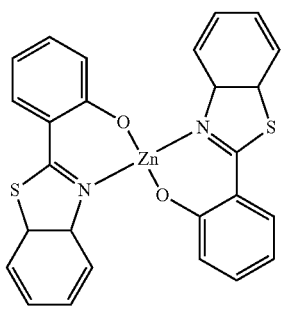
H49
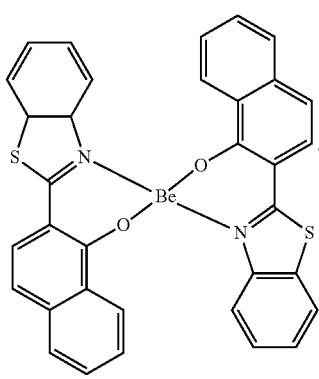
In some embodiments, the host may include at least one selected from compounds below, but embodiments are not limited thereto:

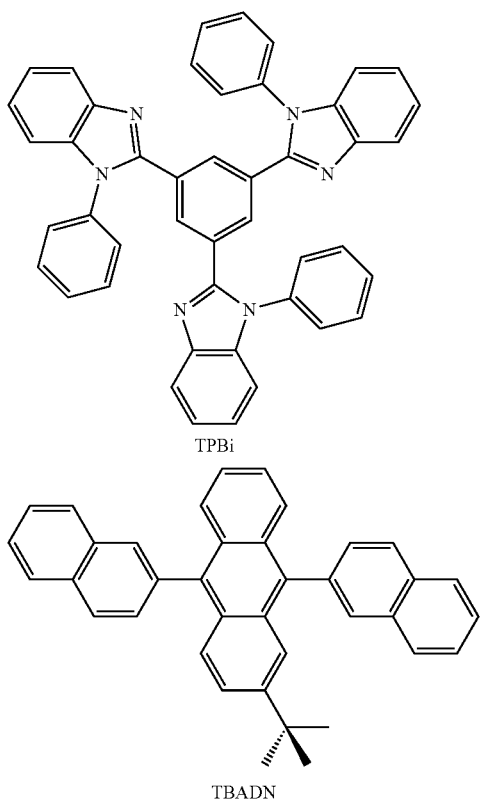

TPBi

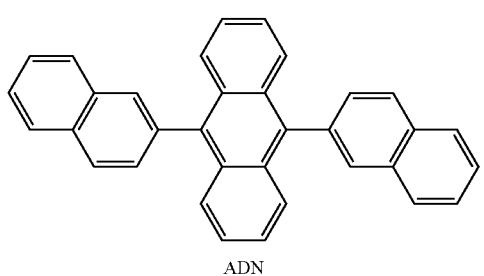

TBADN

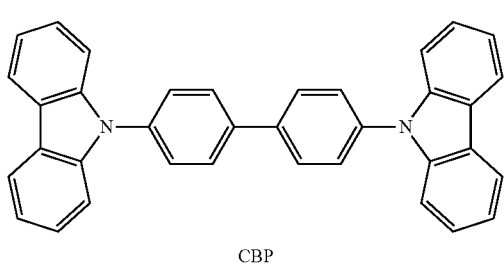

ADN

CBP

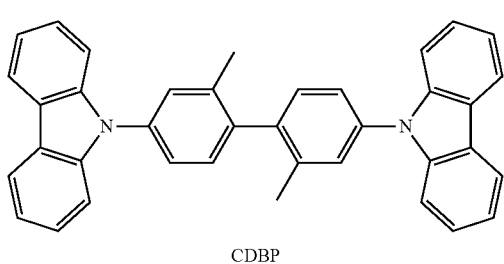

CDBP

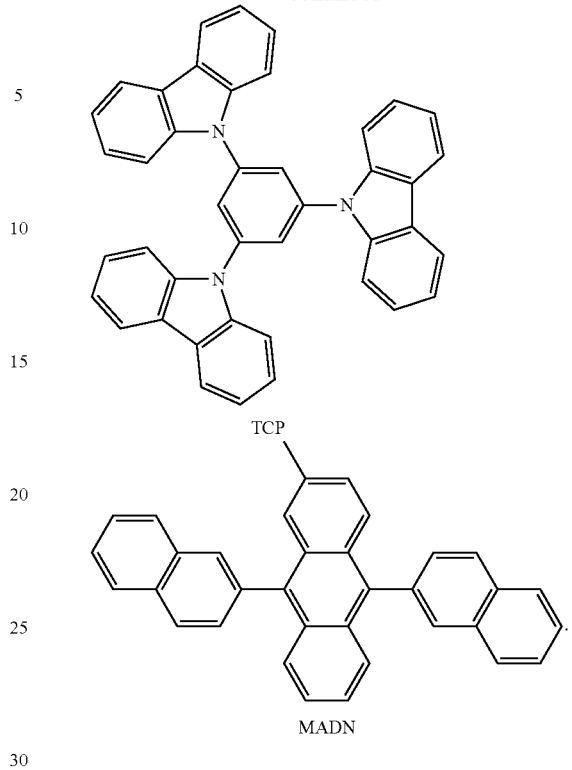

TCP

MADN

The dopant may be a phosphorescent dopant.

The phosphorescent dopant may include an organometallic complex represented by Formula 401:

Formula 401

$$\left[ \begin{array}{c} A_{401} \overset{X_{401}}{\underset{X_{402}}{\diagdown}} \\ X_{404} \overset{}{\diagup} \overset{}{\diagdown} M \\ A_{402} \overset{X_{403}}{\diagup} \end{array} \right]_{xc1} (L_{401})_{xc2}.$$

In Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently nitrogen or carbon;

$A_{401}$ and $A_{402}$ rings may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene, at least one substituent of the substituted benzene, substituted naphthalene, substituted fluorene, substituted spirofluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and substituted dibenzothiophene may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$), where $Q_{401}$ to $Q_{407}$, $Q_{411}$ to $Q_{417}$, and $Q_{421}$ to $Q_{427}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{401}$ may be an organic ligand;

xc1 may be selected from 1, 2, and 3; and xc2 may be selected from 0, 1, 2, and 3.

In Formula 401, $L_{401}$ may be any suitable monovalent, divalent, or trivalent organic ligand. For example, $L_{401}$ may be selected from a halogen ligand (e.g., Cl and/or F), a diketone ligand (e.g., acetylacetonate, 1,3-diphenyl-1,3-propanedionate, 2,2,6,6-tetramethyl-3,5-heptanedionate, and/or hexafluoroacetonate), a carboxylic acid ligand (e.g., picolinate, dimethyl-3-pyrazolecarboxylate, and/or benzoate), a carbon monoxide ligand, an isonitrile ligand, a cyano ligand, and a phosphorous ligand (e.g., phosphine and/or phosphite), but embodiments are not limited thereto.

When $A_{401}$ in Formula 401 includes a plurality of substituents, the plurality of substituents of $A_{401}$ may be bound to each other to form a saturated or unsaturated ring.

When $A_{402}$ in Formula 401 includes a plurality of substituents, the plurality of substituents of $A_{402}$ may be bound to each other to form a saturated or unsaturated ring.

When xc1 in Formula 401 is 2 or more, a plurality of ligands

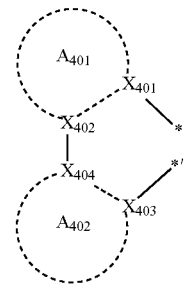

in Formula 401 may be identical to or different from each other. In Formula 401, when xc1 is 2 or more, $A_{401}$ and $A_{402}$ of one ligand may be each independently connected (e.g., coupled) to $A_{401}$ and $A_{402}$ of another adjacent ligand, respectively, either directly (e.g., via a bond such as a single bond) or via a linking group (e.g., a $C_1$-$C_5$ alkylene group, —N(R')— (where R' is a $C_1$-$C_{10}$ alkyl group or a $C_6$-$C_{20}$ aryl group), and/or —C(=O)—).

The phosphorescent dopant may include, for example, at least one selected from Compounds PD1 to PD21 and PD76, but embodiments are not limited thereto:

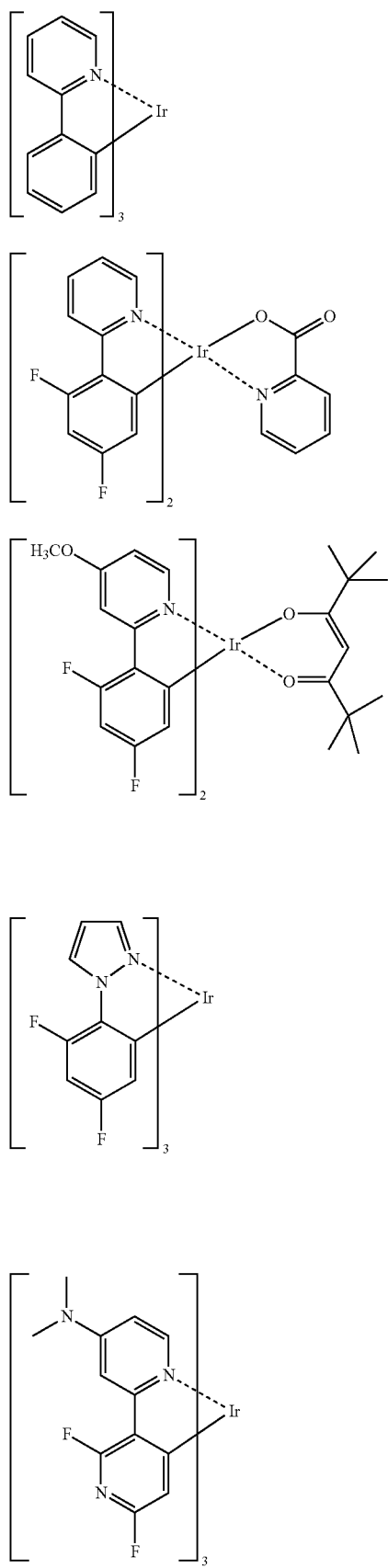
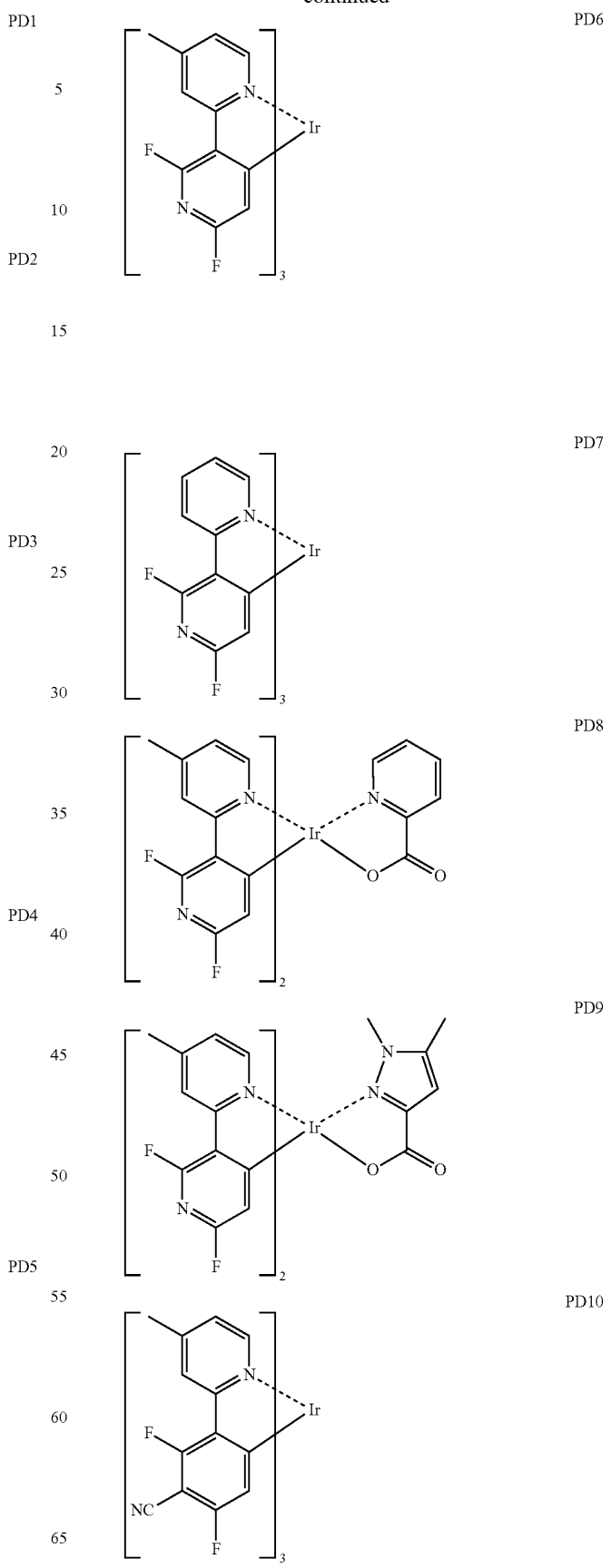

PD11 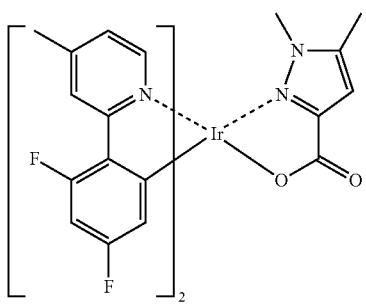
PD12 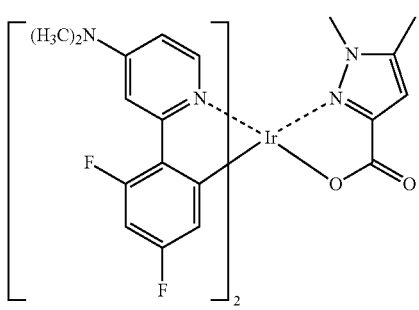
PD13 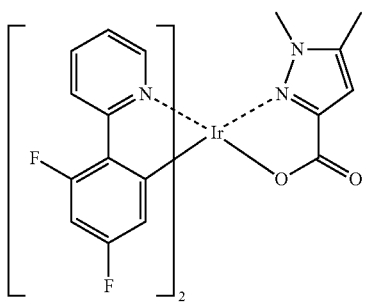
PD14 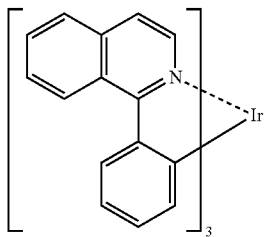
PD15 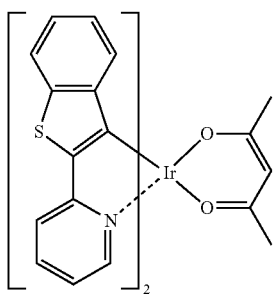
PD16 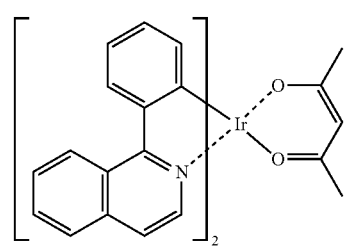
PD17 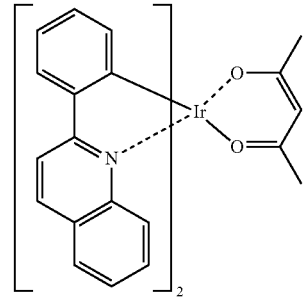
PD18 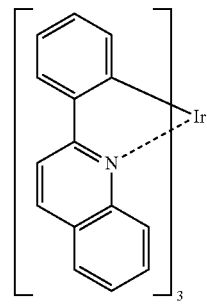
PD19 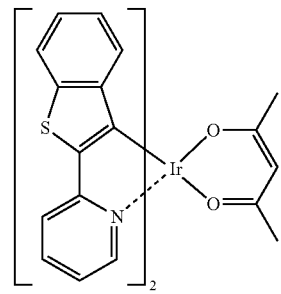
PD20 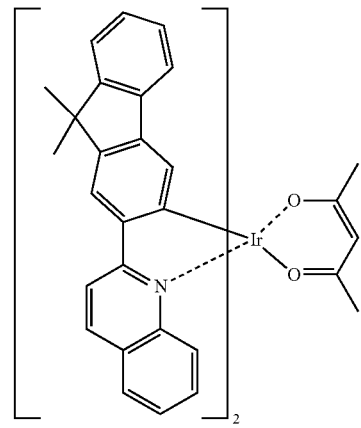

PD21

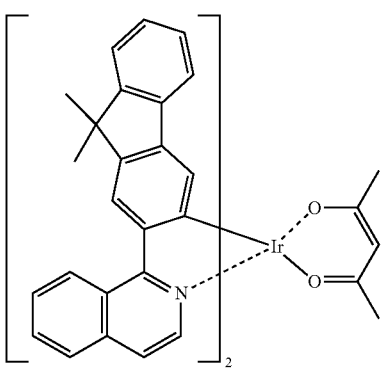

PD76

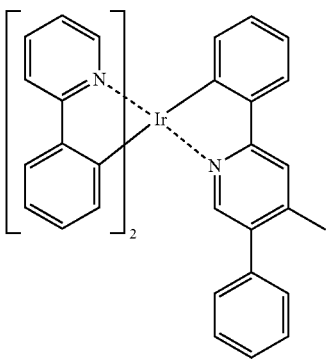

In some embodiments, the second layer 150 may be an emission layer. When the emission layer includes the second compound and the dopant, the amount of the dopant may be in a range of about 0.01 parts by weight to about 15 parts by weight, based on 100 parts by weight of the second compound, but embodiments are not limited thereto.

In some embodiments, the second layer 150 may be an emission layer. When the emission layer includes the second compound and the host, the amount of the second compound may be in a range of about 0.01 parts by weight to about 15 parts by weight, based on 100 parts by weight of the host, but embodiments are not limited thereto.

In some embodiments, the third layer 170 may be an emission layer. When the emission layer includes the third compound and the host, the amount of the third compound may be in a range of about 0.01 parts by weight to about 15 parts by weight, based on 100 parts by weight of the host, but embodiments are not limited thereto.

In some embodiments, the third layer 170 may be an emission layer. When the emission layer includes the third compound and the dopant, the amount of the dopant may be in a range of about 0.01 parts by weight to about 15 parts by weight, based on 100 parts by weight of the dopant, but embodiments are not limited thereto.

The thickness of the emission layer may be in a range of about 100 Å to about 1000 Å, for example, about 200 Å to about 600 Å. When the thickness of the emission layer is within any of these ranges, excellent (or suitable) light-emission characteristics may be achieved without a substantial increase in driving voltage.

Although not illustrated in the drawing, when the second layer 150 is an emission layer, an electron injection layer that facilitates electron injection may be additionally disposed (e.g., positioned) between the second electrode 190 and the third layer 170. The electron injection layer may be formed on the third layer 170 by using one or more suitable methods, such as vacuum deposition, spin coating, casting, an LB method, ink-jet printing, laser printing, and/or LITI. When the electron injection layer is formed by vacuum deposition and/or spin coating, the vacuum deposition and coating conditions for the electron injection layer may be similar to the vacuum deposition and coating conditions for the hole injection layer.

The electron injection layer may include at least one selected from LiF, NaCl, CsF, $Li_2O$, BaO, and LiQ.

The thickness of the electron injection layer may be in a range of about 1 Å to about 100 Å, for example, about 3 Å to about 90 Å. When the thickness of the electron injection layer is within any of these ranges, excellent (or suitable) electron injection characteristics may be obtained without a substantial increase in driving voltage.

In some embodiments, when the third layer 170 is an emission layer, at least one selected from an electron transport layer and an electron injection layer may be additionally disposed between the third layer 170 and the second electrode 190. The electron injection layer may be understood by referring to the description thereof provided herein.

The electron transport layer may include at least one selected from BCP, Bphen, $Alq_3$, BAlq, TAZ, and NTAZ:

BCP

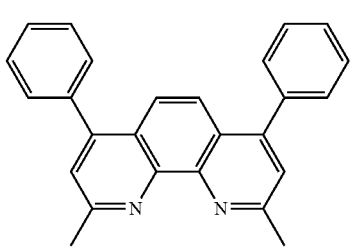

Bphen

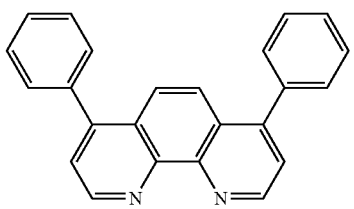

$Alq_3$

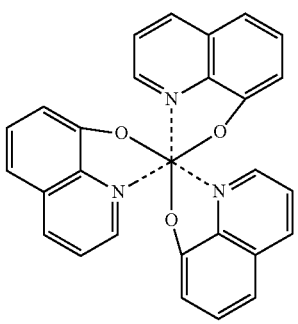

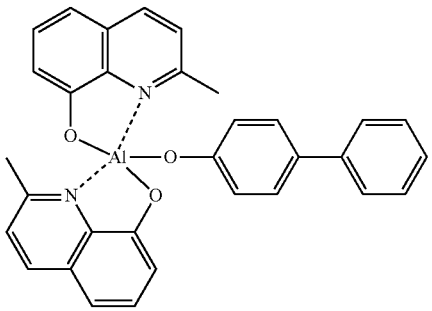
BAlq

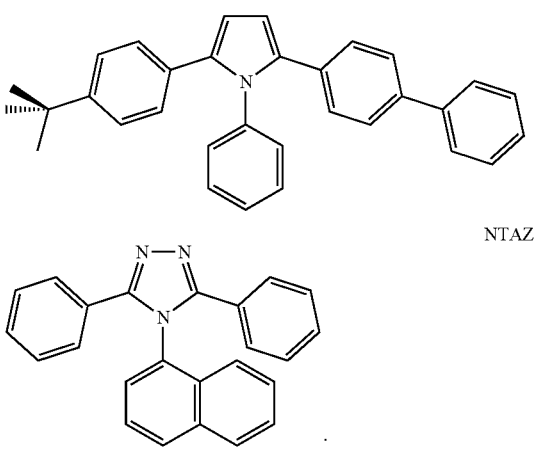
TAZ

NTAZ

The thickness of the electron transport layer may be in a range of about 100 Å to about 1000 Å, for example, about 150 Å to about 500 Å. When the thickness of the electron transport layer is within any of these ranges, excellent (or suitable) electron transport characteristics may be obtained without a substantial increase in driving voltage.

In some embodiments, the second layer 150 may be an emission layer, and the third layer 170 may be an electron transport layer.

The electron transport layer may further include a metal-containing material, in addition to the materials described above.

The metal-containing material may include a Li complex. The Li complex may include, for example, Compound ET-D1 (8-hydroxyquinolinolato-lithium or LiQ) and/or Compound ET-D2:

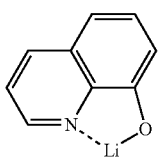
ET-D1

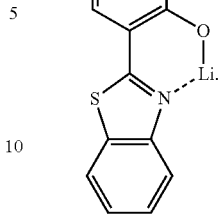
ET-D2

The second electrode 190 may be a cathode, that is an electron injection electrode. In this regard, a material for forming the second electrode 190 may be a material having a low work function, for example, a metal, an alloy, an electrically conductive compound, or a mixture thereof. Non-limiting examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO and/or IZO. The second electrode 190 may be a semi-transmissive electrode or a transmissive electrode.

A $C_1$-$C_{60}$ alkyl group used herein may refer to a linear or branched aliphatic hydrocarbon monovalent group having 1 to 60 carbon atoms. Non-limiting examples thereof include a methyl group, an ethyl group, a propyl group, an iso-butyl group, a sec-butyl group, a tert-butyl group, a pentyl group, an iso-amyl group, and a hexyl group. A $C_1$-$C_{60}$ alkylene group used herein may refer to a divalent group having the same structure as the $C_1$-$C_{60}$ alkyl group.

A $C_1$-$C_{60}$ alkoxy group used herein may refer to a monovalent group represented by —$OA_{101}$ (where $A_{101}$ is the $C_1$-$C_{60}$ alkyl group). Non-limiting examples thereof may include a methoxy group, an ethoxy group, and an iso-propoxy group.

A $C_2$-$C_{60}$ alkenyl group used herein may refer to a hydrocarbon group having at least one carbon-carbon double bond at one or more positions along the hydrocarbon chain of the $C_2$-$C_{60}$ alkyl group (e.g., in the middle or at either terminal end of the $C_2$-$C_{60}$ alkyl group). Non-limiting examples thereof may include an ethenyl group, a propenyl group, and a butenyl group. A $C_2$-$C_{60}$ alkenylene group used herein may refer to a divalent group having the same structure as the $C_2$-$C_{60}$ alkenyl group.

A $C_2$-$C_{60}$ alkynyl group used herein may refer to a hydrocarbon group having at least one carbon-carbon triple bond at one or more positions along the hydrocarbon chain of the $C_2$-$C_{60}$ alkyl group (e.g., in the middle or at either terminal end of the $C_2$-$C_{60}$ alkyl group). Non-limiting examples thereof may include an ethynyl group and a propynyl group. A $C_2$-$C_{60}$ alkynylene group used herein may refer to a divalent group having the same structure as the $C_2$-$C_{60}$ alkynyl group.

A $C_3$-$C_{10}$ cycloalkyl group used herein may refer to a monovalent monocyclic saturated hydrocarbon group including 3 to 10 carbon atoms. Non-limiting examples thereof may include a cyclopropyl group, a cyclobutyl group, a cyclopentyl group, a cyclohexyl group, and a cycloheptyl group. A $C_3$-$C_{10}$ cycloalkylene group used herein may refer to a divalent group having the same structure as the $C_3$-$C_{10}$ cycloalkyl group.

A $C_1$-$C_{10}$ heterocycloalkyl group used herein may refer to a monovalent monocyclic group including at least one heteroatom selected from N, O, P, and S as a ring-forming atom, and 1 to 10 carbon atoms. Non-limiting examples thereof may include a tetrahydrofuranyl group and a tetrahydrothienyl group. A $C_1$-$C_{10}$ heterocycloalkylene group used herein may refer to a divalent group having the same structure as the $C_1$-$C_{10}$ heterocycloalkyl group.

A $C_3$-$C_{10}$ cycloalkenyl group as used herein may refer to a monovalent monocyclic group that has 3 to 10 carbon atoms and at least one double bond in its ring, and is not aromatic. Non-limiting examples thereof may include a cyclopentenyl group, a cyclohexenyl group, and a cycloheptenyl group. A $C_3$-$C_{10}$ cycloalkenylene group used herein may refer to a divalent group having the same structure as the $C_3$-$C_{10}$ cycloalkenyl group.

A $C_1$-$C_{10}$ heterocycloalkenyl group used herein may refer to a monovalent monocyclic group including at least one heteroatom selected from N, O, P, and S as a ring-forming atom, 1 to 10 carbon atoms, and at least one double bond in its ring. Non-limiting examples of the $C_1$-$C_{10}$ heterocycloalkenyl group may include a 2,3-dihydrofuranyl group and a 2,3-dihydrothienyl group. A $C_1$-$C_{10}$ heterocycloalkenylene group used herein may refer to a divalent group having the same structure as the $C_1$-$C_{10}$ heterocycloalkenyl group.

A $C_6$-$C_{60}$ aryl group used herein may refer to a monovalent group including a carbocyclic aromatic system having 6 to 60 carbon atoms. A $C_6$-$C_{60}$ arylene group used herein may refer to a divalent group including a carbocyclic aromatic system having 6 to 60 carbon atoms.

A $C_6$-$C_{60}$ non-condensed arylene group used herein may refer to a divalent group including a carbocyclic aromatic system having 6 to 60 carbon atoms, and not including two or more rings. A $C_6$-$C_{60}$ condensed polycyclic arylene group used herein may refer to a divalent group including a carbocyclic aromatic system having 6 to 60 carbon atoms, and including two or more rings.

Non-limiting examples of the $C_6$-$C_{60}$ aryl group may include a phenyl group, a naphthyl group, an anthracenyl group, a phenanthrenyl group, a pyrenyl group, and a chrysenyl group.

A non-limiting example of the $C_6$-$C_{60}$ non-condensed arylene group may include a phenylene group. Non-limiting examples of the $C_6$-$C_{60}$ condensed polycyclic arylene group may include a naphthylene group, an anthracenylene group, a phenanthrenylene group, a pyrenylene group, and a chrysenylene group.

When the $C_6$-$C_{60}$ aryl group and the $C_6$-$C_{60}$ arylene group each independently include a plurality of rings, the respective rings may be fused to each other.

A $C_1$-$C_{60}$ heteroaryl group used herein may refer to a monovalent group having a carbocyclic aromatic system including at least one heteroatom selected from N, O, P, and S as a ring-forming atom, and 1 to 60 carbon atoms. A $C_1$-$C_{60}$ heteroarylene group used herein may refer to a divalent group having a carbocyclic aromatic system including at least one heteroatom selected from N, O, P, and S as a ring-forming atom, and 1 to 60 carbon atoms.

A $C_1$-$C_{60}$ non-condensed heteroarylene group used herein may refer to a divalent group having a carbocyclic aromatic system including at least one heteroatom selected from N, O, P, and S as a ring-forming atom, and 1 to 60 carbon atoms, and not including two or more rings. A $C_1$-$C_{60}$ condensed polycyclic heteroarylene group used herein may refer to a divalent group having a carbocyclic aromatic system including at least one heteroatom selected from N, O, P, and S as a ring-forming atom, and 1 to 60 carbon atoms, and including two or more rings.

Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group.

Non-limiting examples of the $C_1$-$C_{60}$ non-condensed heteroarylene group may include a pyridinylene group, a pyrimidinylene group, a pyrazinylene group, a pyridazinylene group, and a triazinylene group. Non-limiting examples of the $C_1$-$C_{60}$ condensed polycyclic heteroarylene group may include a quinolinylene group, an isoquinolinylene group, a quinoxalinylene group, and a phthalazinylene group. When the $C_1$-$C_{60}$ heteroaryl group and the $C_1$-$C_{60}$ heteroarylene group each independently include a plurality of rings, the respective rings may be fused to each other.

A $C_6$-$C_{60}$ aryloxy group used herein may refer to a group represented by —$OA_{102}$ (where $A_{102}$ is the $C_6$-$C_{60}$ aryl group). A $C_6$-$C_{60}$ arylthio group used herein may refer to a group represented by —$SA_{103}$ (where $A_{103}$ is the $C_6$-$C_{60}$ aryl group).

A monovalent non-aromatic condensed polycyclic group used herein may refer to a monovalent group that has two or more rings condensed to each other, has only carbon atoms as ring-forming atoms (for example, the number of carbon atoms may be in a range of 8 to 60), and does not have overall aromaticity in the entire molecular structure. A non-limiting example of the monovalent non-aromatic condensed polycyclic group may include a fluorenyl group. A divalent non-aromatic condensed polycyclic group used herein may refer to a divalent group having the same structure as the monovalent non-aromatic condensed polycyclic group.

A monovalent non-aromatic condensed heteropolycyclic group used herein may refer to a monovalent group that has two or more rings condensed to each other, has at least one heteroatom selected from N, O, P, and S as a ring-forming atom, other than carbon atoms (for example, the number of carbon atoms may be in a range of 2 to 60), and does not have overall aromaticity in the entire molecular structure. Non-limiting example of the monovalent non-aromatic condensed heteropolycyclic group includes a carbazolyl group. A divalent non-aromatic condensed heteropolycyclic group used herein may refer to a divalent group having the same structure as the monovalent non-aromatic condensed heteropolycyclic group.

In the present specification, at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_6$-$C_{60}$ non-condensed arylene group, substituted $C_6$-$C_{60}$ condensed polycyclic arylene group, substituted $C_1$-$C_{60}$ heteroarylene group, substituted $C_1$-$C_{60}$ non-condensed heteroarylene group, substituted $C_1$-$C_{60}$ condensed polycyclic heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{13}$)($Q_{14}$)($Q_{15}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, and —Si($Q_{23}$)($Q_{24}$)($Q_{25}$); and —Si($Q_{33}$)($Q_{34}$)($Q_{35}$), wherein $Q_{13}$ to $Q_{15}$, $Q_{23}$ to $Q_{25}$, and $Q_{33}$ to $Q_{35}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In some embodiments, at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_6$-$C_{60}$ non-condensed arylene group, substituted $C_6$-$C_{60}$ condensed polycyclic arylene group, substituted $C_1$-$C_{60}$ heteroarylene group, substituted $C_1$-$C_{60}$ non-condensed heteroarylene group, substituted $C_1$-$C_{60}$ condensed polycyclic heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spirofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, a thiadiazolyl group, an imidazopyridinyl group, an imidazopyrimidinyl group, and —Si($Q_{13}$)($Q_{14}$)($Q_{15}$);

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, a thiadiazolyl group, an imidazopyridinyl group, and an imidazopyrimidinyl group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, a thiadiazolyl group, an imidazopyridinyl group, an imidazopyrimidinyl group, and —Si($Q_{23}$)($Q_{24}$)($Q_{25}$); and —Si($Q_{33}$)($Q_{34}$)($Q_{35}$), wherein $Q_{13}$ to $Q_{15}$, $Q_{23}$ to $Q_{25}$, and $Q_{33}$ to $Q_{35}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, a thiadiazolyl group, an imidazopyridinyl group, and an imidazopyrimidinyl group.

"Ph" used herein may refer to a phenyl group, "Me" may refer to a methyl group, "Et" may refer to an ethyl group, and "ter-Bu" or "But" may refer to a tert-butyl group.

"A biphenyl group" may refer to a monovalent group in which two benzene rings are bound (e.g., coupled) to each other via a single bond. "A terphenyl group" may refer to a monovalent group in which three benzene rings are bound (e.g., coupled) via single bonds.

Hereinafter an organic light-emitting device according to an embodiment will be described in detail with reference to Examples and Synthesis Examples below. The expression "'B' was used instead of 'A'" used in describing Synthesis Examples below means that the number of molar equivalents of 'B' used was identical to the number of molar equivalents of 'A'".

EXAMPLES

Synthesis Examples

Synthesis Example 1: Synthesis of Compound 1-3

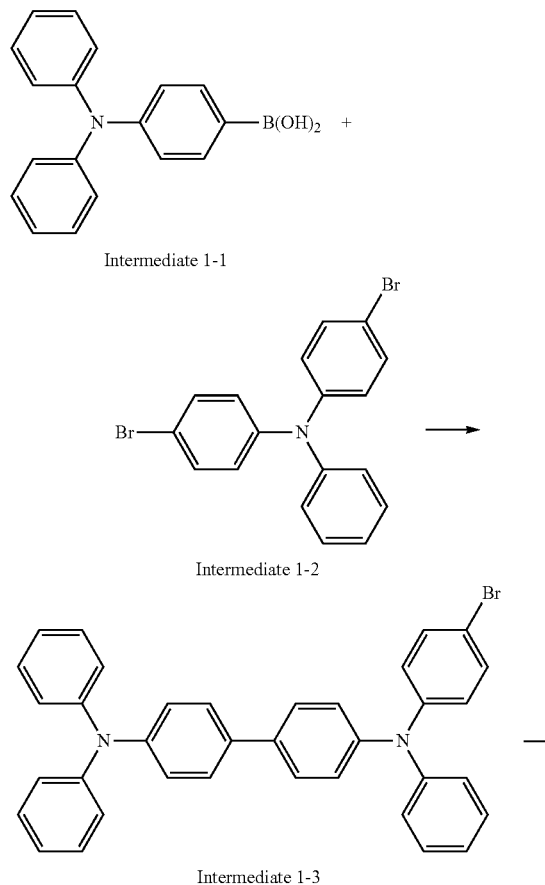

Intermediate 1-1

Intermediate 1-2

Intermediate 1-3

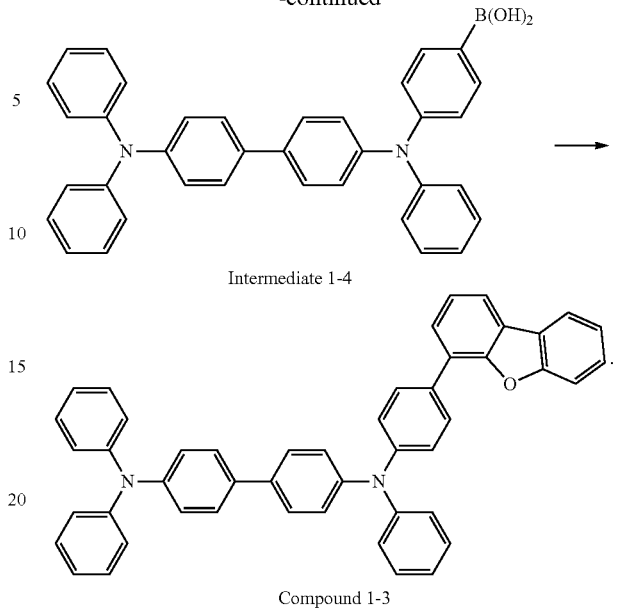

Intermediate 1-4

Compound 1-3

Synthesis of Intermediate 1-3

0.04 mol of Intermediate 1-1, 0.04 mol of Intermediate 1-2, 2 mmol of tetrakis(triphenylphosphine)palladium, 20 ml of 2M $K_2CO_3$ aqueous solution, 20 ml of ethanol, and 50 ml of toluene were mixed together, and then, the mixed solution was stirred for 4 hours while being heated at a temperature of about 120° C. After completion of the reaction, an extraction process was performed thereon using ethyl acetate and distilled water. An organic layer collected therefrom was dried using anhydrous magnesium sulfate, and then, filtered. The filtrate was concentrated under reduced pressure, and the resulting product was purified by column chromatography, thereby completing the preparation of Intermediate 1-3.

Synthesis of Intermediate 1-4

0.03 mol of Intermediate 1-3 was dissolved in 100 ml of TFT, and then, the mixed solution was cooled down to a temperature of −78° C. 0.07 mol of 2.5M n-butyl lithium was added thereto, and after one hour, 0.07 mol of isopropyl borate was added to the reaction solution. The resulting reaction solution was then stirred under reflux for 17 hours. After completion of the reaction, an extraction process was performed thereon using ethyl acetate and distilled water. An organic layer collected therefrom was dried using anhydrous magnesium sulfate, and then, filtered. The filtrate was concentrated under reduced pressure, thereby completing the preparation of Intermediate 1-4.

Synthesis of Compound 1-3

0.02 mol of Intermediate 1-4, 0.03 mol of 4-bromodibenzo[b,d]furan, 1 mmol of $Pd(PPh_3)_4$, 0.04 mol of $K_2CO_3$ aqueous solution, 100 ml of toluene, 25 ml of EtOH, and 25 ml of $H_2O$ were mixed together, and then, the mixed solution was stirred under reflux for 13 hours. After completion of the reaction, an extraction process was performed thereon using dichloromethane and distilled water. An organic layer collected therefrom was dried using anhydrous magnesium sulfate, and then, filtered. The filtrate was concentrated under reduced pressure, and the resulting product was purified by column chromatography, thereby completing the preparation of Compound 1-3.

$T_1$ (triplet energy of Compound 1-3)=2.2 eV

Synthesis Example 2: Synthesis of Compound 2-8

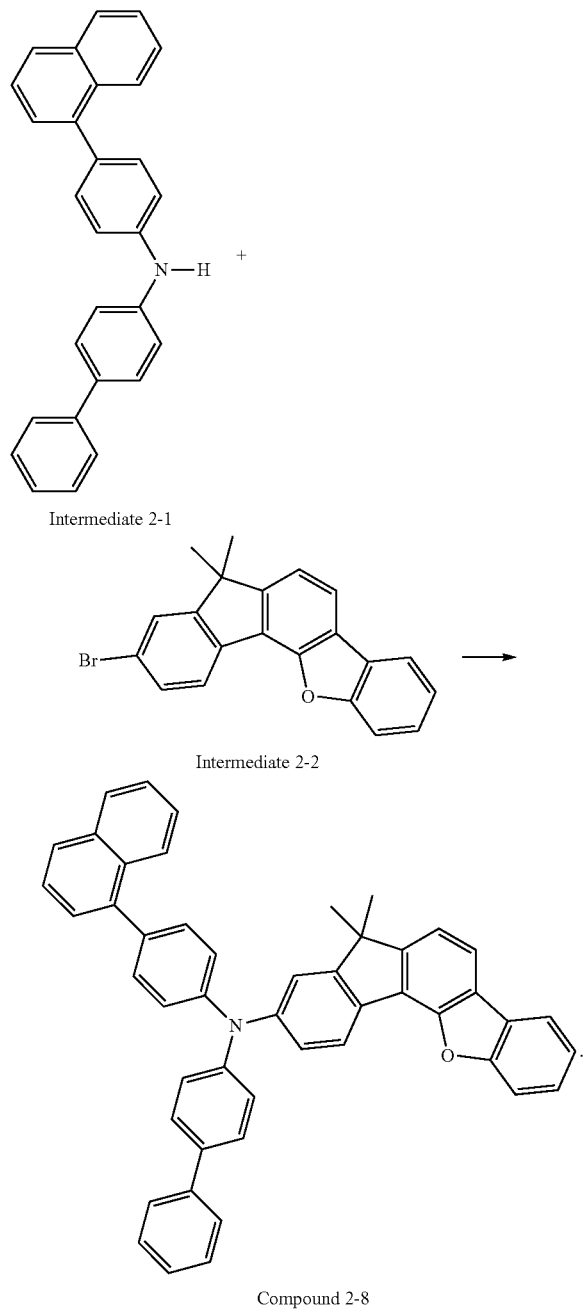 [SMILES: c1ccc(-c2ccc(Nc3ccc(-c4cccc5ccccc45)cc3)cc2)cc1 ; CC1(C)c2cc(Br)ccc2-c2c1ccc1c2oc2ccccc21 ; CC1(C)c2cc(N(c3ccc(-c4ccccc4)cc3)c3ccc(-c4cccc5ccccc45)cc3)ccc2-c2c1ccc1c2oc2ccccc21]

Intermediate 2-1

Intermediate 2-2

Compound 2-8

Synthesis of Compound 2-8

0.02 mol of Intermediate 2-1 and 0.02 mol of Intermediate 2-2, 0.06 mol of sodium t-butoxide, and 1 mmol of tri-tert-butylphosphine were dissolved in 100 ml of toluene, and then, 1 mmol of Pd(dba)$_2$ was added thereto. Then, the mixed solution was stirred under reflux for 12 hours in a nitrogen atmosphere. After completion of the reaction, an extraction process was performed thereon using toluene and distilled water. An organic layer collected therefrom was dried using anhydrous magnesium sulfate, and then filtered. The filtrate was concentrated under reduced pressure. The resulting product was purified by column chromatography using normal hexane/dichloromethane (at a volume ratio of 2:1), thereby completing the preparation of Compound 2-8.

$T_1$ (triplet energy of Compound 2-8)=2.6 eV

Synthesis Example 3: Compound 3-1

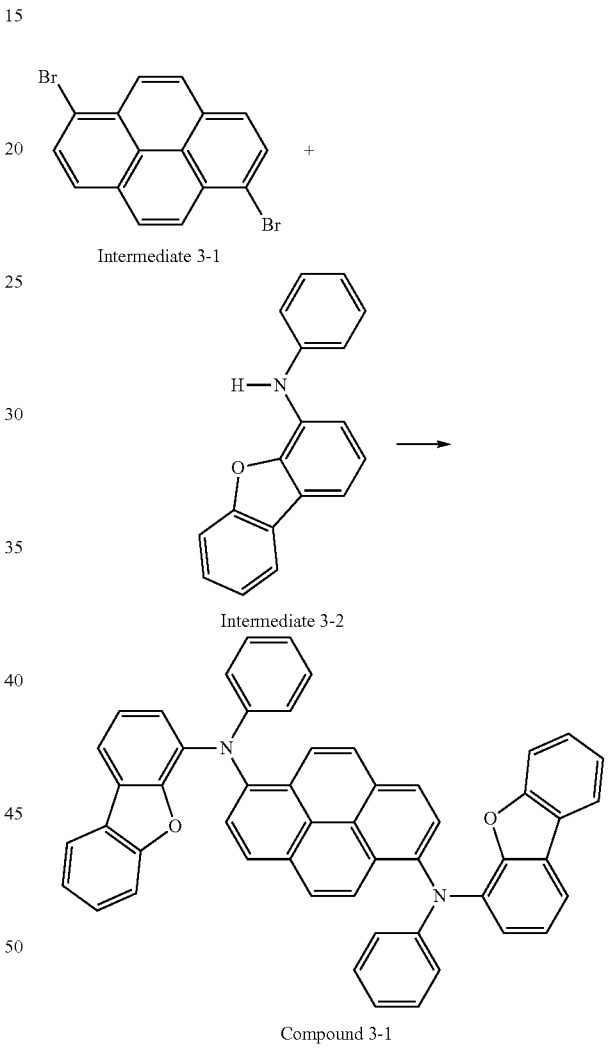

Intermediate 3-1

Intermediate 3-2

Compound 3-1

Synthesis of Compound 3-1

0.05 mol of Intermediate 3-1, 0.02 mol of Intermediate 3-2, 0.8 mol of sodium t-butoxide, and 1 mmol of tri-tert-butylphosphine were dissolved in 100 ml of toluene, and 2 mmol of Pd(dba)$_2$ was added thereto. Then, the mixed solution was stirred under reflux for 12 hours in a nitrogen atmosphere. After completion of the reaction, an extraction process was performed thereon using toluene and distilled water. An organic layer collected therefrom was dried using anhydrous magnesium sulfate, and then, filtered. The resulting product was purified by column chromatography, thereby completing the preparation of Compound 3-1.

T₁ (triplet energy of Compound 3-1)=2.0 eV

Synthesis Example 4: Synthesis of Compound 4-5

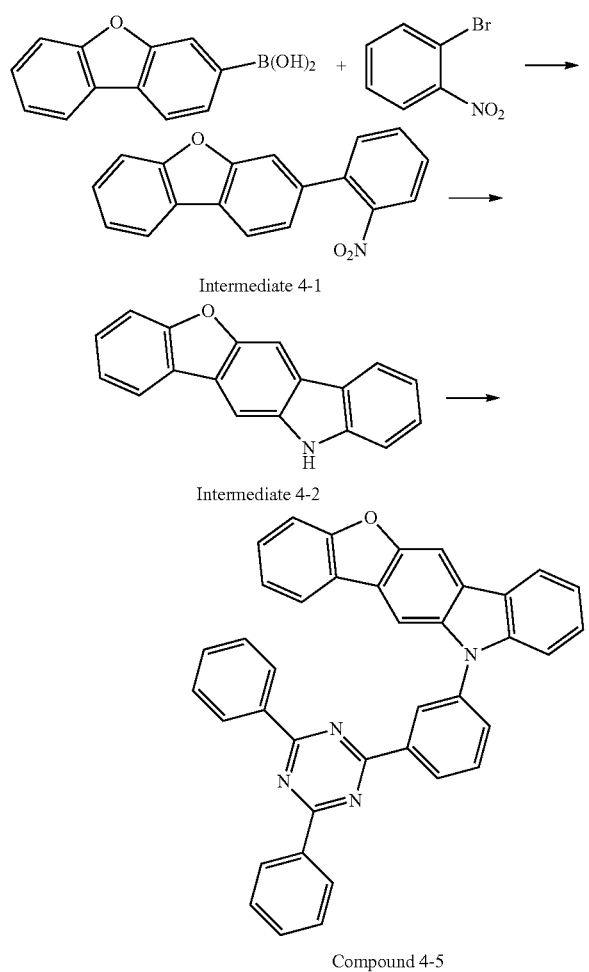

Compound 4-5

Synthesis of Intermediate 4-1

0.02 mol of 1-bromo-2-nitrobenzene, 0.022 mol of dibenzo[b,d]furan-3-ylboronic acid, 1 mmol of tetrakis(triphenylphosphine)palladium, 30 ml of 2M K₂CO₃ aqueous solution, 30 ml of ethanol, and 60 ml of toluene were mixed together, and then, the mixed solution was stirred for 4 hours while being heated at a temperature of 120° C. After completion of the reaction, an extraction process was performed thereon using ethyl acetate and distilled water. An organic layer collected therefrom was dried using anhydrous magnesium sulfate, and then, filtered. The filtrate was concentrated under reduced pressure, and the resulting product was purified by column chromatography, thereby completing the preparation of Intermediate 4-1.

Synthesis of Intermediate 4-2

0.02 mol Intermediate 4-1, 60 ml of triethylphosphite, and 30 ml of 1,2-dichlorobenzene were mixed together, and then, the mixed solution was stirred for 12 hours while being heated at a temperature of 150° C. After completion of the reaction, a distillation apparatus was used thereon to remove unreacted triethylphosphite and unreacted 1,2-dichlorobenzene, and an extraction process was performed thereon using ethyl acetate and distilled water. An organic layer collected therefrom was dried using anhydrous magnesium sulfate, and then, filtered. The filtrate was concentrated under reduced pressure, and the resulting product was purified by column chromatography, thereby completing the preparation of Intermediate 4-2.

Synthesis of Compound 4-5

4 mmol of NaH solution was dissolved in dimethylformamide, and then, the mixed solution was stirred. After 3 mmol of Intermediate 4-2 was dissolved in separate dimethylformamide, the resulting solution was added to the NaH to be stirred. The mixed solution was stirred for 1 hour, and then, mixed with a solution in which 3.5 mmol of 2-(3-bromophenyl)-4,6-diphenyl-1,3,5-triazine was dissolved and stirred for 1 hour in DMF. Then, the reaction solution was stirred for 24 hours at room temperature. After completion of the reaction, the resulting solid product was filtered, washed using ethyl acetate, and then, purified by column chromatography, thereby completing the preparation of Compound 4-5.

T₁ (triplet energy of Compound 4-5)=2.5 eV

Synthesis Example 5: Synthesis of Compound 5-3

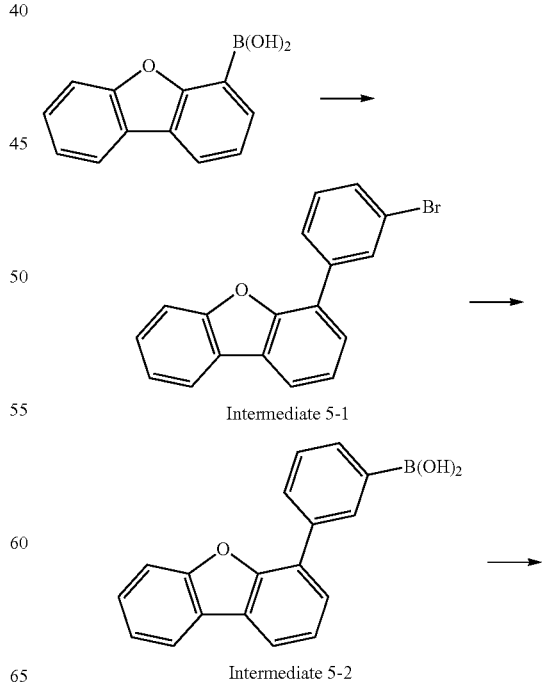

-continued

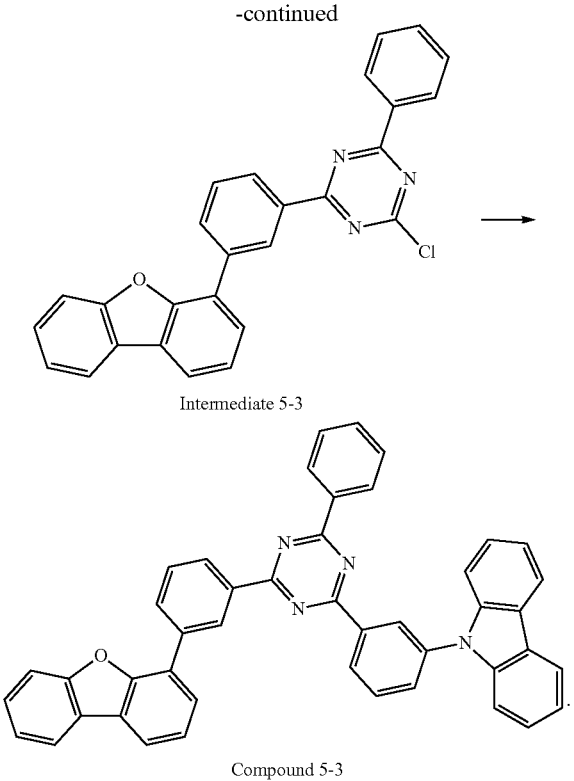

Intermediate 5-3

Compound 5-3

Synthesis of Intermediate 5-1

0.04 mol of dibenzofuran-4-ylboronic acid, 0.05 mol of 1-bromo-3-iodobenzene, 2 mmol of Pd(PPh$_3$)$_4$, 0.08 mol K$_2$CO$_3$ aqueous solution, 100 ml of toluene, 25 ml of EtOH, and 25 ml of H$_2$O were mixed together in a 250 ml round-bottomed flask, and then, the mixed solution was stirred under reflux for 4 hours. After completion of the reaction, an extraction process was performed thereon using dichloromethane and distilled water. An organic layer collected therefrom was dried using anhydrous magnesium sulfate, and then filtered. The resulting product was purified by column chromatography, thereby completing the preparation of Intermediate 5-1.

Synthesis of Intermediate 5-2

0.03 mol of Intermediate 5-1 was added to a 500 ml round-bottomed flask, and then, 100 ml of THF was added thereto. The mixed solution was cooled down to a temperature −78° C. 0.05 mol of 2.5M n-butyl lithium was added to the resulting solution, and after one hour, 0.05 mol of isopropyl borate was added thereto. The reaction solution was then stirred under reflux for 17 hours. After completion of the reaction, an extraction process was performed thereon using ethyl acetate and distilled water. An organic layer collected therefrom was dried using anhydrous magnesium sulfate, and then, filtered. The filtrate was concentrated under reduced pressure, thereby completing the preparation of Intermediate 5-2.

Synthesis of Intermediate 5-3

0.02 mol of Intermediate 5-2, 0.03 mol of 1-phenyl-3,5-dichloropyridine, 1 mmol of Pd(PPh$_3$)$_4$, 0.04 mol of K$_2$CO$_3$ aqueous solution, 100 mol of toluene, 25 ml of EtOH, and 25 ml of H$_2$O were mixed together in a 1 L round-bottomed flask, and then, the mixed solution was stirred under reflux for 13 hours. After completion of the reaction, an extraction process was performed thereon using dichloromethane and distilled water. An organic layer collected therefrom was dried using anhydrous magnesium sulfate, and then, filtered. The resulting product was purified by column chromatography, thereby completing the preparation of Intermediate 5-3.

Synthesis of Compound 5-3

0.01 mol of Intermediate 5-3, 0.012 mol of (3-(9-carbazole-9-yl)phenyl)boronic acid, 0.015 mol of NaH, and 150 ml of dimethylformamide were mixed together, and then, the mixed solution was stirred for 5 hours at room temperature. After completion of the reaction, an extraction process was performed thereon using ethyl acetate and distilled water. Then, an organic layer collected therefrom was dried using anhydrous magnesium sulfate, and filtered to remove the solvent. The resulting product was purified by column chromatography, thereby completing the preparation of Compound 5-3.

$T_1$ (triplet energy of Compound 5-3)=2.6 eV

Example 1-1

An indium tin oxide (ITO) glass substrate (available from Corning Inc.) with an ITO layer having a thickness of 15 Ω/cm$^2$ (1,200 Å) thereon was cut to a size of 50 mm×50 mm×0.5 mm, sonicated by using isopropyl alcohol and pure water each for 15 minutes, and cleaned by exposure to ultraviolet rays for 30 minutes and then ozone, and the resulting ITO glass anode was mounted on a vacuum deposition apparatus.

On the ITO glass anode, Compound 1-9 was vacuum-deposited to form a hole transport layer (e.g., first layer) having a thickness of about 1,200 Å. Compound 4-5 (as a host) and PD17 (as a dopant) were next co-deposited on the hole transport layer at a weight ratio of about 95:5 to form an emission layer (e.g., second layer) having a thickness of about 300 Å.

Compound 5-3 was then vacuum-deposited on the emission layer to form a first electron transport layer (e.g., third layer) having a thickness of about 100 Å, followed by vacuum deposition of BAlq on the first electron transport layer to form a second electron transport layer having a thickness of about 300 Å. LiF was vacuum-deposited on the second electron transport layer to form an electron injection layer having a thickness of about 10 Å.

Thereafter, Al was vacuum-deposited on the electron injection layer to form a cathode having a thickness of about 2,000 Å, thereby completing the manufacture of an organic light-emitting device.

Examples 1-2 to 1-5

Organic light-emitting devices were manufactured in the same (or substantially the same) manner as in Example 1-1, except that materials as shown in Table 1 were used.

Comparative Example 1-1

An organic light-emitting device was manufactured in the same (or substantially the same) manner as in Example 1-1, except that CBP was used instead of Compound 4-5 in forming the emission layer.

Comparative Example 1-2

An organic light-emitting device was manufactured in the same (or substantially the same) manner as in Example 1-1, except that a first electron transport layer was not formed, and BAlq was vacuum-deposited on the emission layer to form an electron transport layer having a thickness of about 400 Å.

Example 2-1

An ITO glass substrate (available from Corning Inc.) with an ITO layer having a thickness of 15 Ω/cm² (1,200 Å) thereon was cut to a size of 50 mm×50 mm×0.5 mm, sonicated by using isopropyl alcohol and pure water each for 15 minutes, and cleaned by exposure to ultraviolet rays for 30 minutes and then ozone, and the resulting ITO glass anode was mounted on a vacuum deposition apparatus.

On the ITO glass anode, Compound 1-9 was vacuum-deposited to form a first hole transport layer (e.g., first layer) having a thickness of about 1,100 Å. Compound 2-8 was next vacuum-deposited on the first hole transport layer to form a second hole transport layer (e.g., second layer) having a thickness of about 100 Å. Compound 4-5 (as a host) and PD17 (as a dopant) were next co-deposited on the second hole transport layer at a weight ratio of about 95:5 to form an emission layer (e.g., third layer) having a thickness of about 300 Å.

Thereafter, BAlq was vacuum-deposited on the emission layer to form an electron transport layer having a thickness of 400 Å. LiF was vacuum-deposited on the electron transport layer to form an electron injection layer having a thickness of about 10 Å, and Al was vacuum-deposited on the electron injection layer to form a cathode having a thickness of about 2,000 Å, thereby completing the manufacture of an organic light-emitting device.

Examples 2-2 to 2-5

Organic light-emitting devices were manufactured in the same (or substantially the same) manner as in Example 2-1, except that materials as shown in Table 2 were used.

Comparative Example 2-1

An organic light-emitting device was manufactured in the same (or substantially the same) manner as in Example 2-1, except that CBP was used instead of Compound 4-5 in forming the emission layer.

Comparative Example 2-2

An organic light-emitting device was manufactured in the same (or substantially the same) manner as in Example 2-1, except that compound HT3 was used instead of Compound 2-8 in forming the second hole transport layer.

Comparative Example 2-3

An organic light-emitting device was manufactured in the same (or substantially the same) manner as in Example 2-1, except that NPB was used instead of Compound 1-9 in forming the first hole transport layer, and Compound 2-4 was used instead of Compound 2-8 in forming the second hole transport layer.

Example 3-1

An ITO glass substrate (available from Corning Inc.) with an ITO layer having a thickness of 15 Ω/cm² (1,200 Å) thereon was cut to a size of 50 mm×50 mm×0.5 mm, sonicated by using isopropyl alcohol and pure water each for 15 minutes, and cleaned by exposure to ultraviolet rays for 30 minutes and then ozone, and the resulting ITO glass anode was mounted on a vacuum deposition apparatus.

On the ITO glass anode, Compound 1-9 was vacuum-deposited to form a hole transport layer (e.g., first layer) having a thickness of about 1,200 Å. Compound ADN (as a host) and Compound 3-1 (as a dopant) were next co-deposited on the hole transport layer at a weight ratio of about 95:5 to form an emission layer (e.g., second layer) having a thickness of about 300 Å.

Compound 5-3 was then vacuum-deposited on the emission layer to form a first electron transport layer (e.g., third layer) having a thickness of about 100 Å, followed by vacuum deposition of Alq₃ on the first electron transport layer to form a second electron transport layer having a thickness of about 300 Å. LiF was vacuum-deposited on the second electron transport layer to form an electron injection layer having a thickness of about 10 Å.

Thereafter, Al was vacuum-deposited on the electron injection layer to form a cathode having a thickness of about 2,000 Å, thereby completing the manufacture of an organic light-emitting device.

Examples 3-2 to 3-5

Organic light-emitting devices were manufactured in the same (or substantially the same) manner as in Example 3-1, except that materials as shown in Table 3 were used.

Comparative Example 3-1

An organic light-emitting device was manufactured in the same (or substantially the same) manner as in Example 3-1, except that compound FD1 (illustrated below) was used instead of Compound 3-1 in forming the emission layer.

Comparative Example 3-2

An organic light-emitting device was manufactured in the same (or substantially the same) manner as in Example 3-1, except that a first electron transport layer was not formed, and Alq₃ was vacuum-deposited on the emission layer to form an electron transport layer having a thickness of about 400 Å.

Example 4-1

An ITO glass substrate (available from Corning Inc.) with an ITO layer having a thickness of 15 Ω/cm² (1,200 Å) thereon was cut to a size of 50 mm×50 mm×0.5 mm, sonicated by using isopropyl alcohol and pure water each for 15 minutes, and cleaned by exposure to ultraviolet rays for 30 minutes and then ozone, and the resulting ITO glass anode was mounted on a vacuum deposition apparatus.

On the ITO glass anode, Compound 1-9 was vacuum-deposited to form a first hole transport layer (e.g., first layer) having a thickness of about 1,100 Å. Compound 2-8 was next vacuum-deposited on the first hole transport layer to form a second hole transport layer (e.g., second layer) having a thickness of about 100 Å. Compound ADN (as a host) and Compound 3-1 (as a dopant) were next co-deposited on the second hole transport layer at a weight ratio of about 95:5 to form an emission layer (e.g., third layer) having a thickness of about 300 Å.

Thereafter, Alq₃ was vacuum-deposited on the emission layer to form an electron transport layer having a thickness of 400 Å. LiF was vacuum-deposited on the electron transport layer to form an electron injection layer having a thickness of about 10 Å, and Al was vacuum-deposited on the electron injection layer to form a cathode having a thickness of about 2,000 Å, thereby completing the manufacture of an organic light-emitting device.

Examples 4-2 to 4-5

Organic light-emitting devices were manufactured in the same (or substantially the same) manner as in Example 4-1, except that materials as shown in Table 4 were used.

Comparative Example 4-1

An organic light-emitting device was manufactured in the same (or substantially the same) manner as in Example 4-1, except that compound FD1 was used instead of Compound 3-1 in forming the emission layer.

Comparative Example 4-2

An organic light-emitting device was manufactured in the same (or substantially the same) manner as in Example 4-1, except that compound HT3 was used instead of Compound 2-8 in forming the second hole transport layer.

Evaluation Example 1

The efficiency and T90 lifespan of organic light-emitting devices manufactured in Examples 1-1 to 1-5, 2-1 to 2-5, 3-1 to 3-5, and 4-1 to 4-5 and Comparative Examples 1-1, 1-2, 2-1 to 2-3, 3-1, 3-2, 4-1, and 4-2 were measured using a luminance meter PR650 (PhotoResearch, Inc.). The results are shown in Tables 1 to 4. The T90 lifespan indicates a time that it took for the luminance of the organic light-emitting device to decline to 90% of its initial luminance, under a luminance condition of 150 nits.

TABLE 1

| | Hole transport layer material | Host material | First electron transport layer material | Efficiency (cd/A) | Lifespan (T90, hr) |
|---|---|---|---|---|---|
| Example 1-1 | 1-9 | 4-5 | 5-3 | 22.1 | 126 |
| Example 1-2 | 1-9 | 4-10 | 5-4 | 22.8 | 139 |
| Example 1-3 | 1-3 | 4-5 | 5-3 | 21.7 | 151 |
| Example 1-4 | 1-3 | 4-11 | 5-8 | 20.9 | 140 |
| Example 1-5 | 1-7 | 4-11 | 5-6 | 22.5 | 163 |
| Comparative Example 1-1 | 1-9 | CBP | 5-3 | 16.2 | 58 |
| Comparative Example 1-2 | 1-9 | 4-5 | — | 12.7 | 65 |

TABLE 2

| | First hole transport layer material | Second hole transport layer material | Host material | Efficiency (cd/A) | Lifespan (T90, hr) |
|---|---|---|---|---|---|
| Example 2-1 | 1-9 | 2-8 | 4-5 | 19.8 | 137 |
| Example 2-2 | 1-9 | 2-5 | 5-2 | 21.5 | 148 |
| Example 2-3 | 1-3 | 2-8 | 4-5 | 20.9 | 120 |
| Example 2-4 | 1-3 | 2-5 | 5-9 | 19.5 | 131 |
| Example 2-5 | 1-7 | 2-4 | 5-1 | 20.3 | 145 |
| Comparative Example 2-1 | 1-9 | 2-8 | CBP | 16.4 | 73 |
| Comparative Example 2-2 | 1-9 | HT3 | 4-5 | 15.2 | 78 |
| Comparative Example 2-3 | NPB | 2-4 | 4-5 | 18.2 | 102 |

TABLE 3

| | Hole transport layer material | Dopant material | First electron transport layer material | Efficiency (cd/A) | Lifespan (T90, hr) |
|---|---|---|---|---|---|
| Example 3-1 | 1-9 | 3-1 | 5-3 | 5.8 | 55 |
| Example 3-2 | 1-9 | 3-2 | 5-4 | 5.4 | 61 |
| Example 3-3 | 1-3 | 3-1 | 5-3 | 5.3 | 51 |
| Example 3-4 | 1-3 | 3-2 | 5-8 | 5.7 | 70 |
| Example 3-5 | 1-7 | 3-1 | 5-6 | 5.9 | 82 |
| Comparative Example 3-1 | 1-9 | FD1 | 5-3 | 4.9 | 33 |
| Comparative Example 3-2 | 1-9 | 3-1 | — | 4.4 | 29 |

TABLE 4

| | First hole transport layer material | Second hole transport layer material | Dopant material | Efficiency (cd/A) | Lifespan (T90, hr) |
|---|---|---|---|---|---|
| Example 4-1 | 1-9 | 2-8 | 3-1 | 5.1 | 60 |
| Example 4-2 | 1-9 | 2-5 | 3-2 | 5.3 | 75 |
| Example 4-3 | 1-3 | 2-8 | 3-1 | 4.9 | 55 |
| Example 4-4 | 1-3 | 2-5 | 3-2 | 5.3 | 83 |
| Example 4-5 | 1-7 | 2-4 | 3-1 | 5.4 | 88 |
| Comparative Example 4-1 | 1-9 | 2-8 | FD1 | 4.3 | 21 |
| Comparative Example 4-2 | 1-9 | HT3 | 3-1 | 4.5 | 27 |

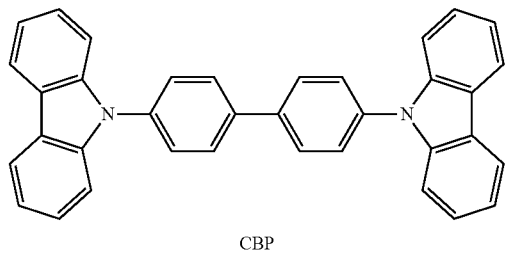

CBP

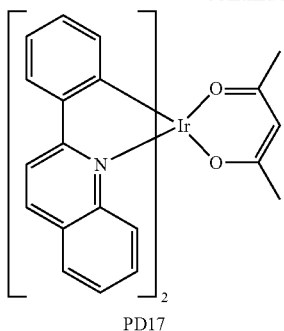
PD17

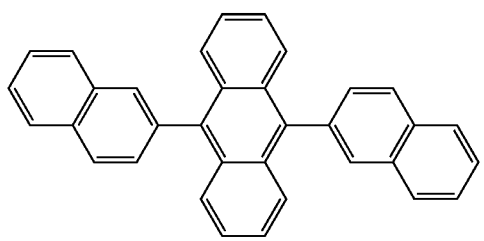
ADN

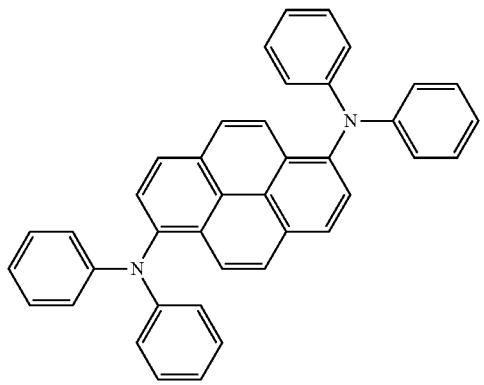
FD1

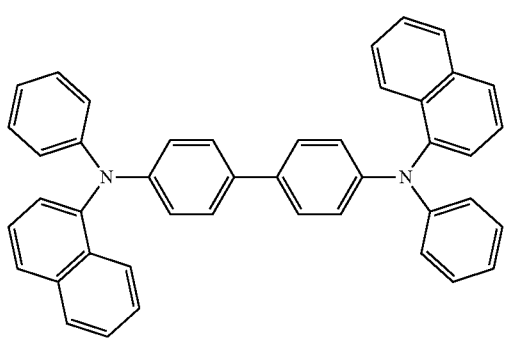
NPB

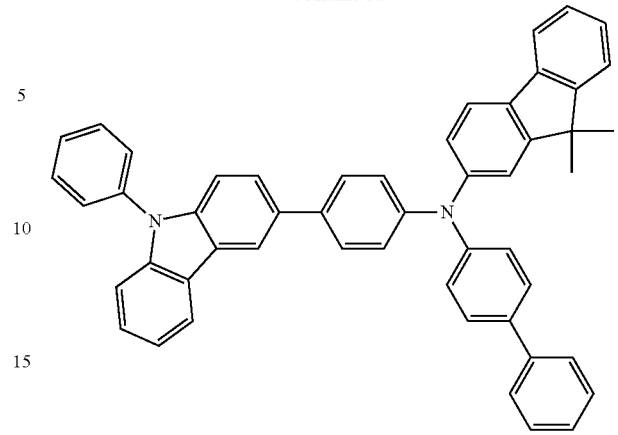
HT3

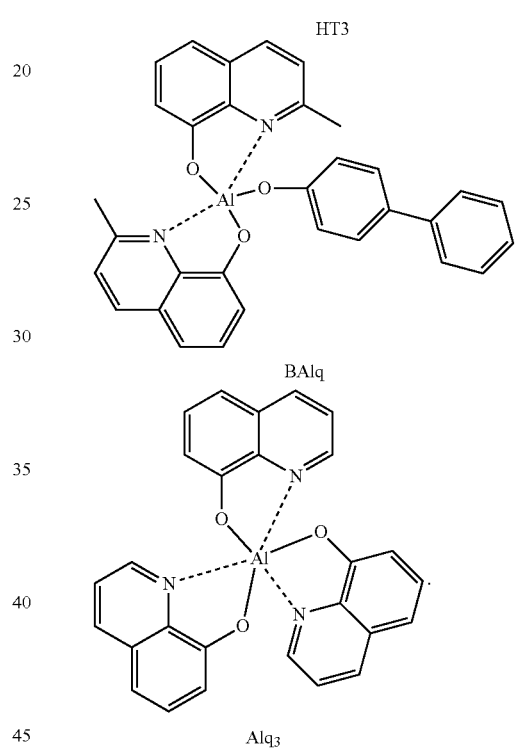
BAlq

Alq₃

Referring to Tables 1 to 4, it was found that the organic light-emitting devices manufactured in Examples 1-1 to 1-5, 2-1 to 2-5, 3-1 to 3-5, and 4-1 to 4-5 had excellent efficiency and lifespan, as compared to the organic light-emitting devices manufactured in Comparative Examples 1-1, 1-2, 2-1 to 2-3, 3-1, 3-2, 4-1, and 4-2.

As described above, an organic light-emitting device according to embodiments of the present disclosure may have low-driving voltage, improved efficiency, and long lifespan.

As used herein, the terms "use," "using," and "used" may be considered synonymous with the terms "utilize," "utilizing," and "utilized," respectively.

In addition, as used herein, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the drawing, it will be understood by those of ordinary skill in the art that various changes in form and details may be made therein without departing from the spirit and scope of the present disclosure as defined by the following claims and equivalents thereof.

2-3
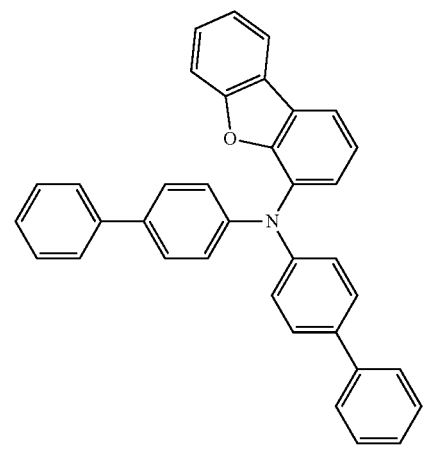
2-4
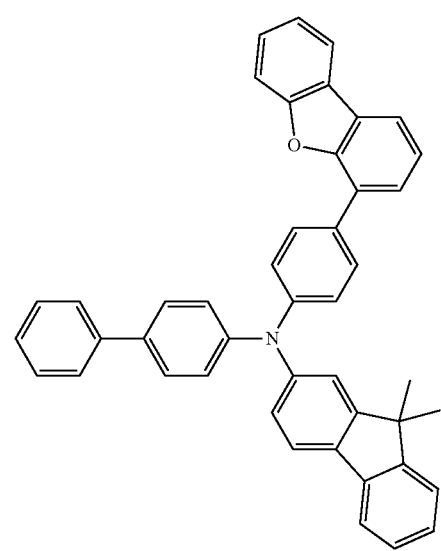
2-5
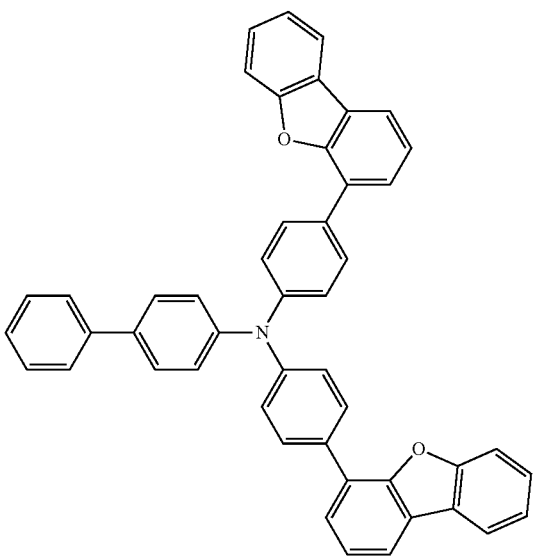
2-6
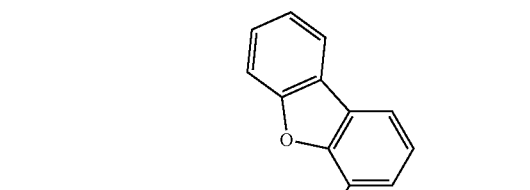
2-7
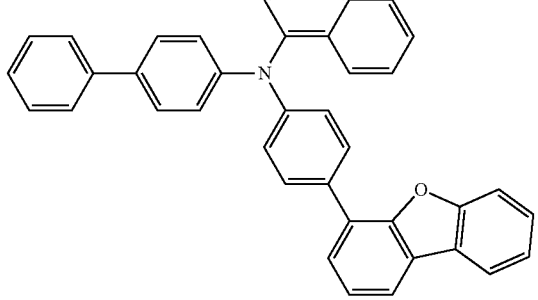
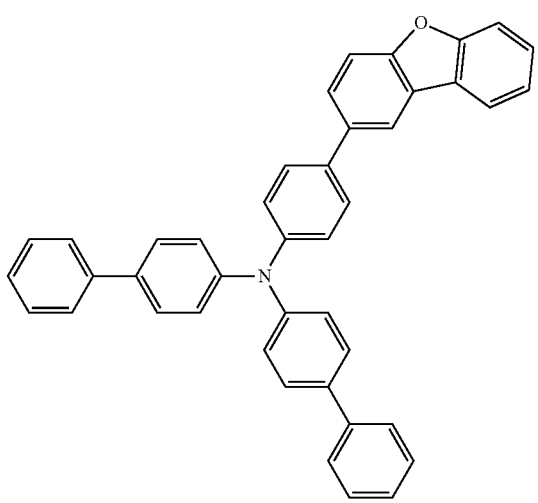
2-8
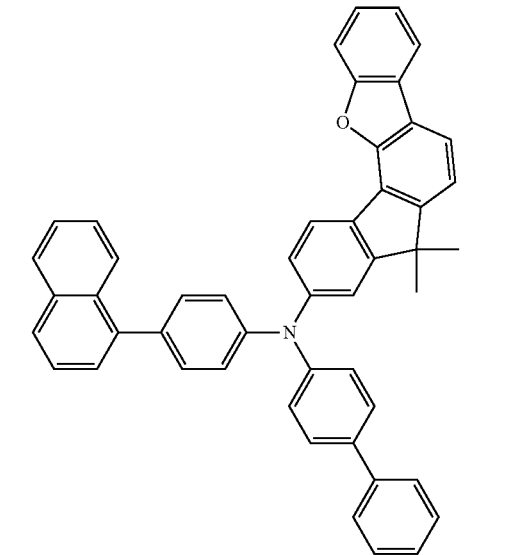

2-9
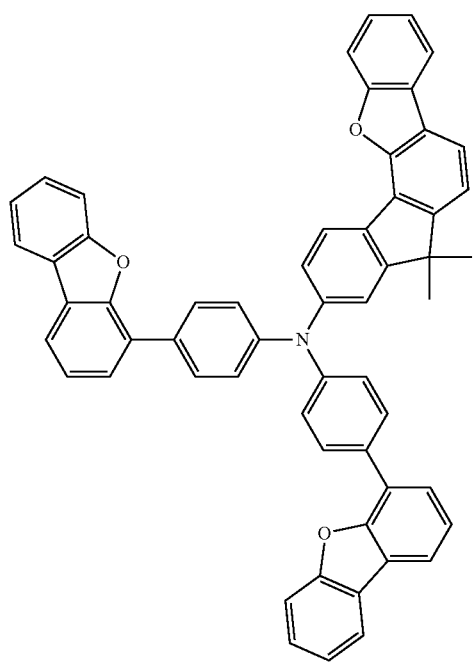
2-10
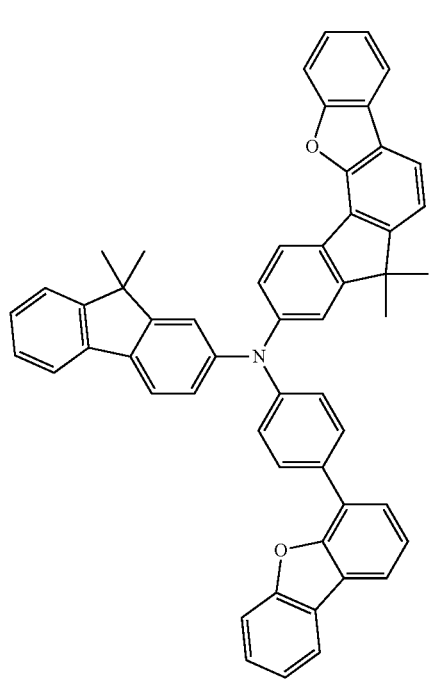
3-1
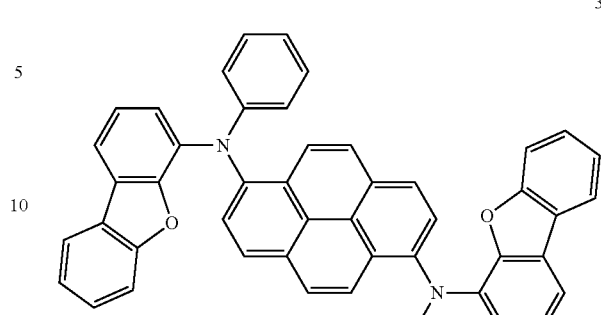
3-2
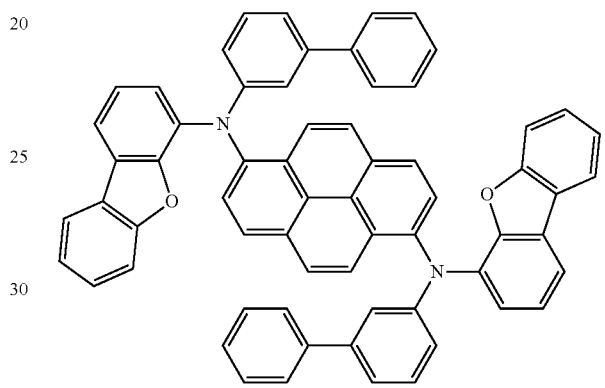
3-3
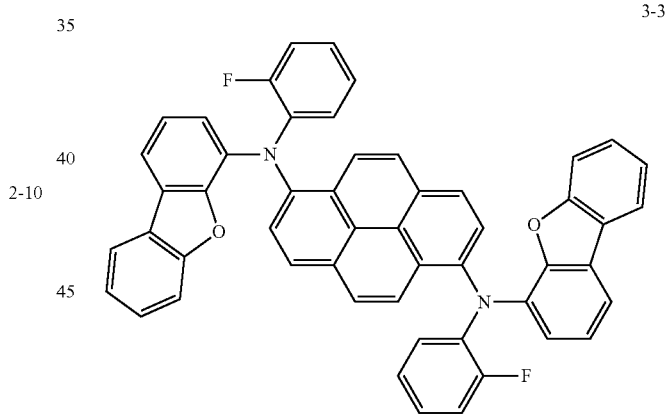
3-4
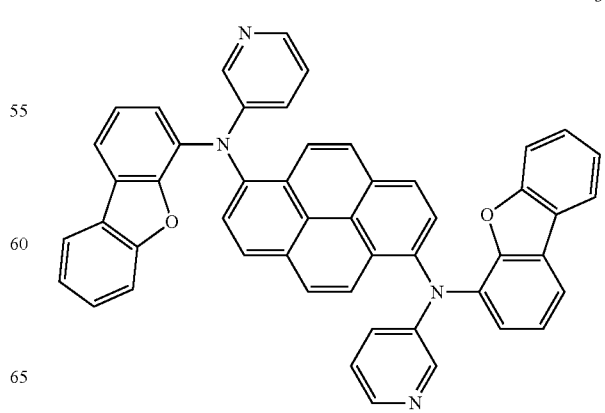

3-5
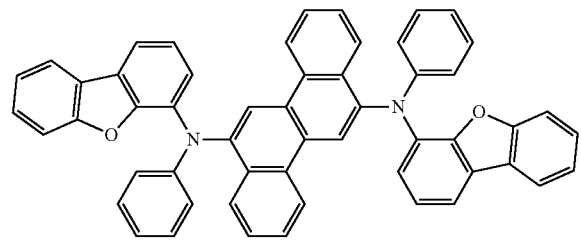
3-6
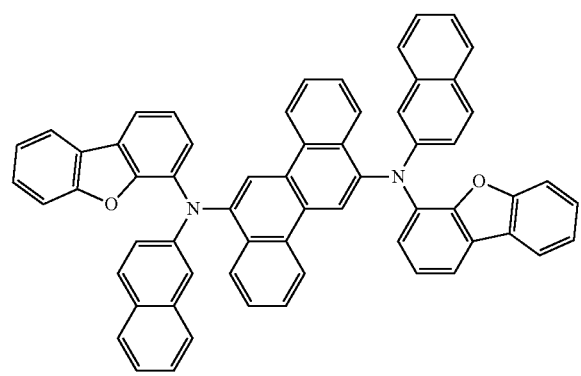
3-7
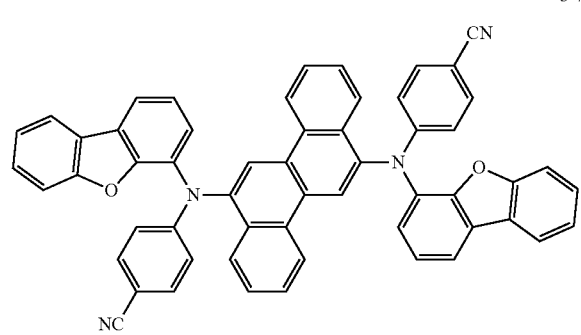
3-8
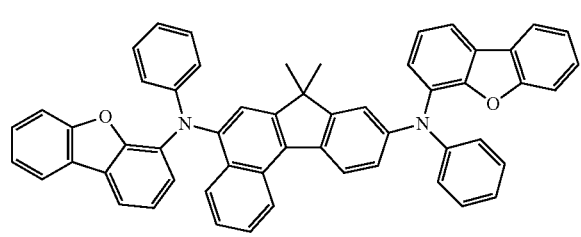
3-9
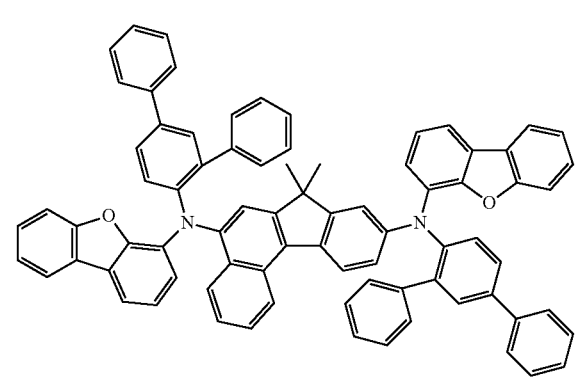
3-10
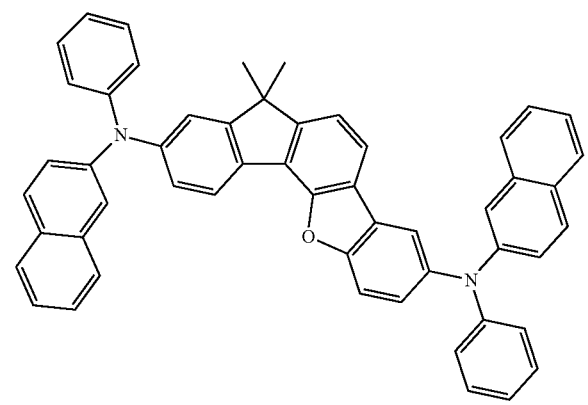
3-11
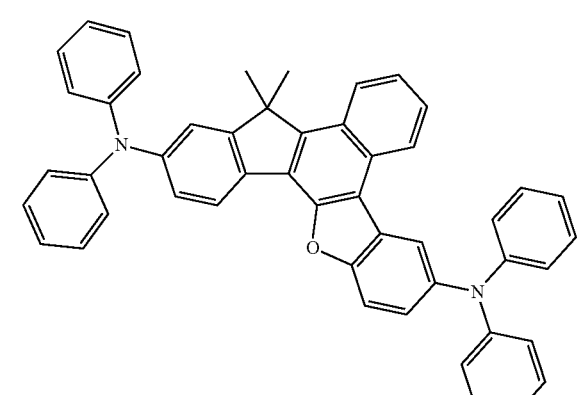
3-12
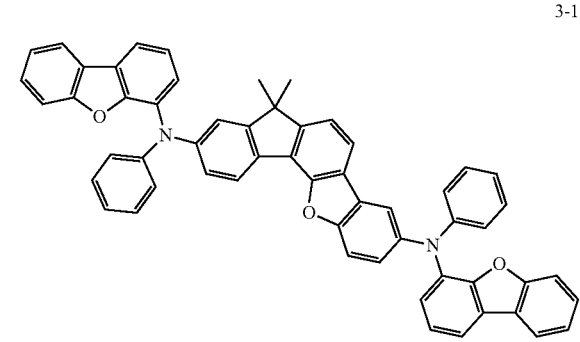
4-1
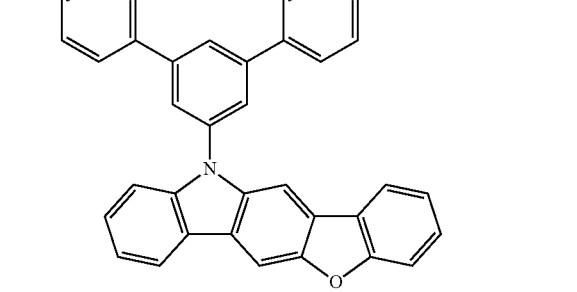

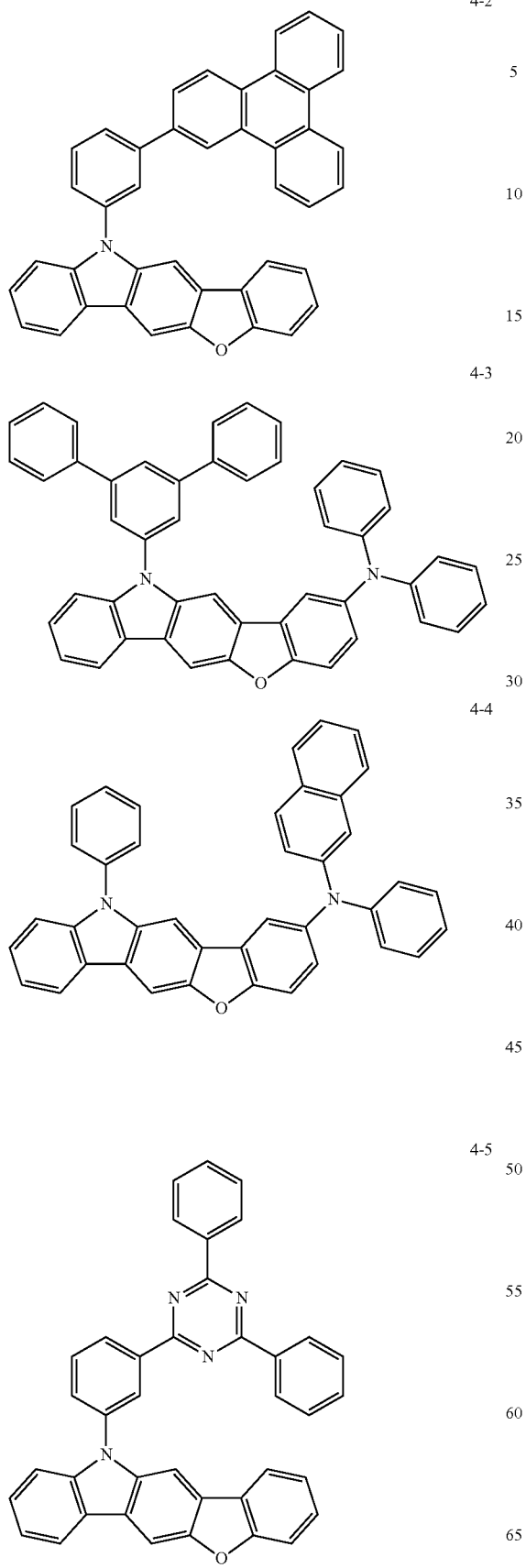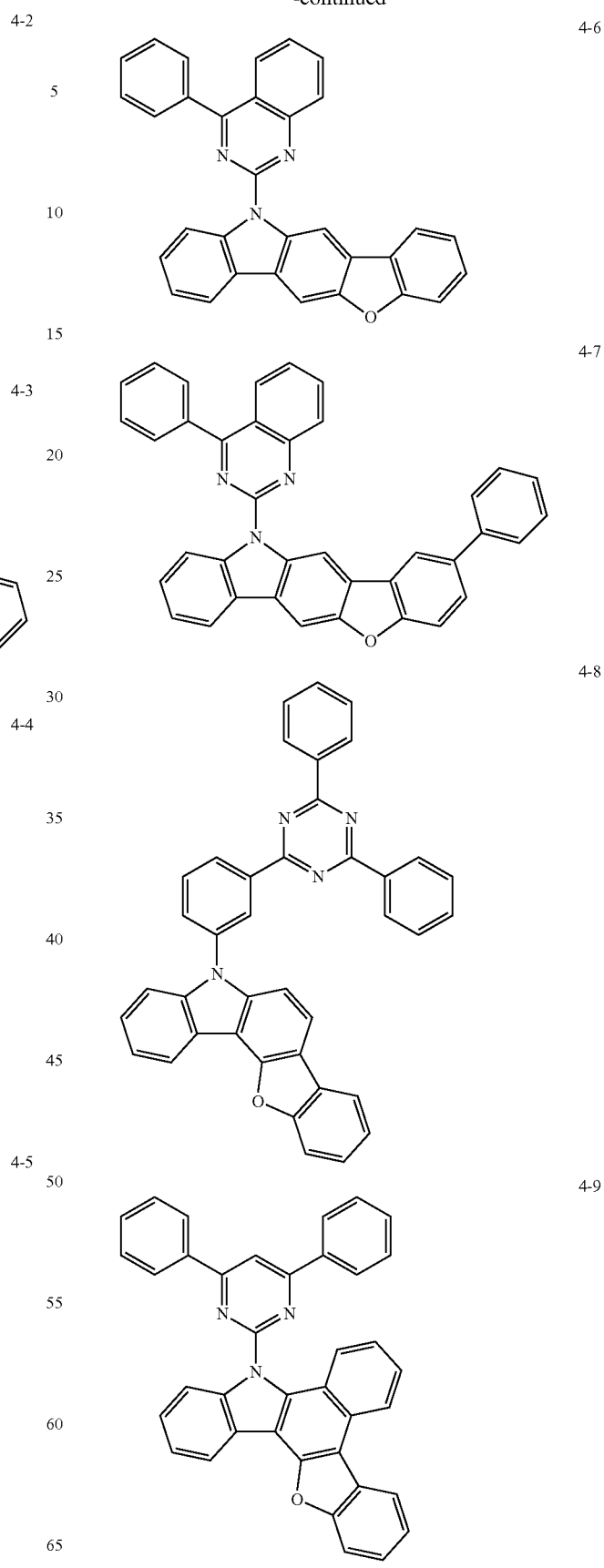

4-10
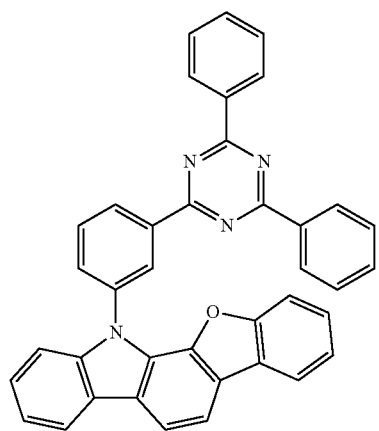
4-11
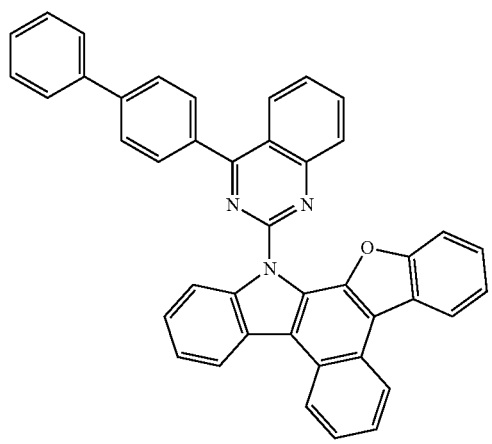
4-12
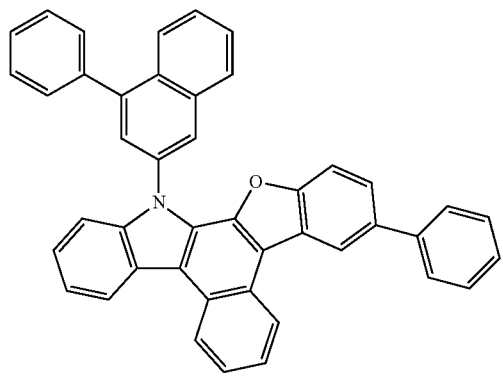
5-1
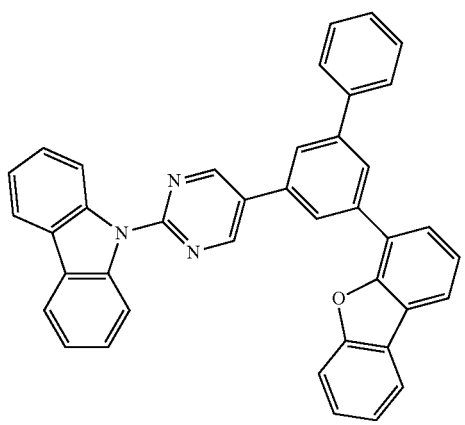
5-2
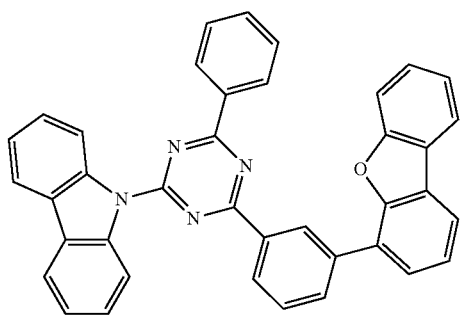
5-3
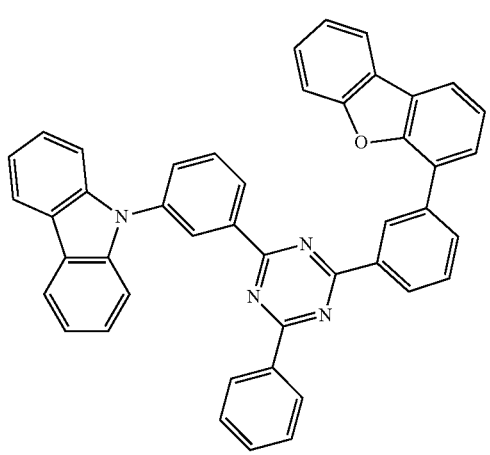
5-4
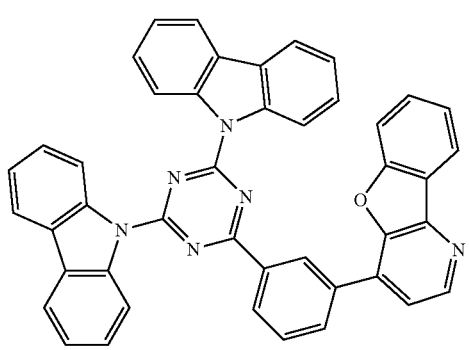

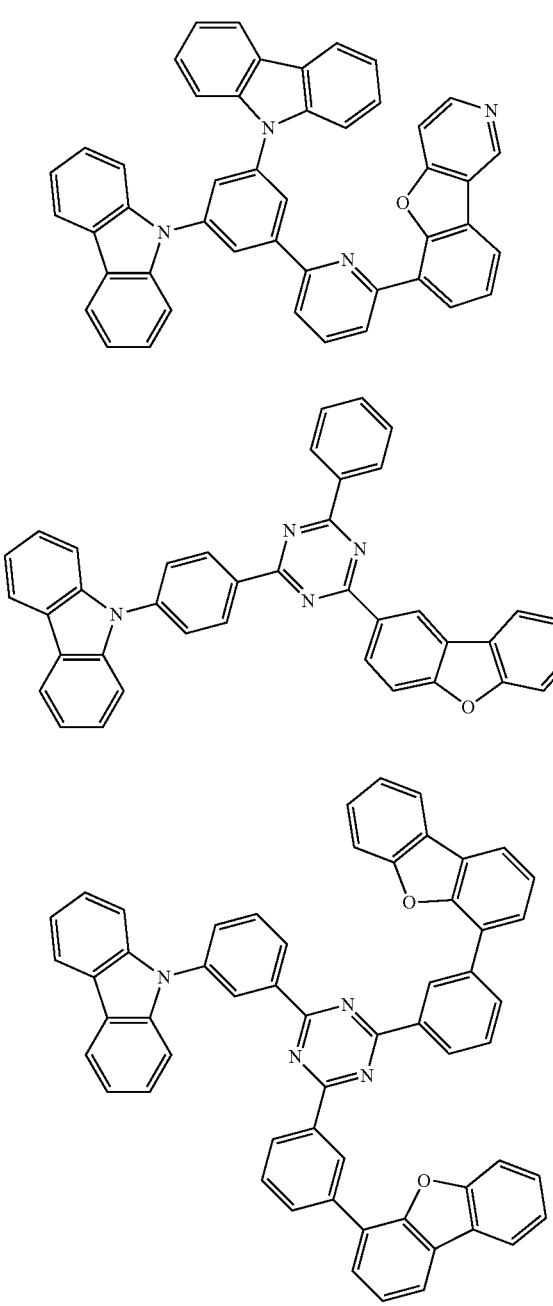
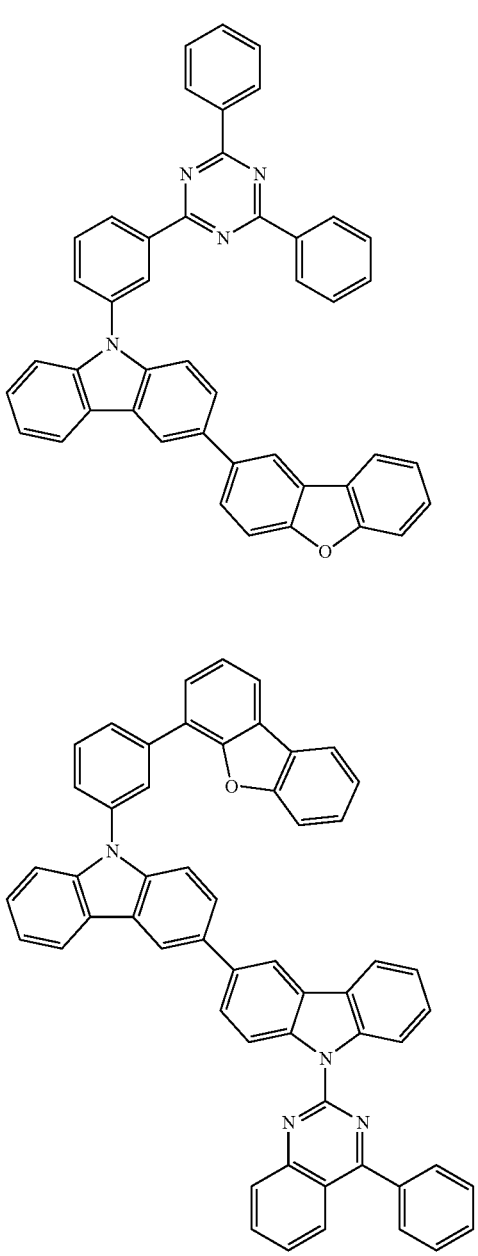

What is claimed is:

1. An organic light-emitting device comprising:
   a first electrode;
   a second electrode facing the first electrode;
   a first layer between the first electrode and the second electrode, the first layer comprising a first compound;
   a second layer between the first layer and the second electrode, the second layer comprising a second compound; and
   a third layer between the second layer and the second electrode, the third layer comprising a third compound;
   wherein the first compound does not comprise a nitrogen-containing heterocyclic group comprising *=N—*' as a ring forming moiety, and
   wherein the first compound and the second compound each independently comprise at least one group selected from groups represented by Formulae A to C:

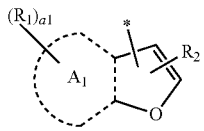

Formula A

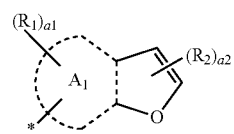

Formula B

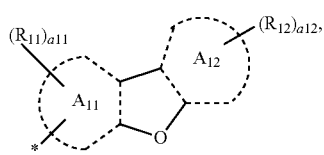

Formula C wherein, in Formulae A to C, ring $A_1$, ring $A_{11}$, and ring $A_{12}$ are each independently selected from a $C_5$-$C_{30}$ carbocyclic group and a $C_2$-$C_{30}$ heterocyclic group, $R_1$, $R_2$, $R_{11}$, and $R_{12}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and —N($Q_1$)($Q_2$), —Si($Q_3$)($Q_4$)($Q_5$), and —B($Q_6$)($Q_7$), wherein $Q_1$ to $Q_7$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, a1, a11, and a12 are each independently an integer selected from 0 to 10, a2 is an integer selected from 0 to 2, wherein * and *' each indicate a binding site to an adjacent atom, and wherein the third compound comprises a nitrogen-containing heterocyclic group comprising *=N—*' as a ring forming moiety and is selected from compounds represented by Formulae 3-1 and 3-2:

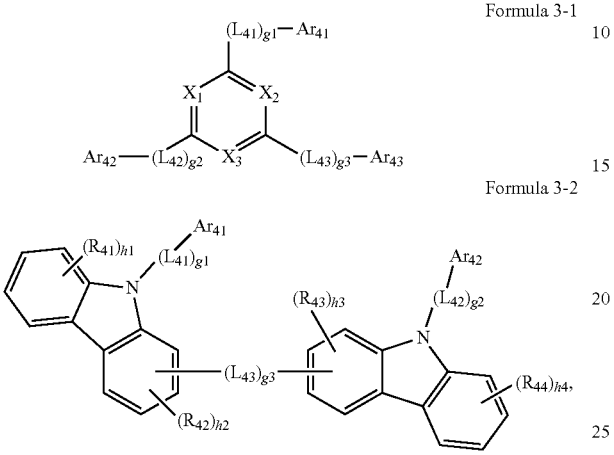

wherein, in Formulae 3-1, and 3-2, $X_1$ is $C(R_{41})$ or N, $X_2$ is $C(R_{42})$ or N, $X_3$ is $(R_{43})$ or N, $L_{41}$ to $L_{43}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, g1 to g3 are each independently an integer selected from 0 to 3, $Ar_{41}$ to $Ar_{43}$ are each independently a group selected from groups represented by Formulae A to C, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a biphenyl group, a terphenyl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{41}$ to $R_{44}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_{43}$)($Q_{44}$)($Q_{45}$), h1, and h4 are each independently an integer selected from 0 to 4, and h2, and h3 are each independently an integer selected from 0 to 3, in Formula 3-1, at least one selected from $Ar_{41}$ to $Ar_{43}$ is a group selected from groups represented by Formulae A to C, in Formula 3-2, one selected from $Ar_{41}$ and $Ar_{42}$ is a group selected from groups represented by Formulae A to C, and the other one selected from $Ar_{41}$ and $Ar_{42}$ is a nitrogen-containing heterocyclic group comprising *=N—*' as a ring-forming moiety, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_6$-$C_{60}$ non-condensed arylene group, substituted $C_6$-$C_{60}$ condensed polycyclic arylene group, substituted $C_1$-$C_{60}$ heteroarylene group, substituted $C_1$-$C_{60}$ non-condensed heteroarylene group, substituted $C_1$-$C_{60}$ condensed polycyclic heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_6$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{13}$)($Q_{14}$)($Q_{15}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, and —Si($Q_{23}$)($Q_{24}$)($Q_{25}$); and —Si($Q_{33}$)($Q_{34}$)($Q_{35}$), wherein $Q_1$, $Q_2$, $Q_{13}$ to $Q_{15}$, $Q_{23}$ to $Q_{25}$, $Q_{33}$ to $Q_{35}$, and $Q_{43}$ to $Q_{45}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

2. The organic light-emitting device of claim 1, wherein at least two selected from the first compound, the second compound, and the third compound have a triplet energy of 2.4 eV or greater.

3. The organic light-emitting device of claim 1, wherein each of the first compound, the second compound, and the third compound has an asymmetrical structure.

4. The organic light-emitting device of claim 1, wherein ring $A_1$, ring $A_{11}$, and ring $A_{12}$ are each independently selected from a benzene group, a naphthalene group, a fluorene group, a benzofluorene group, a pyridine group, a pyrimidine group, a carbazole group, a benzocarbazole group, and a dibenzothiophene group.

5. The organic light-emitting device of claim 1, wherein, in Formulae A to C, $R_1$, $R_2$, $R_{11}$, and $R_{12}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, a fluorenyl group, a naphthyl group, a pyridinyl group, a pyrimidinyl group, a triazinyl group, a quinolinyl group, an isoquinolinyl group, a quinazolinyl group, and a quinoxalinyl group;

a phenyl group, a biphenyl group, a terphenyl group, a fluorenyl group, a naphthyl group, a pyridinyl group, a pyrimidinyl group, a triazinyl group, a quinolinyl group, an isoquinolinyl group, a quinazolinyl group, and a quinoxalinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, and a $C_6$-$C_{16}$ aryl group; and —N($Q_1$)($Q_2$), —Si($Q_3$)($Q_4$)($Q_5$), and —B($Q_6$)($Q_7$), wherein $Q_1$ to $Q_7$ are each independently selected from a $C_1$-$C_{10}$ alkyl group, a $C_1$-$C_{10}$ alkoxy group, a phenyl group, a biphenyl group, a terphenyl group, a fluorenyl group, and a naphthyl group.

6. The organic light-emitting device of claim 1, wherein the first compound, the second compound, and the third compound each independently comprise at least one group selected from groups represented by Formulae A(1), A(2), B(1) to B(4), and C(1) to C(16):

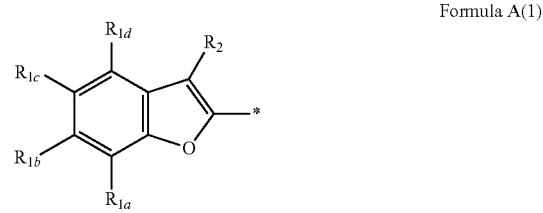

Formula A(1)

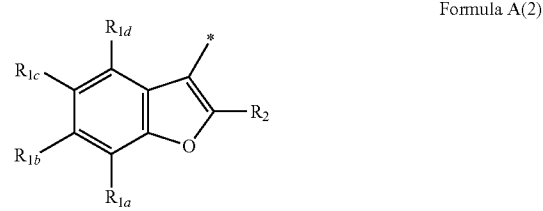

Formula A(2)

101
-continued
Formula B(1)
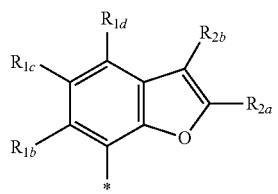
Formula B(2)
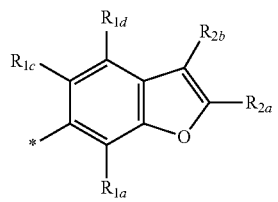
Formula B(3)
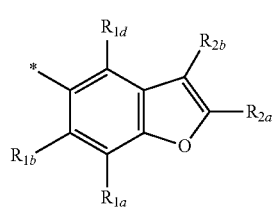
Formula B(4)
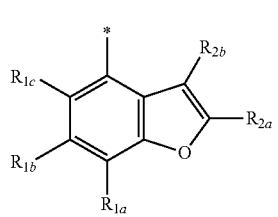
Formula C(1)
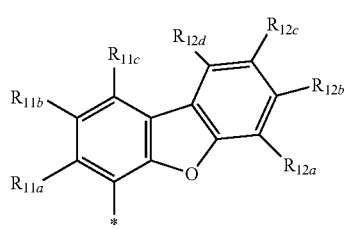
Formula C(2)
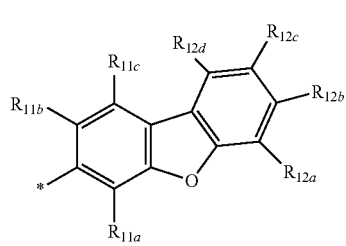
Formula C(3)
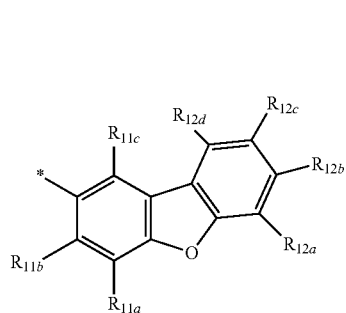
102
-continued
Formula C(4)
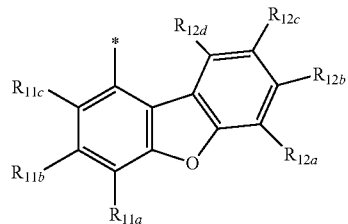
Formula C(5)
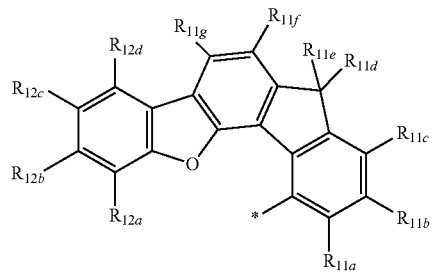
Formula C(6)
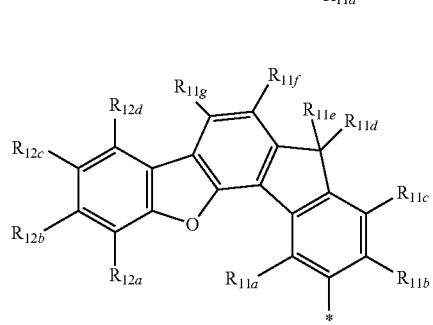
Formula C(7)
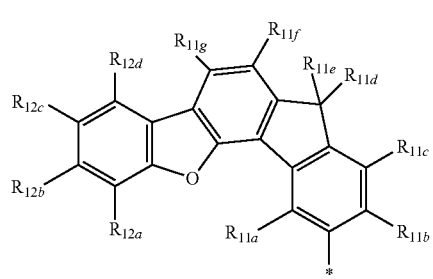
Formula C(8)
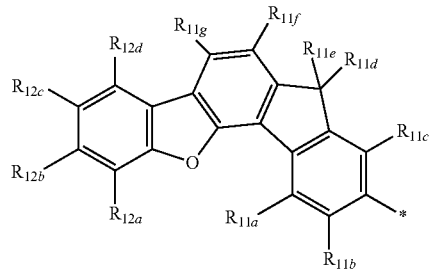
Formula C(9)
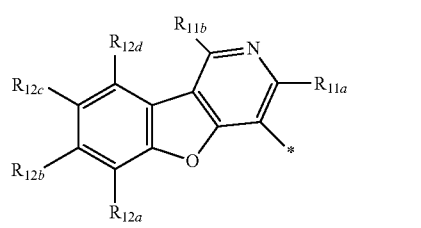

Formula C(10)
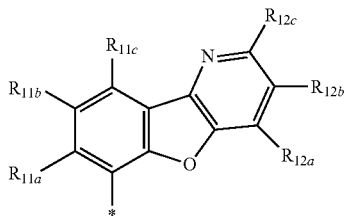

Formula C(11)
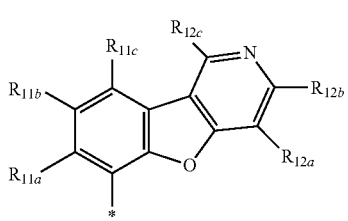

Formula C(12)
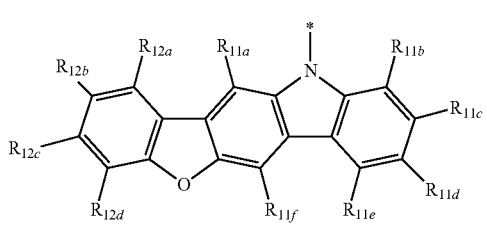

Formula C(13)
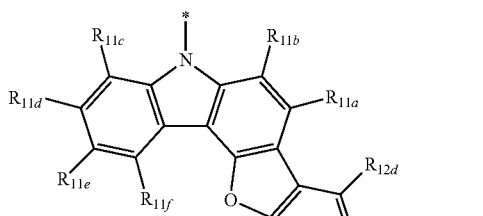

Formula C(14)
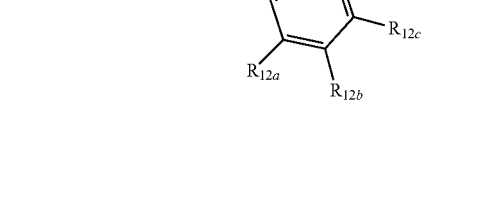

Formula C(15)
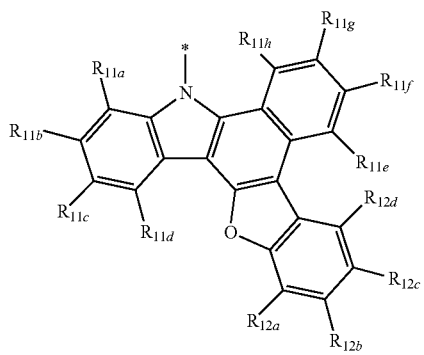

Formula C(16)
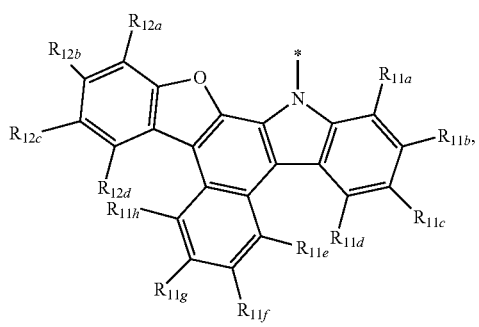

wherein, in Formulae A(1), A(2), B(1) to B(4), and C(1) to C(16),
$R_{1a}$ to $R_{1d}$ are defined as $R_1$,
$R_{2a}$ and $R_{2b}$ are defined as $R_2$,
$R_{11a}$ to $R_{11h}$ are defined as $R_{11}$,
$R_{12a}$ to $R_{12d}$ are defined as $R_{12}$, and
* indicates a binding site to an adjacent atom.

7. The organic light-emitting device of claim 1, wherein the first compound is selected from compounds represented by Formulae 1-1 to 1-3 and the second compound is selected from compounds represented by Formulae 2H-1, 2D-1, and 2D-2:

Formula 1-1
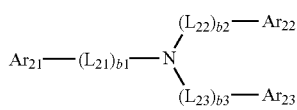

Formula 1-2
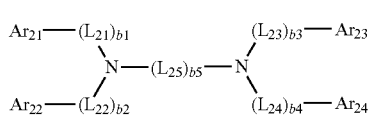

Formula 1-3
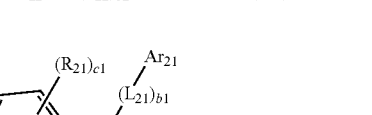

Formula 2H-1
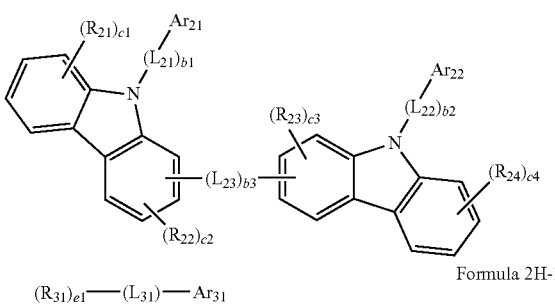

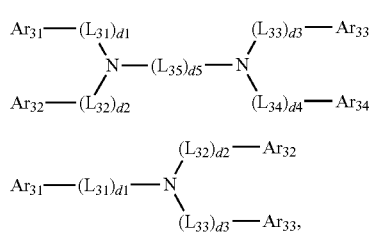

Formula 2D-1

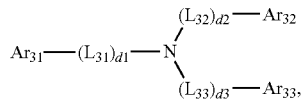

Formula 2D-2 wherein, in Formulae 1-1, 1-2, 1-3, 2H-1, 2D-1 and 2D-2, $L_{21}$ to $L_{24}$, and $L_{31}$ to $L_{34}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{25}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ non-condensed arylene group, and a substituted or unsubstituted $C_1$-$C_{60}$ non-condensed heteroarylene group, $L_{35}$ is selected from a substituted or unsubstituted $C_6$-$C_{60}$ condensed polycyclic arylene group, a substituted or unsubstituted $C_1$-$C_{60}$ condensed polycyclic heteroarylene group, a substituted or unsubstituted divalent non-aromatic condensed polycyclic group, and a substituted or unsubstituted divalent non-aromatic condensed heteropolycyclic group, b1 to b5, and d1 to d5 are each independently an integer selected from 0 to 3, $Ar_{21}$ to $Ar_{24}$, and $Ar_{31}$ to $Ar_{34}$ are each independently a group selected from groups represented by Formulae A to C, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a biphenyl group, a terphenyl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{21}$ to $R_{24}$, and $R_{31}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_{43}$)($Q_{44}$)($Q_{45}$), c1 and c4 are each independently an integer selected from 0 to 4, e1 is an integer selected from 0 to 7, and c2 and c3 are each independently an integer selected from 0 to 3, in Formula 1-1, at least one selected from $Ar_{21}$ to $Ar_{23}$ is a group selected from groups represented by Formulae A to C, in Formula 1-2, at least one selected from $Ar_{21}$ to $Ar_{24}$ is a group selected from groups represented by Formulae A to C, in Formula 1-3, at least one selected from $Ar_{21}$ and $Ar_{22}$ is a group selected from groups represented by Formulae A to C, in Formula 2H-1, $Ar_{31}$ is a group selected from groups represented by Formulae A to C, in Formula 2D-1, at least one selected from $Ar_{31}$ to $Ar_{34}$ is a group selected from groups represented by Formulae A to C, in Formula 2D-2, at least one selected from $Ar_{31}$ to $Ar_{33}$ is a group selected from groups represented by Formulae A to C, wherein the group selected from groups represented by Formulae A to C comprises —N($Q_1$)($Q_2$), and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_6$-$C_{60}$ non-condensed arylene group, substituted $C_6$-$C_{60}$ condensed polycyclic arylene group, substituted $C_1$-$C_{60}$ heteroarylene group, substituted $C_1$-$C_{60}$ non-condensed heteroarylene group, substituted $C_1$-$C_{60}$ condensed polycyclic heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{13}$)($Q_{14}$)($Q_{15}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, and —Si($Q_{23}$)($Q_{24}$)($Q_{25}$); and —Si($Q_{33}$)($Q_{34}$)($Q_{35}$), wherein $Q_1$, $Q_2$, $Q_{13}$ to $Q_{15}$, $Q_{23}$ to $Q_{25}$, $Q_{33}$ to $Q_{35}$, and $Q_{43}$ to $Q_{45}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

8. The organic light-emitting device of claim 7, wherein the first compound is selected from compounds represented by Formulae 1-1(1) to 1-1(4), 1-2(1), and 1-3(1), the second compound is selected from compounds represented by Formulae 2H-1 (1) to 2H-1 (4), 2D-1 (1) to 2D-1 (4), 2D-2(1), and 2D-2(2), and the third compound is selected from compounds represented by Formulae 3-1(1), 3-1(2), and 3-2(1):

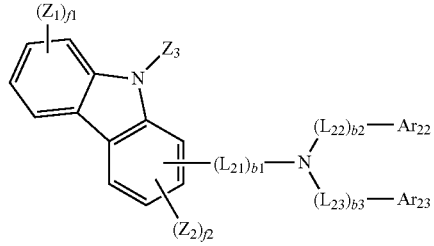

Formula 1-1(1)

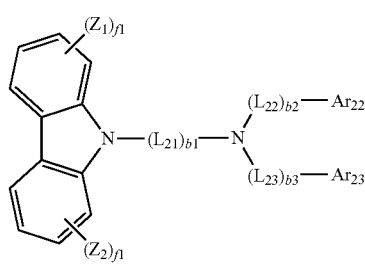

Formula 1-1(2)

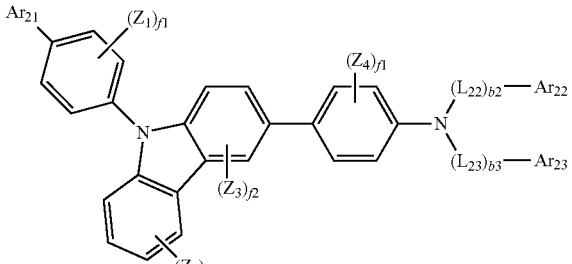

Formula 1-1(3)

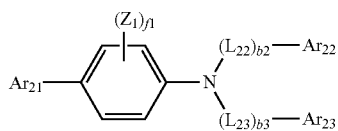

Formula 1-1(4)

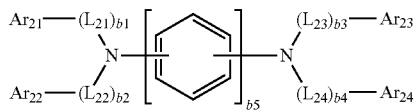

Formula 1-2(1)

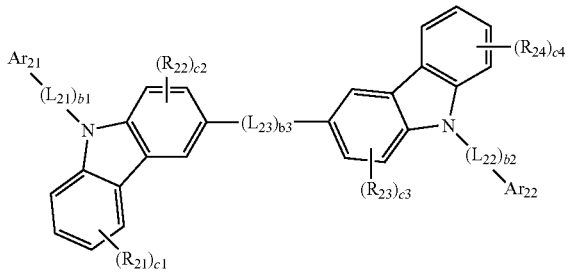

Formula 1-3(1)

Formula 2H-1(1)
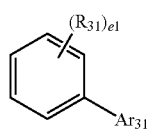
Formula 2H-1(2)
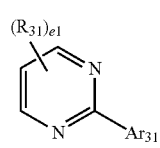
Formula 2H-1(3)
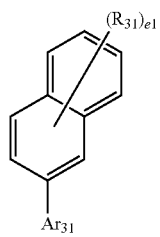
Formula 2H-1(4)
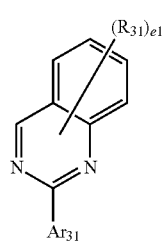
Formula 2D-1(1)
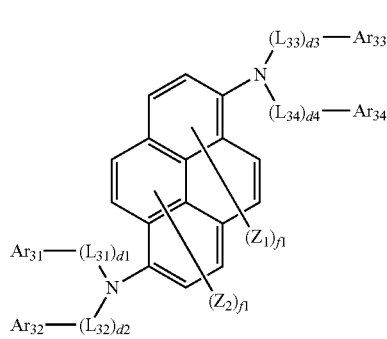
Formula 2D-1(2)
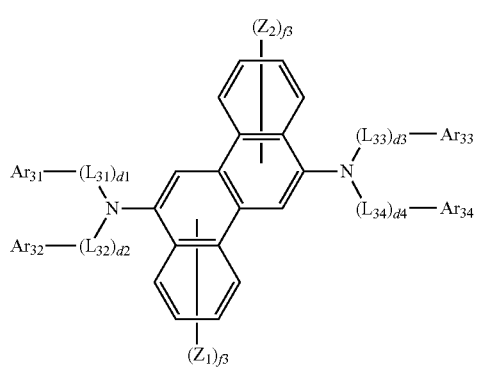
Formula 2D-1(3)
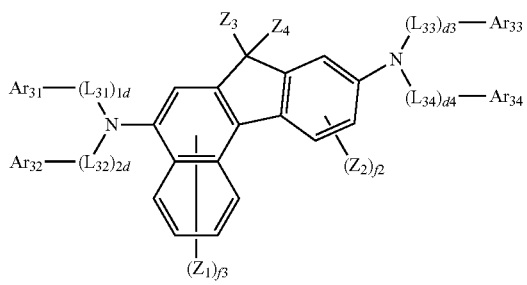
Formula 2D-1(4)
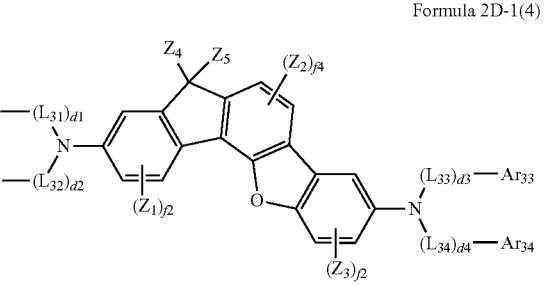
Formula 2D-2(1)
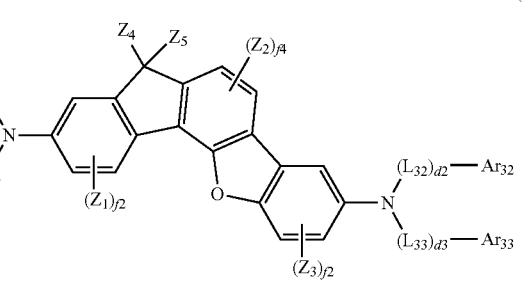
Formula 2D-2(2)
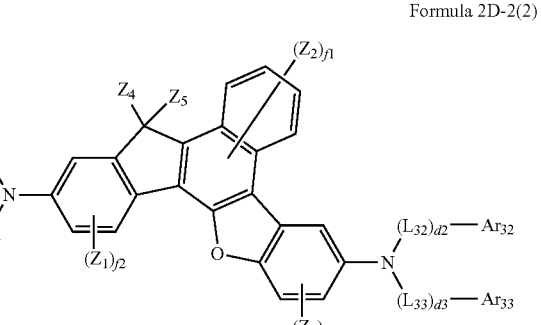
Formula 3-1(1)
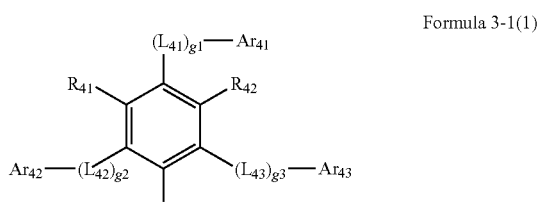
Formula 3-1(2)
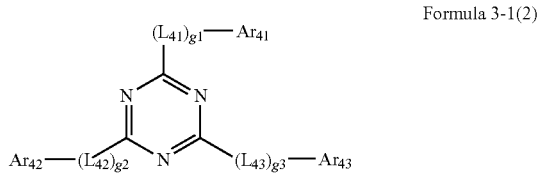

-continued

Formula 3-2(1)

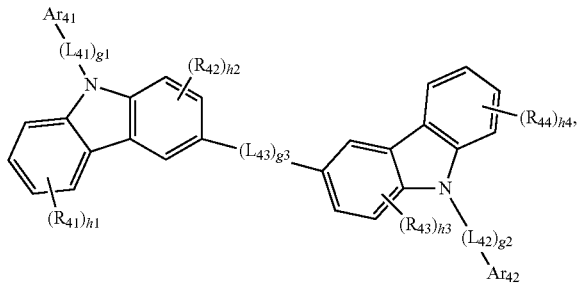

wherein, in Formulae 1-1(1) to 1-1(4), 1-2(1), 1-3(1), 2H-1 (1) to 2H-1(4), 2D-1 (1) to 2D-1(4), 2D-2(1), 2D-2(2), 3-1(1), 3-1(2), and 3-2(1), $Z_1$ to $Z_5$ are each independently selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{13}$)($Q_{14}$)($Q_{15}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{23}$)($Q_{24}$)($Q_{25}$); and —Si($Q_{33}$)($Q_{34}$)($Q_{35}$), wherein $Q_{13}$ to $Q_{15}$, $Q_{23}$ to $Q_{25}$, and $Q_{33}$ to $Q_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, f1 is an integer selected from 0 to 4, f2 is an integer selected from 0 to 3, f3 is an integer selected from 0 to 5, and f4 is an integer selected from 0 to 2, in Formula 1-1(1), at least one selected from $Ar_{22}$ and $Ar_{23}$ is a group selected from groups represented by Formulae A to C, in Formula 1-1(2), at least one selected from $Ar_{22}$ and $Ar_{23}$ is a group selected from groups represented by Formulae A to C, in Formula 1-1(3), at least one selected from $Ar_{21}$ to $Ar_{23}$ is a group selected from groups represented by Formulae A to C, in Formula 1-1(4), at least one selected from $Ar_{21}$ to $Ar_{23}$ is a group selected from groups represented by Formulae A to C, in Formula 1-2(1), at least one selected from of $Ar_{21}$ to $Ar_{24}$ is a group selected from groups represented by Formulae A to C, in Formula 1-3(1), at least one selected from $Ar_{21}$ and $Ar_{22}$ is a group selected from groups represented by Formulae A to C, in Formulae 2H-1 (1) to 2H-1 (4), $Ar_{31}$ is a group selected from groups represented by Formulae A to C, in Formula 2D-1 (1), at least one selected from $Ar_{31}$ to $Ar_{34}$ is a group selected from groups represented by Formulae A to C, in Formula 2D-1(2), at least one selected from $Ar_{31}$ to $Ar_{34}$ is a group selected from groups represented by Formulae A to C, in Formula 2D-1(3), at least one selected from $Ar_{31}$ to $Ar_{34}$ is a group selected from groups represented by Formulae A to C, in Formula 2D-1(4), at least one selected from $Ar_{31}$ to $Ar_{34}$ is a group selected from groups represented by Formulae A to C, in Formula 2D-2(1), at least one selected from $Ar_{32}$ and $Ar_{33}$ is a group selected from groups represented by Formulae A to C, in Formula 2D-2(2), at least one selected from $Ar_{32}$ and $Ar_{33}$ is a group selected from groups represented by Formulae A to C, in Formula 3-1 (1), at least one selected from $Ar_{41}$ to $Ar_{43}$ is a group selected from groups represented by Formulae A to C, in Formula 3-1(2), at least one selected from $Ar_{41}$ to $Ar_{43}$ is a group selected from groups represented by Formulae A to C, and in Formula 3-2(1), one selected from $Ar_{41}$ and $Ar_{42}$ is a group selected from groups represented by Formulae A to C, and the other one selected from of $Ar_{41}$ and $Ar_{42}$ is a nitrogen-containing heterocyclic group comprising *=N—*' as a ring forming moiety.

9. The organic light-emitting device of claim 7, wherein the first compound is selected from compounds represented by Formulae 1-1 to 1-3 and the second compound is represented by Formula 2H-1.

10. The organic light-emitting device of claim 9, wherein the second layer is an emission layer, the second layer further comprises a dopant, and the first layer and the third layer each directly contact the second layer.

11. The organic light-emitting device of claim 7, wherein the first compound is selected from compounds represented by Formulae 1-1, 1-2, and 1-3, the second compound is selected from compounds represented by Formulae 2D-1 and 2D-2, and the third compound is selected from compounds represented by Formulae 3-1 and 3-2.

12. The organic light-emitting device of claim 11, wherein the second layer is an emission layer, the second layer further comprises a host, and the first layer and the third layer each directly contact the second layer.

13. The organic light-emitting device of claim 1, wherein the first compound is selected from Compounds 1-1 to 1-12 and 2-1 to 2-10, the second compound is selected from Compounds 3-1 to 3-12 and 4-1 to 4-12, and the third compound is selected from Compounds 5-1 to 5-9:

1-1

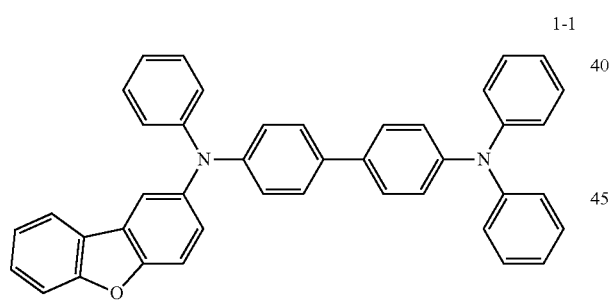

1-2

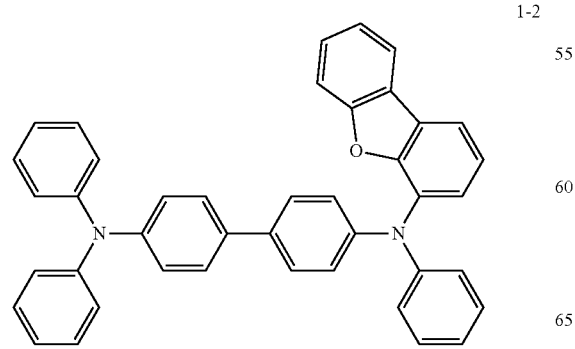

-continued 1-3

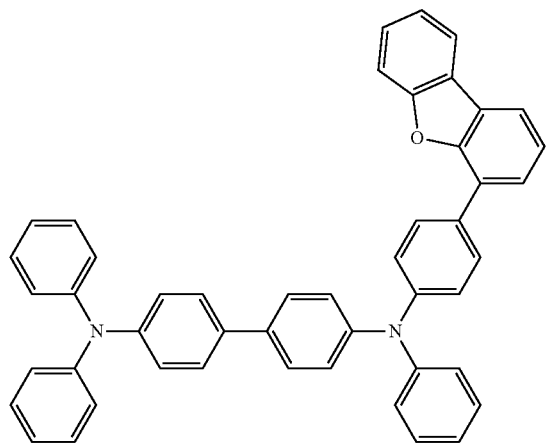

1-4

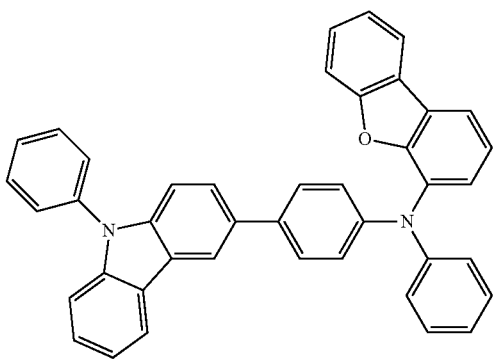

1-5

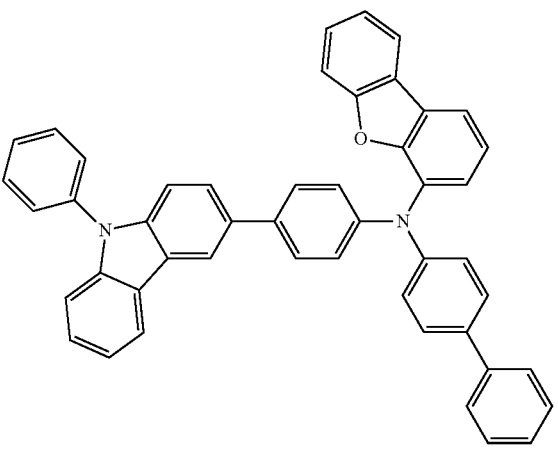

1-6
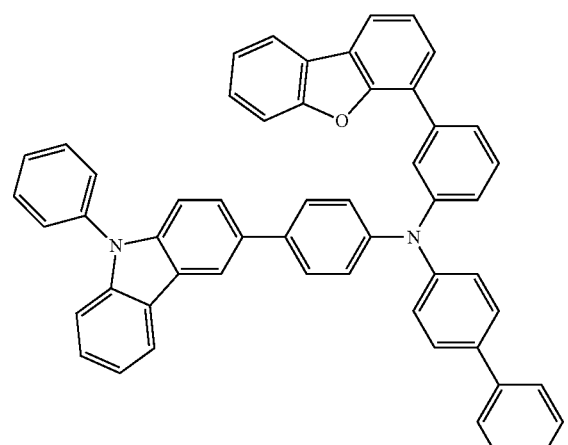
1-7
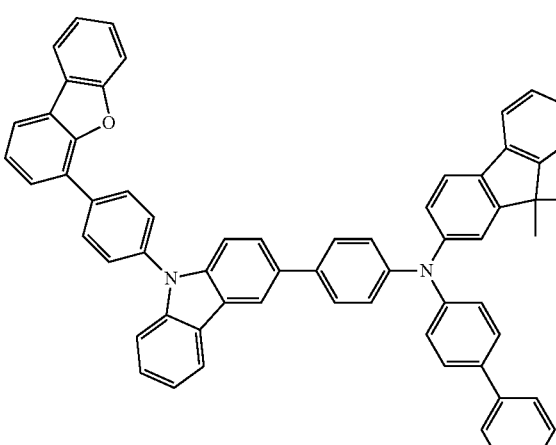
1-8
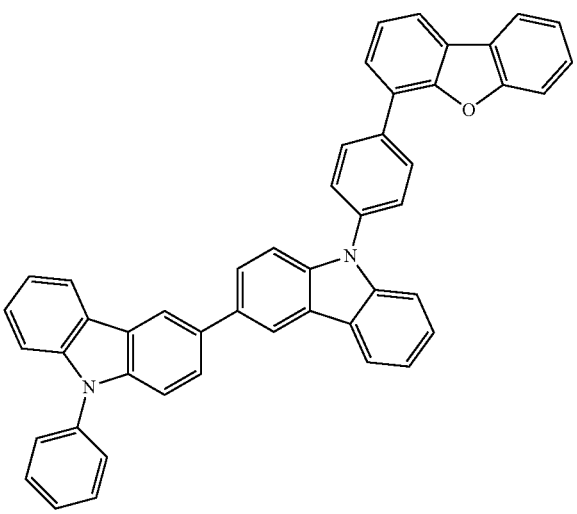
1-9
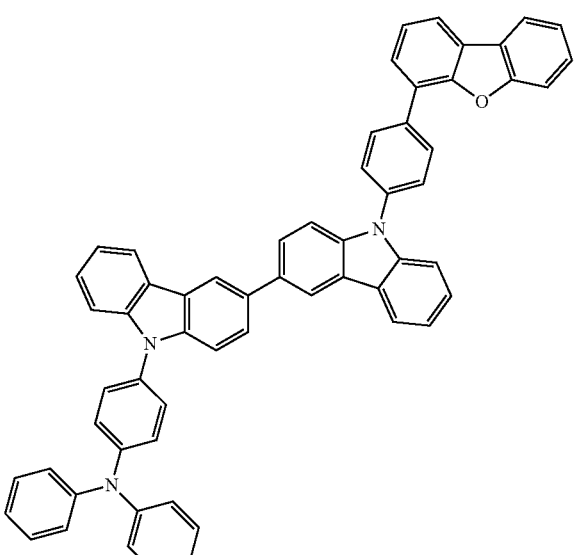
1-10
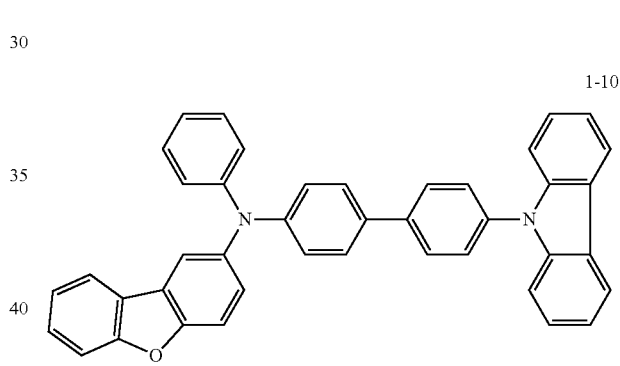
1-11
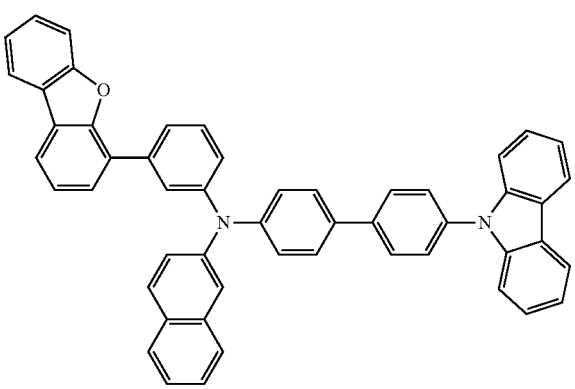

1-12
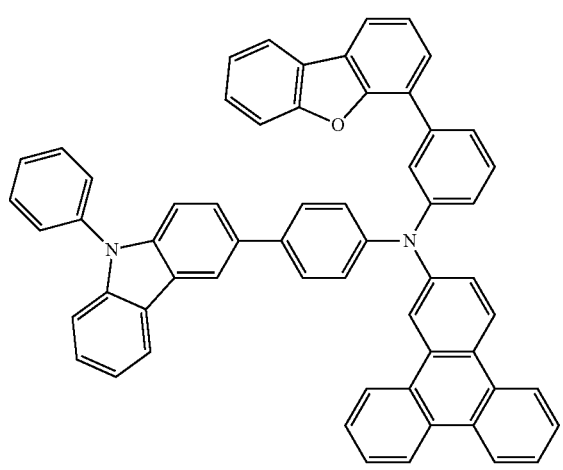
2-1
2-3
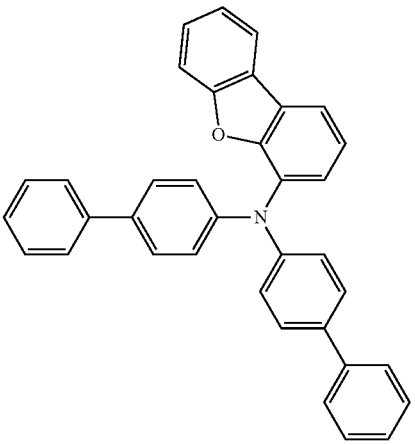
2-2
2-4
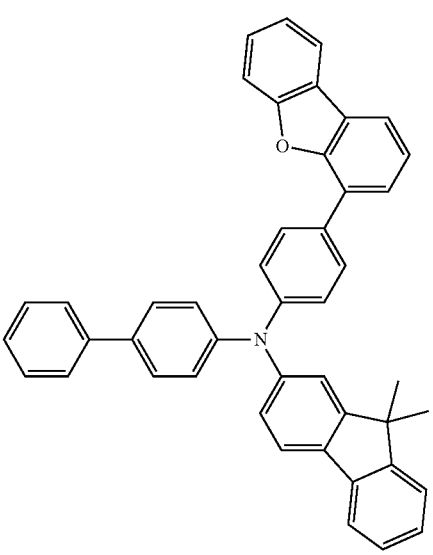
2-5
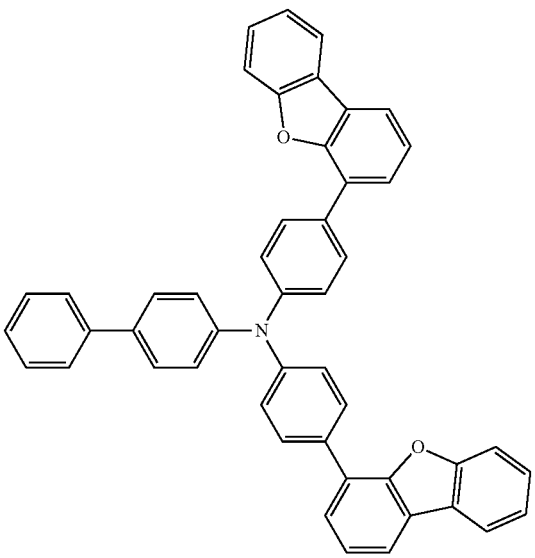

119
-continued
2-6
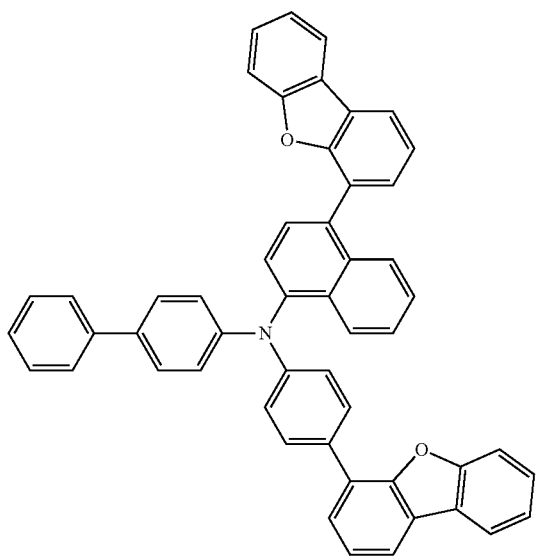
2-7
2-8
120
-continued
2-9
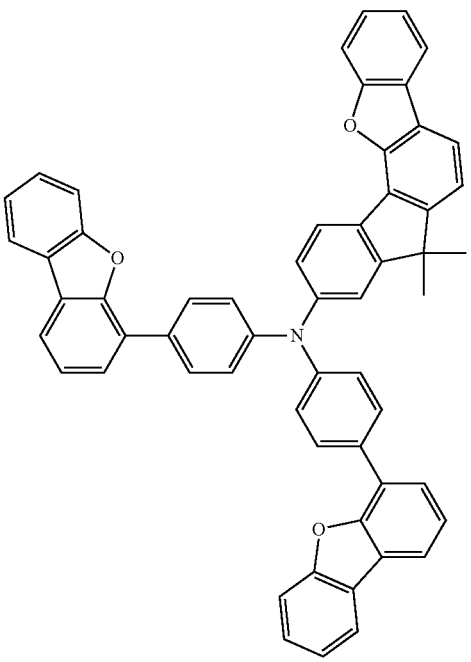
2-10

3-1
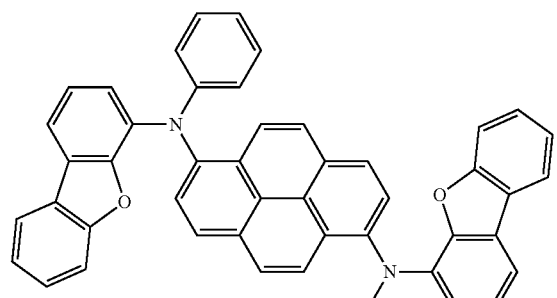
3-2
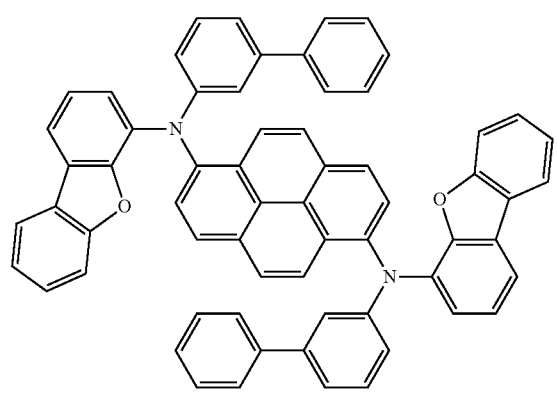
3-3
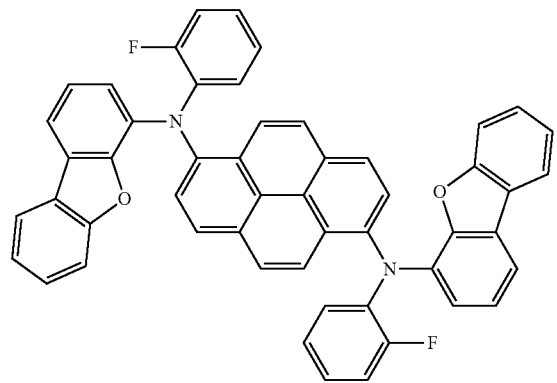
3-4
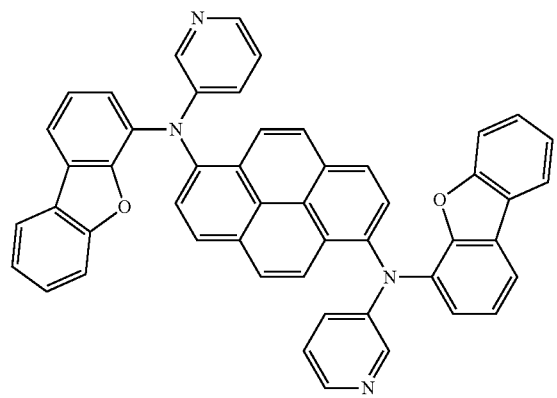
3-5
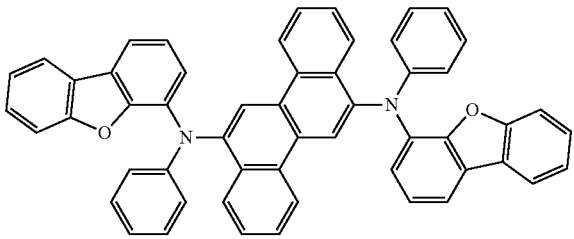
3-6
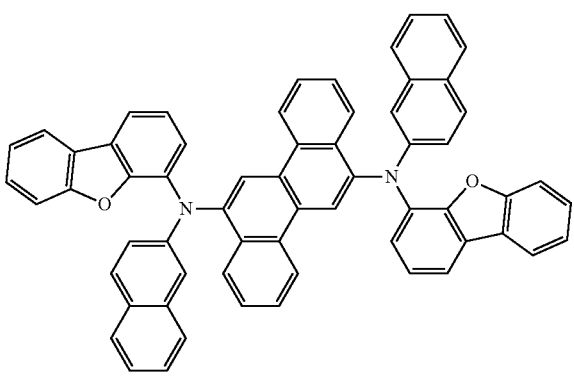
3-7
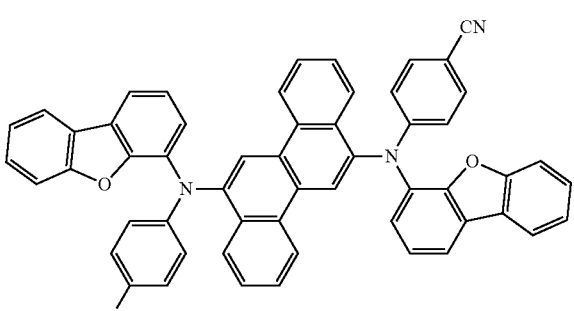
3-8
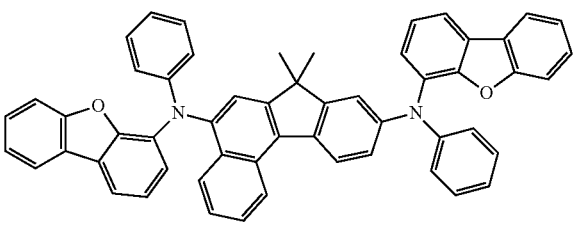
3-9
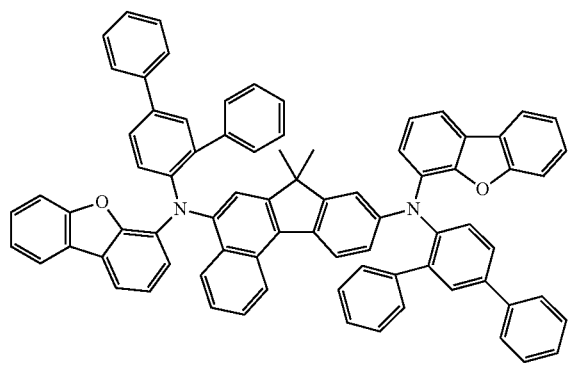

3-10
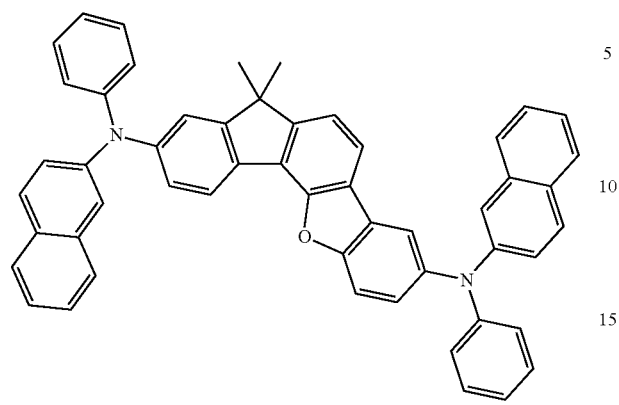
3-11
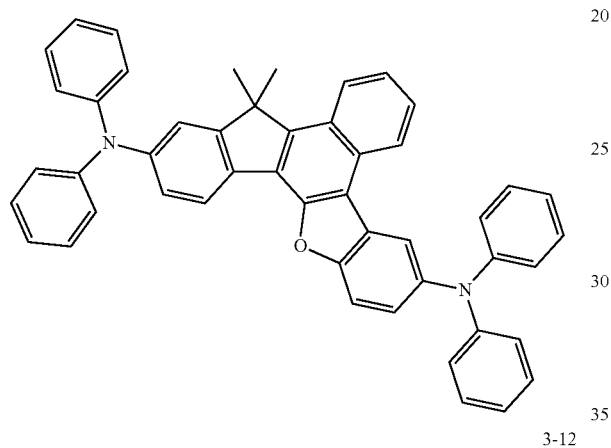
3-12
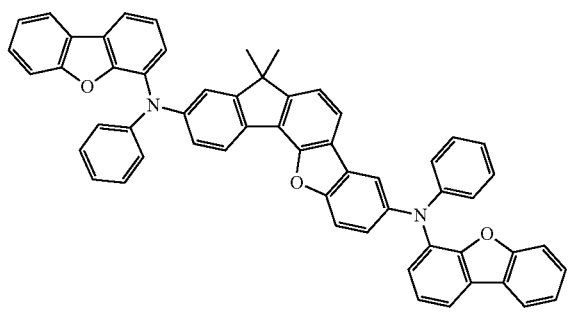
4-1
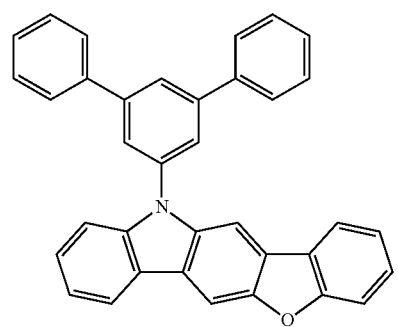
4-2
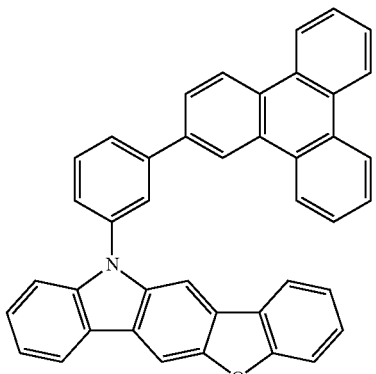
4-3
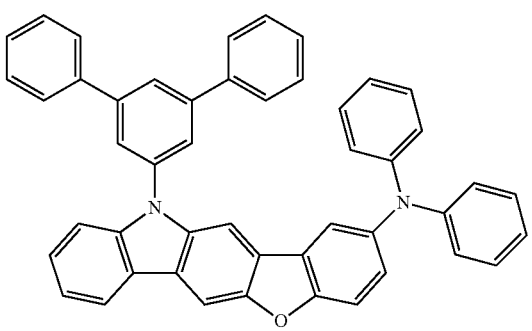
4-4
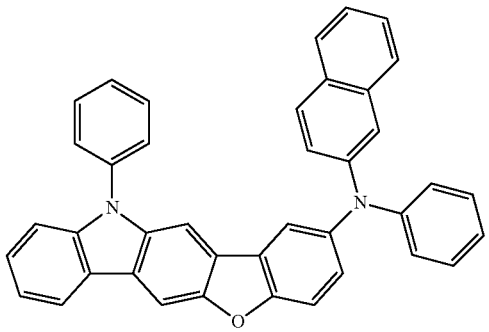
4-5
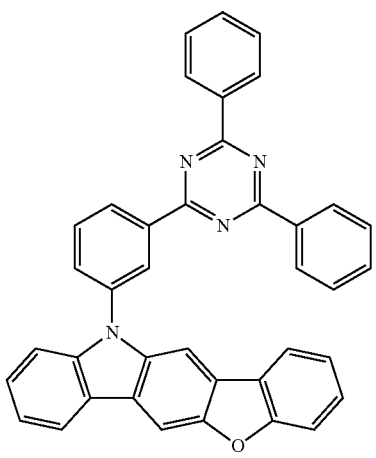

4-6
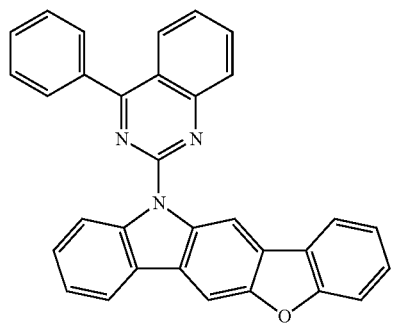
4-7
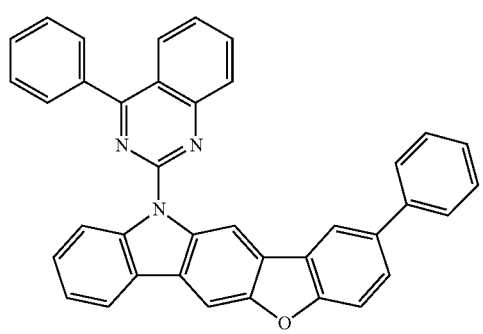
4-8
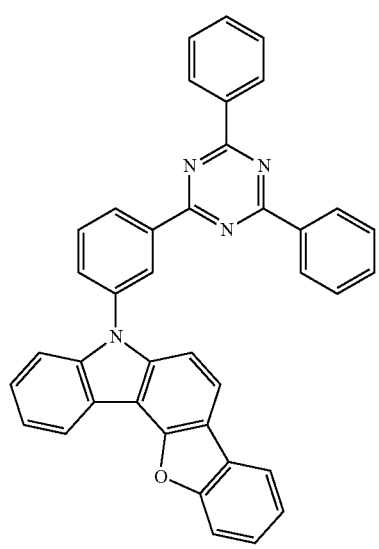
4-9
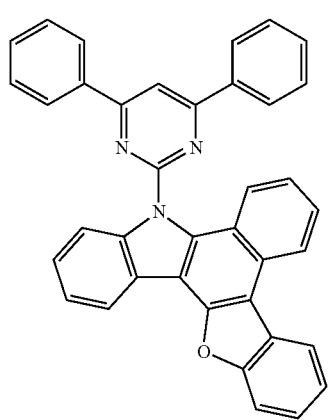
4-10
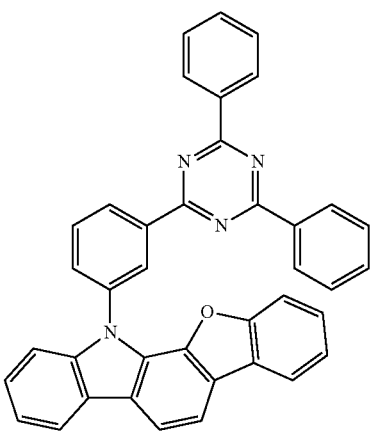
4-11
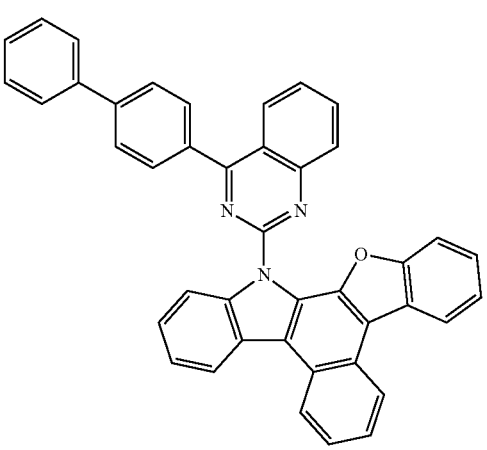
4-12
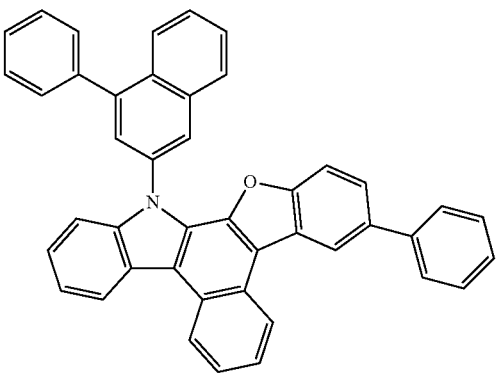

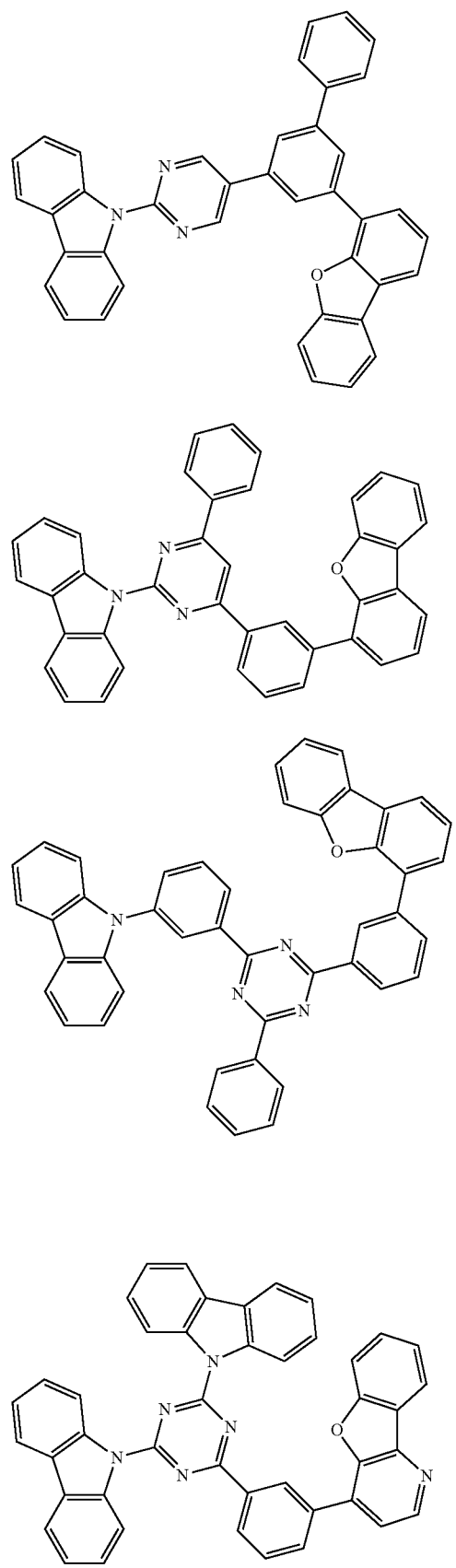
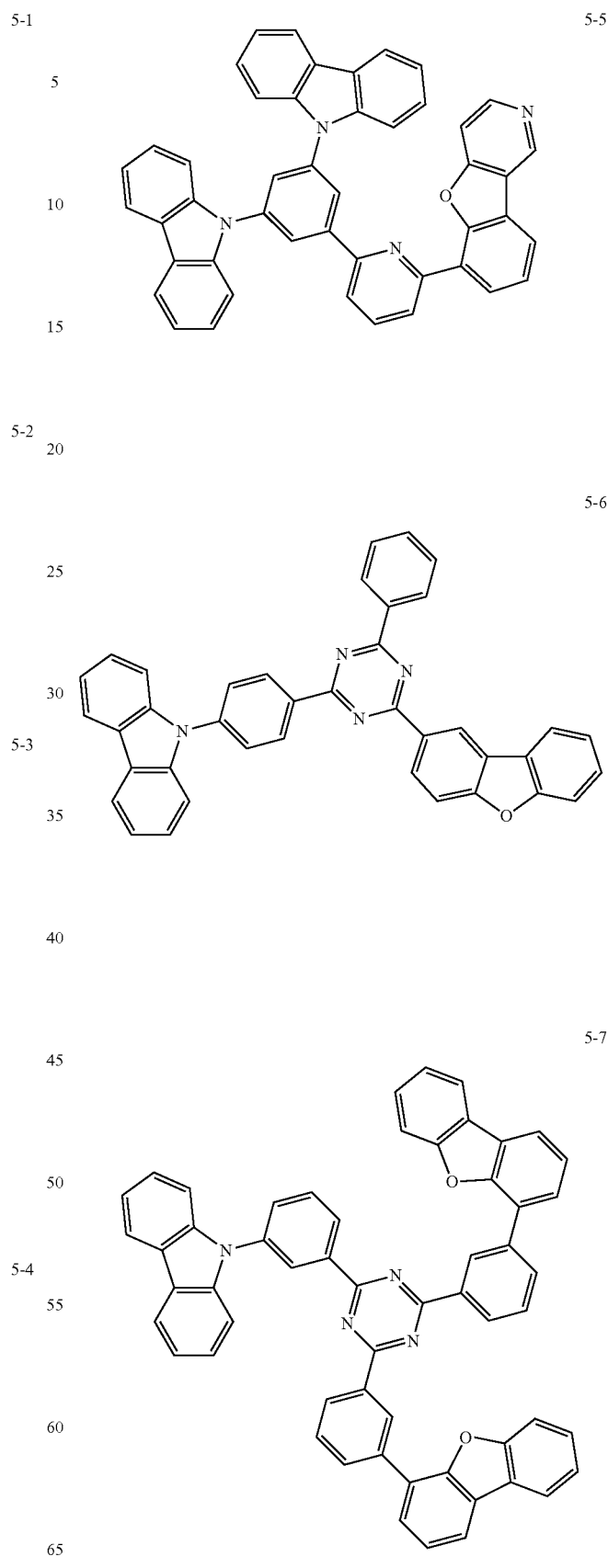

-continued

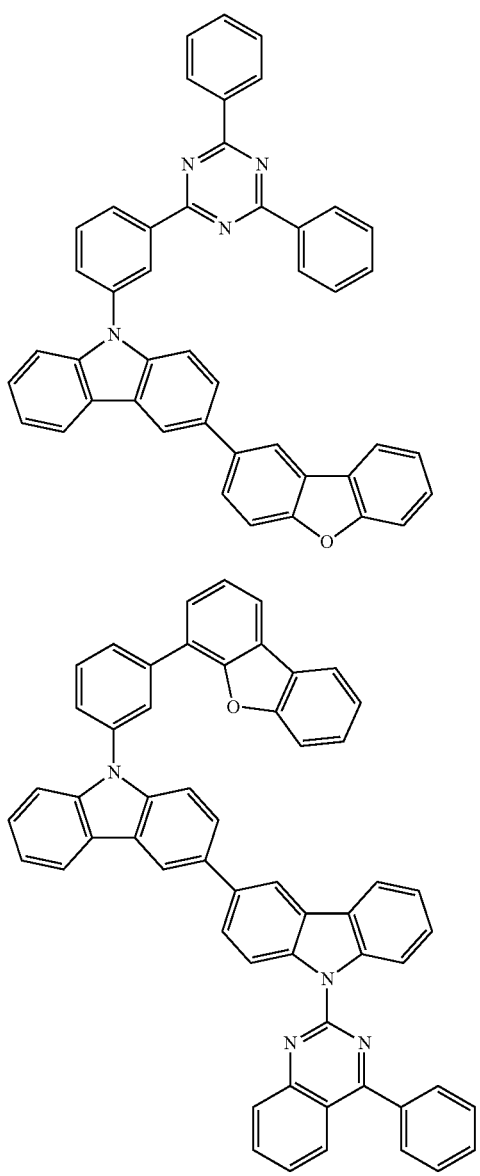

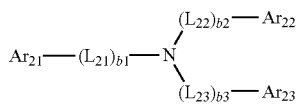
Formula 1-1

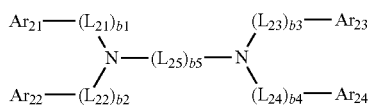
Formula 1-2

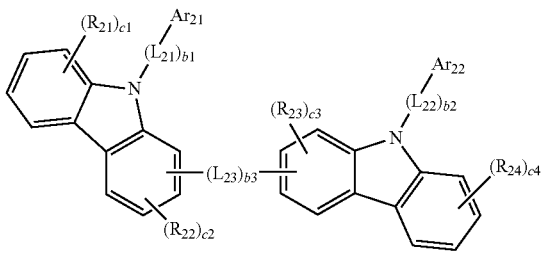
Formula 1-3

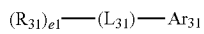
Formula 2H-1

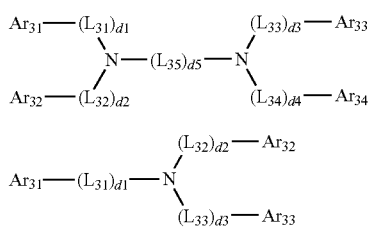
Formula 2D-1

Formula 2D-2

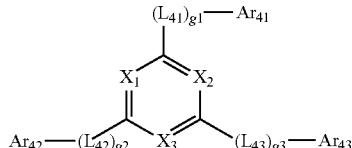

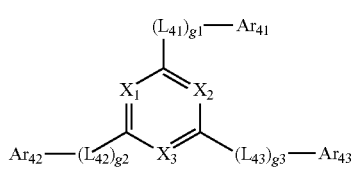

Formula 3-1

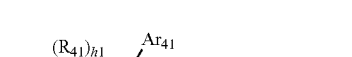

Formula 3-2

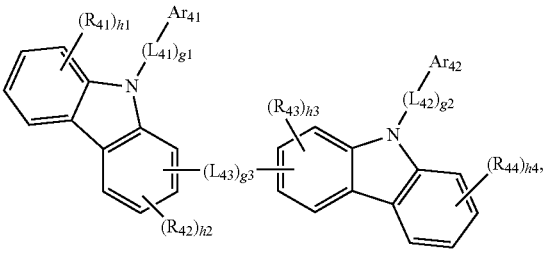

14. An organic light-emitting device comprising:

a first electrode;

a second electrode facing the first electrode;

a first layer between the first electrode and the second electrode, the first layer comprising a first compound;

a second layer between the first layer and the second electrode, the second layer comprising a second compound; and a third layer between the second layer and the second electrode, the third layer comprising a third compound, wherein the first compound and the second compound are each independently selected from compounds represented by Formulae 1-1, 1-2, and 1-3, the first compound being different from the second compound, and the third compound is selected from compounds represented by Formulae 2H-1, 2D-1, 2D-2, 3-1, and 3-2:

wherein, in Formulae 1-1, 1-2, 1-3, 2H-1, 2D-1, 2D-2, 3-1, and 3-2, $X_1$ is $C(R_{41})$ or N, $X_2$ is $C(R_{42})$ or N, $X_3$ is $C(R_{43})$ or N, $L_{21}$ to $L_{24}$, $L_{31}$ to $L_{34}$, and $L_{41}$ to $L_{43}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{25}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ non-condensed arylene group, and a substituted or unsubstituted $C_1$-$C_{60}$ non-condensed heteroarylene group, $L_{35}$ is selected from a substituted or unsubstituted $C_6$-$C_{60}$ condensed polycyclic arylene group, a substituted or unsubstituted $C_1$-$C_{60}$ condensed polycyclic heteroarylene group, a substituted or unsubstituted divalent non-aromatic condensed polycyclic group, and a substituted or unsubstituted divalent non-aromatic condensed heteropolycyclic group, b1 to b5, d1 to d5, and g1 to g3 are each independently an integer selected from 0 to 3, $Ar_{21}$ to $Ar_{24}$, $Ar_{31}$ to $Ar_{34}$, and $Ar_{41}$ to $Ar_{43}$ are each independently a group selected from groups represented by Formulae A to C, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a biphenyl group, a terphenyl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{21}$ to $R_{24}$, $R_{31}$, and $R_{41}$ to $R_{44}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_{43}$)($Q_{44}$)($Q_{45}$), c1, c4, h1, and h4 are each independently an integer selected from 0 to 4, e1 is an integer selected from 0 to 7, and c2, c3, h2, and h3 are each independently an integer selected from 0 to 3, in Formula 1-1, at least one selected from $Ar_{21}$ to $Ar_{23}$ is a group selected from groups represented by Formulae A to C, in Formula 1-2, at least one selected from $Ar_{21}$ to $Ar_{24}$ is a group selected from groups represented by Formulae A to C, in Formula 1-3, at least one selected from $Ar_{21}$ and $Ar_{22}$ is a group selected from groups represented by Formulae A to C, in Formula 2H-1, $Ar_{31}$ is a group selected from groups represented by Formulae A to C, in Formula 2D-1, at least one selected from $Ar_{31}$ to $Ar_{34}$ is a group selected from groups represented by Formulae A to C, in Formula 2D-2, at least one selected from $Ar_{31}$ to $Ar_{33}$ is a group selected from groups represented by Formulae A to C, wherein the group selected from groups represented by Formulae A to C comprises —N($Q_1$)($Q_2$), in Formula 3-1, at least one selected from $Ar_{41}$ to $Ar_{43}$ is a group selected from groups represented by Formulae A to C, in Formula 3-2, one selected from $Ar_{41}$ and $Ar_{42}$ is a group selected from groups represented by Formulae A to C, and the other one selected from $Ar_{41}$ and $Ar_{42}$ is a nitrogen-containing heterocyclic group comprising *=N—*' as a ring forming moiety, wherein, Formulae A to C, ring $A_1$, ring $A_{11}$, and ring $A_{12}$ are each independently selected from a $C_5$-$C_{30}$ carbocyclic group and a $C_2$-$C_{30}$ heterocyclic group, $R_1$, $R_2$, $R_{11}$, and $R_{12}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or salt thereof, a phosphoric acid group or a salt therof, a $C_1$-$C_{60}$ alkyl group; a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydrazine group, a hydrazone group, a carboxylic acid group or a salt thereof, a sulfonic acid group or a salt thereof, and a phosphoric acid group or a salt thereof;

$C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and -N($Q_1$)($Q_2$), -Si($Q_3$)($Q_4$)($Q_5$), and -B($Q_6$)($Q_7$), wherein $Q_1$ to $Q_7$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, a1, a11, and a12 are each independently an integer selected from 0 to 10, a2 is an integer selected from 0 to 2, and

* and *' each indicate a binding site to an adjacent atom, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_6$-$C_{60}$ non-condensed arylene group, substituted $C_6$-$C_{60}$ condensed polycyclic arylene group, substituted $C_1$-$C_{60}$ heteroarylene group, substituted $C_1$-$C_{60}$ non-condensed heteroarylene group, substituted $C_1$-$C_{60}$ condensed polycyclic heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{13}$)($Q_{14}$)($Q_{15}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, and —Si($Q_{23}$)($Q_{24}$)($Q_{25}$); and —Si($Q_{33}$)($Q_{34}$)($Q_{35}$), wherein $Q_1$, $Q_2$, $Q_{13}$ to $Q_{15}$, $Q_{23}$ to $Q_{25}$, $Q_{33}$ to $Q_{35}$, and $Q_{43}$ to $Q_{45}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

15. The organic light-emitting device of claim 14, wherein the first compound and the second compound are each independently selected from compounds represented by Formulae 1-1(1) to 1-1(4), 1-2(1), and 1-3(1), and the third compound is selected from compounds represented by Formulae 2H-1 (1) to 2H-1(4), 2D-1(1) to 2D-1(4), 2D-2(1), 2D-2(2), 3-1(1), 3-1(2), and 3-2(1):

Formula 1-1(1)
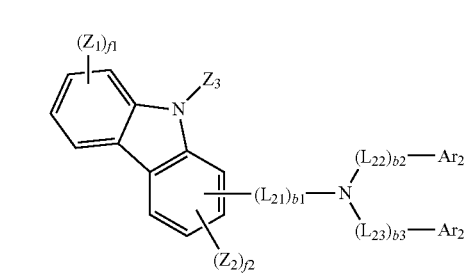
Formula 1-1(2)
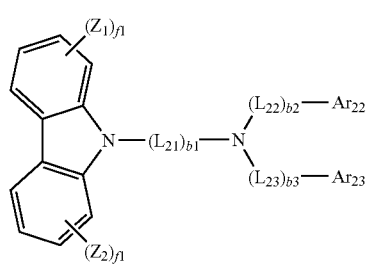
Formula 1-1(3)
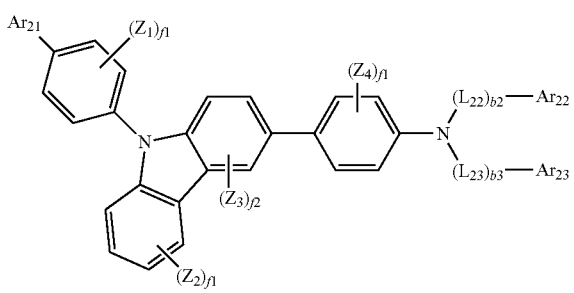
Formula 1-1(4)
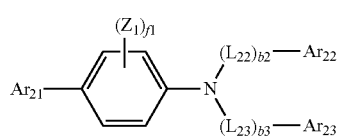
Formula 1-2(1)
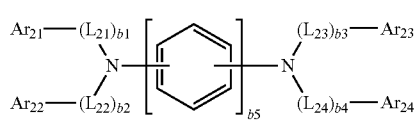
Formula 1-3(1)
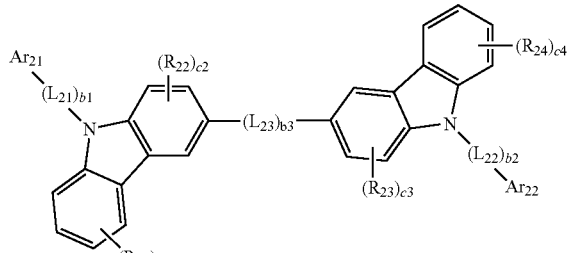
Formula 2H-1(1)
Formula 2H-1(2)
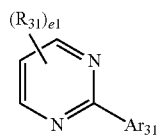
Formula 2H-1(3)
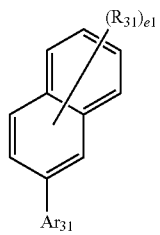
Formula 2H-1(4)
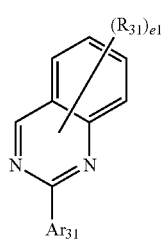
Formula 2D-1(1)
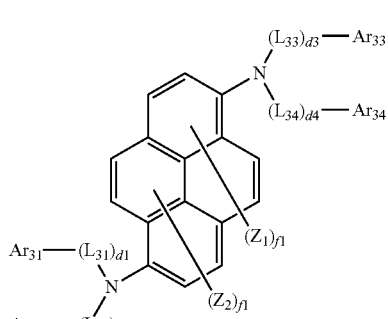
Formula 2D-1(2)
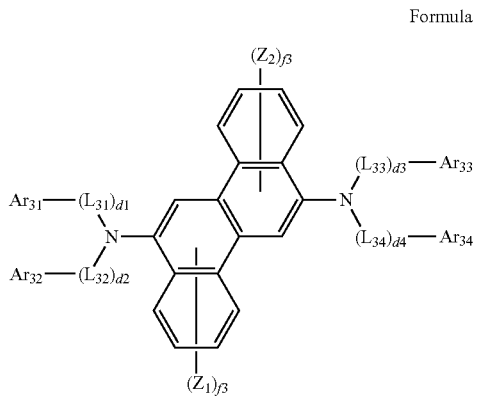
Formula 2D-1(3)
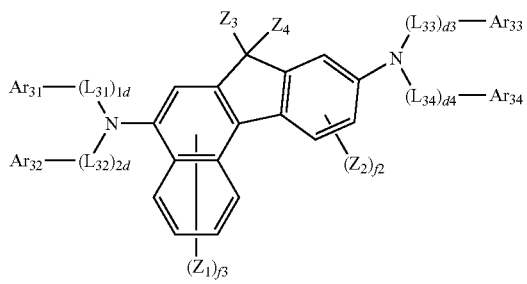

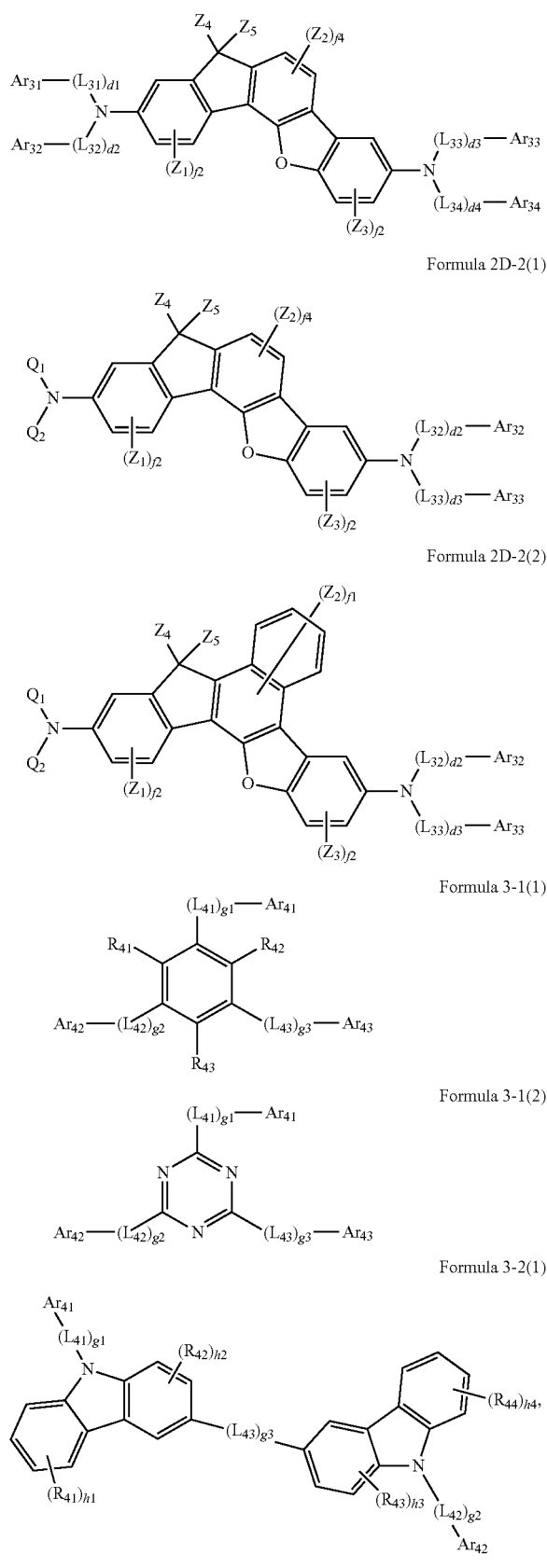

wherein, in Formulae 1-1(1) to 1-1(4), 1-2(1), 1-3(1), 2H-1 (1) to 2H-1(4), 2D-1 (1) to 2D-1(4), 2D-2(1), 2D-2(2), 3-1(1), 3-1(2), and 3-2(1), $Z_1$ to $Z_5$ are each independently selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{13}$)($Q_{14}$)($Q_{15}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{23}$)($Q_{24}$)($Q_{25}$); and —Si($Q_{33}$)($Q_{34}$)($Q_{35}$), wherein $Q_{13}$ to $Q_{15}$, $Q_{23}$ to $Q_{25}$, and $Q_{33}$ to $Q_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, f1 is an integer selected from 0 to 4, f2 is an integer selected from 0 to 3, f3 is an integer selected from 0 to 5, and f4 is an integer selected from 0 to 2, in Formula 1-1(1), at least one selected from $Ar_{22}$ and $Ar_{23}$ is a group selected from groups represented by Formulae A to C, in Formula 1-1(2), at least one selected from $Ar_{22}$ and $Ar_{23}$ is a group selected from groups represented by Formulae A to C, in Formula 1-1(3), at least one selected from $Ar_{21}$ to $Ar_{23}$ is a group selected from groups represented by Formulae A to C, and in Formula 1-1(4), at least one selected from $Ar_{21}$ to $Ar_{23}$ is a group selected from groups represented by Formulae A to C, and in Formula 1-2(1), at least one selected from $Ar_{21}$ to $Ar_{24}$ is a group selected from groups represented by Formulae A to C, and in Formula 1-3(1), at least one selected from $Ar_{21}$ and $Ar_{22}$ is a group selected from groups represented by Formulae A to C, in Formulae 2H-1 (1) to 2H-1 (4), $Ar_{31}$ is a group selected from groups represented by Formulae A to C, in Formula 2D-1 (1), at least one o selected from f $Ar_{31}$ to $Ar_{34}$ is a group selected from groups represented by Formulae A to C, in Formula 2D-1(2), at least one selected from $Ar_{31}$ to $Ar_{34}$ is a group selected from groups represented by Formulae A to C, in Formula 2D-1(3), at least one selected from $Ar_{31}$ to $Ar_{34}$ is a group selected from groups represented by Formulae A to C, in Formula 2D-1(4), at least one selected from $Ar_{31}$ to $Ar_{34}$ is a group selected from groups represented by Formulae A to C, in Formula 2D-2(1), at least one selected from $Ar_{32}$ and $Ar_{33}$ is a group selected from groups represented by Formulae A to C, in Formula 2D-2(2), at least one selected from $Ar_{32}$ and $Ar_{33}$ is a group selected from groups represented by Formulae A to C, in Formula 3-1 (1), at least one selected from $Ar_{41}$ to $Ar_{43}$ is a group selected from groups represented by Formulae A to C, in Formula 3-1(2), at least one selected from $Ar_{41}$ to $Ar_{43}$ is a group selected from groups represented by Formulae A to C, and in Formula 3-2(1), one selected from $Ar_{41}$ and $Ar_{42}$ is a group selected from groups represented by Formulae A to C, and the other one selected from $Ar_{41}$ and $Ar_{42}$ is a nitrogen-containing heterocyclic group comprising *=N—*' as a ring forming moiety.

16. The organic light-emitting device of claim 14, wherein the first compound and the second compound are each independently selected from compounds represented by Formulae 1-1, 1-2, and 1-3, the first compound being different from the second compound, and the third compound is selected from compounds represented by Formulae 2H-1, 3-1, and 3-2.

17. The organic light-emitting device of claim 16, wherein the third layer is an emission layer, the third layer further comprises a dopant, and the second layer directly contacts the third layer.

18. The organic light-emitting device of claim 14, wherein the first compound and the second compound are each independently selected from compounds represented by Formulae 1-1, 1-2, and 1-3, the first compound being different from the second compound, and the third compound is selected from compounds represented by Formulae 2D-1 and 2D-2.

19. The organic light-emitting device of claim 18, wherein the third layer is an emission layer, the third layer further comprises a host, and the second layer directly contacts the third layer.

20. An organic light-emitting device comprising:
a first electrode;
a second electrode facing the first electrode;
a first layer between the first electrode and the second electrode, the first layer comprising a first compound;
a second layer between the first layer and the second electrode, the second layer comprising a second compound; and
a third layer between the second layer and the second electrode, the third layer comprising a third compound, wherein
the first compound and the second compound are each independently selected from Compounds 1-1 to 1-12 and 2-1 to 2-10, the first compound being different from the second compound, and
the third compound is selected from Compounds 3-1 to 3-12, 4-1 to 4-12, and 5-1 to 5-9:

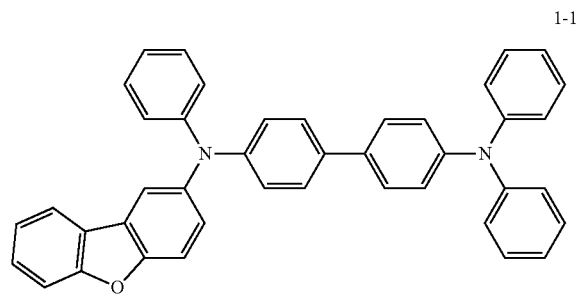

1-1

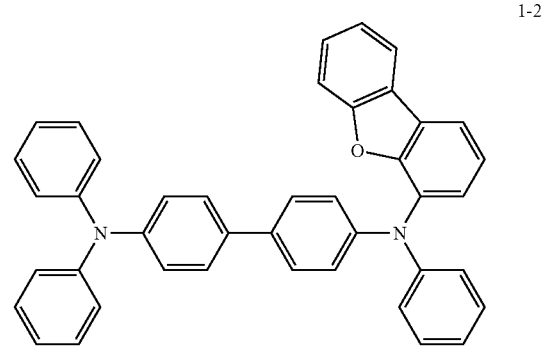

1-2

1-3
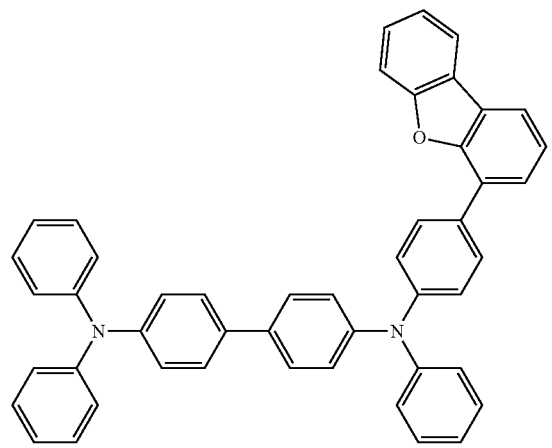
1-4
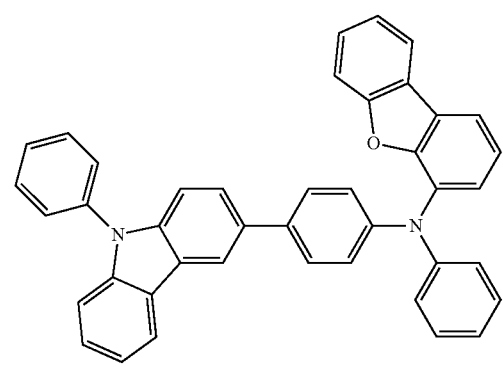
1-5
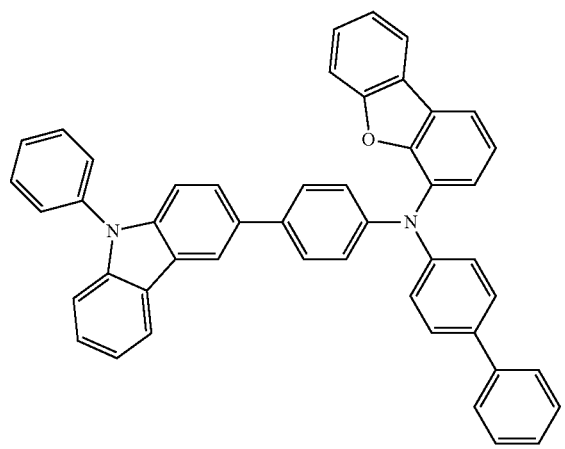
1-6
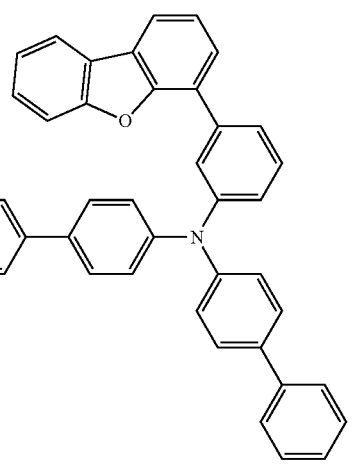
1-7
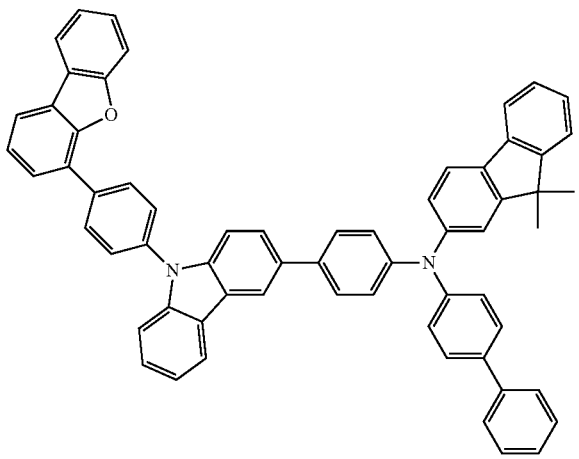
1-8
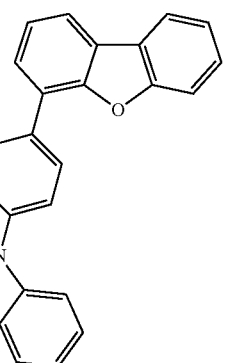

-continued
1-9
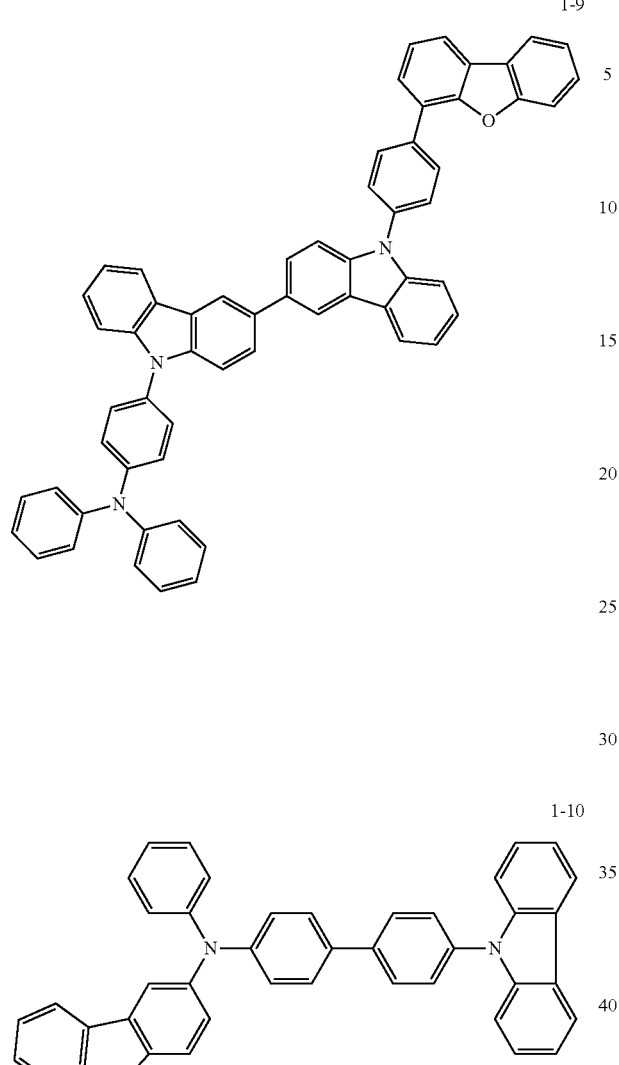
1-10
1-11
-continued
1-12
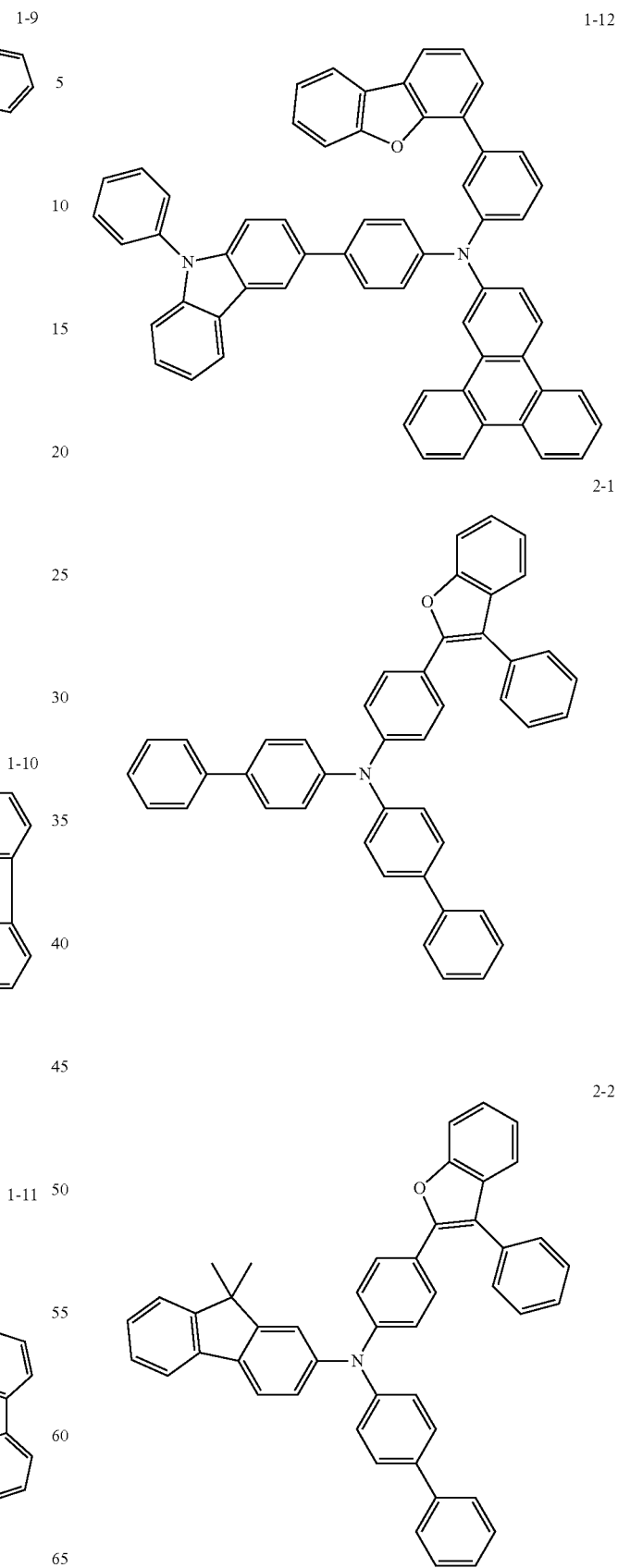
2-1
2-2